(12) United States Patent
Arai et al.

(10) Patent No.: US 9,122,157 B2
(45) Date of Patent: Sep. 1, 2015

(54) RESIST COMPOSITION AND METHOD FOR FORMING RESIST PATTERN

(71) Applicant: Tokyo Ohka Kogyo Co., Ltd., Kawasaki-shi (JP)

(72) Inventors: Masatoshi Arai, Kawasaki (JP); Takahiro Dazai, Kawasaki (JP); Yoshiyuki Utsumi, Kawasaki (JP)

(73) Assignee: Tokyo Ohka Kogyo Co., Ltd., Kawasaki-Shi (JP)

( * ) Notice: Subject to any disclaimer, the term of this patent is extended or adjusted under 35 U.S.C. 154(b) by 0 days.

(21) Appl. No.: 14/085,133

(22) Filed: Nov. 20, 2013

(65) Prior Publication Data

US 2014/0147788 A1    May 29, 2014

(30) Foreign Application Priority Data

Nov. 27, 2012 (JP) ................. 2012-258903
Mar. 1, 2013 (JP) ................. 2013-041065

(51) Int. Cl.
| | | |
|---|---|---|
| G03F 7/039 | (2006.01) | |
| G03F 7/30 | (2006.01) | |
| G03F 7/20 | (2006.01) | |
| G03F 7/32 | (2006.01) | |

(52) U.S. Cl.
CPC ............ *G03F 7/0397* (2013.01); *G03F 7/0392* (2013.01); *G03F 7/2041* (2013.01); *G03F 7/30* (2013.01); *G03F 7/322* (2013.01); *G03F 7/325* (2013.01)

(58) Field of Classification Search
None
See application file for complete search history.

(56) References Cited

U.S. PATENT DOCUMENTS

| | | | |
|---|---|---|---|
| 2007/0160929 A1 * | 7/2007 | Hasegawa et al. ......... | 430/270.1 |
| 2008/0026331 A1 * | 1/2008 | Hasegawa et al. ........... | 430/327 |
| 2009/0197204 A1 | 8/2009 | Shiono et al. | |
| 2009/0317743 A1 | 12/2009 | Shiono et al. | |
| 2010/0310985 A1 | 12/2010 | Mori et al. | |
| 2011/0117499 A1 | 5/2011 | Matsumiya et al. | |
| 2012/0282548 A1 * | 11/2012 | Enomoto et al. ............ | 430/284.1 |
| 2013/0309614 A1 * | 11/2013 | Utsumi et al. ................ | 430/325 |

FOREIGN PATENT DOCUMENTS

| | | |
|---|---|---|
| JP | A-2009-025723 | 2/2009 |
| JP | A-2010-002870 | 1/2010 |
| JP | A-2010-032994 | 2/2010 |
| JP | 2010-139996 * | 6/2010 |
| JP | A-2010-277043 | 12/2010 |
| JP | A-2011-013569 | 1/2011 |
| JP | A-2011-128226 | 6/2011 |
| JP | 2011-215414 * | 10/2011 |

OTHER PUBLICATIONS

Machine-assisted English translation of JP 2011-215414 provided by JPO (2011).*

* cited by examiner

*Primary Examiner* — Sin Lee
(74) *Attorney, Agent, or Firm* — Knobbe, Martens, Olson & Bear LLP

(57) ABSTRACT

A resist composition which generates an acid upon exposure and exhibits changed solubility in a developing solution by the action of an acid, the resist composition containing a base material component which exhibits changed solubility in a developing solution by the action of an acid; and the base material component containing a resin component having a constituent unit derived from a compound represented by the following general formula (a0-1), at least two or more kinds of a constituent unit containing an acid dissociable group represented by the following general formula (a1-r-1) or (a1-r-2), and a constituent unit containing a lactone-containing, an $—SO_2$-containing, or a carbonate-containing cyclic group; and a method for forming a resist pattern using the resist composition.

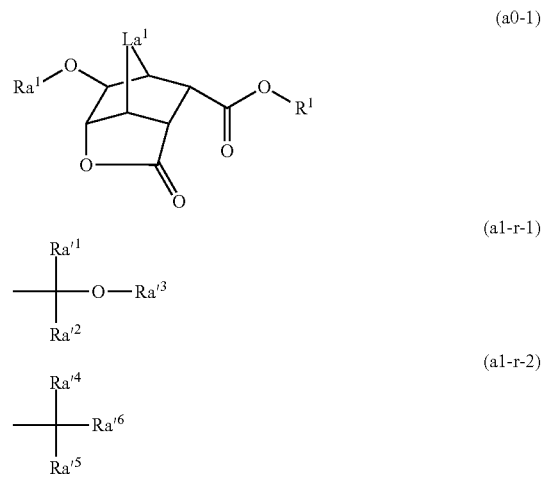

13 Claims, No Drawings

RESIST COMPOSITION AND METHOD FOR FORMING RESIST PATTERN

CROSS-REFERENCE TO RELATED APPLICATIONS

This application claims priority under 35 U.S.C. §119(a)-(d) to Japanese Patent Application No. 2012-258903, filed Nov. 27, 2012; and Japanese Patent Application No. 2013-041065, filed Mar. 1, 2013, the entire contents of which are incorporated herein by reference.

TECHNICAL FIELD

The present invention relates to a resist composition and a method for forming a resist pattern.

DESCRIPTION OF RELATED ART

In lithography techniques, for example, steps of forming a resist film composed of a resist material on a substrate, subjecting the resist film to selective exposure with radial rays such as light and electron beams through a mask having a predetermined pattern formed thereon, and then applying a development treatment, thereby forming a resist pattern having a predetermined shape on the resist film, are conducted.

A resist material having such properties that the exposed portions become soluble in a developing solution is called a positive type, and a resist material having such properties that the exposed portions become insoluble in a developing solution is called a negative type.

In recent years, in the production of semiconductor elements and liquid crystal display elements, advances in lithography techniques have led to rapid progress in the field of pattern miniaturization.

In general, these miniaturization techniques involve shortening the wavelength (increasing the energy) of the exposure light source. Specifically, ultraviolet rays typified by g-line and i-line have hitherto been used. But, nowadays KrF excimer lasers and ArF excimer lasers are starting to be introduced in mass production of semiconductor elements. In addition, investigations are also being conducted on lithography techniques using an exposure light source having a wavelength shorter (energy higher) than these excimer lasers, such as electron beams, EUV (extreme ultraviolet radiation), and X rays.

Resist materials are required to have lithography properties such as sensitivity to these exposure light sources and resolution capable of reproducing patterns of minute dimensions.

As a resist material that satisfies these requirements, a chemically amplified resist composition containing a base material component whose solubility in a developing solution changes by the action of an acid and an acid generator component which generates an acid upon exposure, has hitherto been used. For example, in the case where the developing solution is an alkali developing solution (alkali developing process), a positive-type chemically amplified resist composition containing a resin component (base resin) whose solubility in an alkali developing solution increases by the action of an acid and an acid generator component is generally used. If a resist film formed using such a resist composition is selectively exposed at the time of forming a resist pattern, in exposed areas, an acid is generated from the acid generator component, and the polarity of the base resin increases by the action of the generated acid, thereby making the exposed areas soluble in the alkali developing solution. Accordingly, a positive-type pattern in which unexposed areas remain as a pattern is formed upon alkali development. On the other hand, in the case of applying a solvent developing process using a developing solution containing an organic solvent (organic developing solution), when the polarity of the base resin increases, the solubility in the organic developing solution is relatively decreased. Therefore, unexposed areas of the resist film are dissolved in and removed by the organic developing solution, whereby a negative-type resist pattern in which exposed areas remain as a pattern is formed. In this way, the solvent developing process for forming a negative-type resist pattern is sometimes called a negative-type developing process (see, for example, Patent Document 1).

DOCUMENT OF RELATED ART

Patent Document

Patent Document 1: JP-A-2009-025723

SUMMARY OF THE INVENTION

As further progress is made in lithography techniques and expansion of the application field is being advanced, further improvements have been demanded in terms of various lithography properties.

An object of the present invention is to provide a resist composition capable of improving lithography properties and a method for forming a resist pattern using the resist composition.

Specifically, a first embodiment of the present invention is concerned with a resist composition which generates an acid upon exposure and exhibits changed solubility in a developing solution by the action of an acid, the resist composition containing a base material component (A) which exhibits changed solubility in a developing solution by the action of an acid; and the base material component (A) containing a resin component (A1) having a constituent unit (a0) derived from a compound represented by the following general formula (a0-1), at least two or more kinds of a constituent unit (a1) containing an acid dissociable group represented by the following general formula (a1-r-1) or (a1-r-2), and a constituent unit (a2) containing a lactone-containing cyclic group, an —$SO_2$—-containing cyclic group, or a carbonate-containing cyclic group.

(Chemical formula 1)

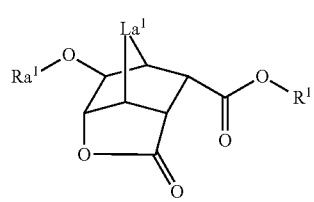
(a0-1)

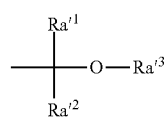
(a1-r-1)

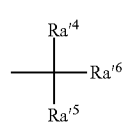
(a1-r-2)

In the formula (a0-1), $Ra^1$ represents a monovalent substituent having a polymerizable group; $La^1$ represents an oxygen atom, a sulfur atom, or a methylene group; and $R^1$ represents a linear or branched hydrocarbon group having 2 to 20 carbon atoms, which may have a substituent (provided that $R^1$ does not contain an ester bond), or a cyclic hydrocarbon group which may have a hetero atom. In the formula (a1-r-1), each of $Ra'^1$ and $Ra'^2$ represents a hydrogen atom or an alkyl group; and $Ra'^3$ represents a hydrocarbon group, and $Ra'^3$ may be bonded to either $Ra'^1$ or $Ra'^2$ to form a ring. In the formula (a1-r-2), each of $Ra'^4$ to $Ra'^6$ represents a hydrocarbon group, and $Ra'^5$ and $Ra'^6$ may be bonded to each other to form a ring.

A second embodiment of the present invention is concerned with a method for forming a resist pattern including a step of forming a resist film using the resist composition of the first embodiment; a step of exposing the resist film; and a step of developing the resist film to form a resist pattern.

According to the present invention, it is possible to provide a resist composition capable of improving lithography properties and a method for forming a resist pattern using the resist composition.

DETAILED DESCRIPTION OF THE INVENTION

In the present specification and claims, the term "aliphatic" is a relative concept used in relation to the term "aromatic" and defines a group or a compound each having no aromaticity.

The term "alkyl group" includes a linear, branched or cyclic, monovalent saturated hydrocarbon group, unless otherwise specified.

The term "alkylene group" includes a linear, branched or cyclic, divalent saturated hydrocarbon group, unless otherwise specified. The same applies for the alkyl group within an alkoxy group.

The term "halogenated alkyl group" refers to a group in which a part or all of hydrogen atoms of an alkyl group are substituted with a halogen atom. Examples of the halogen atom include a fluorine atom, a chlorine atom, a bromine atom, and an iodine atom.

The term "fluorinated alkyl group" or "fluorinated alkylene group" refers to a group in which a part or all of hydrogen atoms of an alkyl group or an alkylene group are substituted with a fluorine atom.

The term "constituent unit" means a monomer unit constituting a high-molecular weight compound (for example, a resin, a polymer, or a copolymer).

The term "constituent unit derived from an acrylic ester" means a constituent unit constituted upon cleavage of an ethylenic double bond of an acrylic ester.

The term "acrylic ester" refers to a compound in which a terminal hydrogen atom of a carboxy group of acrylic acid ($CH_2$=CH—COOH) is substituted with an organic group.

In the acrylic ester, a hydrogen atom bonded to a carbon atom at the α-position may be substituted with a substituent. The substituent ($R^\alpha$) with which the hydrogen atom bonded to the carbon atom at the α-position is substituted is an atom other than the hydrogen atom or a group, and examples thereof include an alkyl group having 1 to 5 carbon atoms, a halogenated alkyl group having 1 to 5 carbon atoms, and a hydroxyalkyl group. Incidentally, the carbon atom at the α-position of the acrylic ester refers to a carbon atom to which the carbonyl group is bonded, unless otherwise specified.

The acrylic ester in which the hydrogen atom bonded to the carbon atom at the α-position is substituted with a substituent is hereinafter sometimes referred to as "α-substituted acrylic ester". In addition, the acrylic ester and the α-substituted acrylic ester are sometimes referred to comprehensively as an "(α-substituted) acrylic ester".

The term "constituent unit derived from hydroxystyrene or a hydroxystyrene derivative" means a constituent unit constituted upon cleavage of an ethylenic double bond of hydroxystyrene or a hydroxystyrene derivative.

The term "hydroxystyrene derivative" is a concept including compounds in which the hydrogen atom at the α-position of hydroxystyrene is substituted with other substituent such as an alkyl group and a halogenated alkyl group, and derivatives thereof. Examples of such derivatives include those in which the hydrogen atom of the hydroxyl group of hydroxystyrene in which the hydrogen atom at the α-position may be substituted with a substituent is substituted with an organic group; and those in which a substituent other than the hydroxyl group is bonded to the benzene ring of hydroxystyrene in which the hydrogen atom at the α-position may be substituted with a substituent. Incidentally, the term "α-position (carbon atom at the α-position)" refers to a carbon atom to which the benzene ring is bonded, unless otherwise specified.

Examples of the substituent with which the hydrogen atom at the α-position of hydroxystyrene is substituted include those exemplified above as the substituent at the α-position for the α-substituted acrylic ester.

The term "constituent unit derived from vinylbenzoic acid or a vinylbenzoic acid derivative" means a constituent unit constituted upon cleavage of an ethylenic double bond of vinylbenzoic acid or a vinylbenzoic acid derivative.

The term "vinylbenzoic acid derivative" is a concept including compounds in which the hydrogen atom at the α-position of vinylbenzoic acid is substituted with other substituent such as an alkyl group and a halogenated alkyl group, and derivatives thereof. Examples of such derivatives include those in which the hydrogen atom of the carboxy group of vinylbenzoic acid in which the hydrogen atom at the α-position may be substituted with a substituent is substituted with an organic group; and those in which a substituent other than a hydroxyl group and a carboxy group is bonded to the benzene ring of vinylbenzoic acid in which the hydrogen atom at the α-position may be substituted with a substituent. Incidentally, the term "α-position (carbon atom at the α-position)" refers to a carbon atom to which the benzene ring is bonded, unless otherwise specified.

The term "styrene" is a concept including styrene and compounds in which the hydrogen atom at the α-position of styrene is substituted with other substituent such as an alkyl group and a halogenated alkyl group.

The term "constituent unit derived from styrene" or "constituent unit derived from a styrene derivative" means a constituent unit constituted upon cleavage of an ethylenic double bond of styrene or a styrene derivative.

The alkyl group as the substituent at the α-position is preferably a linear or branched alkyl group. Specifically, examples thereof include an alkyl group having 1 to 5 carbon atoms (for example, a methyl group, an ethyl group, a propyl group, an isopropyl group, an n-butyl group, an isobutyl group, a tert-butyl group, a pentyl group, an isopentyl group, or a neopentyl group).

In addition, specifically, examples of the halogenated alkyl group as the substituent at the α-position include a group in which a part or all of hydrogen atoms of the above-described "alkyl group as the substituent at the α-position" are substituted with a halogen atom. Examples of the halogen atom include a fluorine atom, a chlorine atom, a bromine atom, and an iodine atom, with a fluorine atom being especially preferable.

In addition, specifically, examples of the hydroxyalkyl group as the substituent at the α-position include a group in which a part or all of hydrogen atoms of the above-described "alkyl group as the substituent at the α-position" are substituted with a hydroxyl group. The number of the hydroxyl group in the hydroxyalkyl group is preferably 1 to 5, and most preferably 1.

The case of describing "may have a substituent" includes both of the case where the hydrogen atom (—H) is substituted with a monovalent group and the case where the methylene group (—CH$_2$—) is substituted with a divalent group.

The term "exposure" is a concept including irradiation with any form of radiation.

<<Resist Composition>>

The resist composition of the present invention is a resist composition which generates an acid upon exposure and exhibits changed solubility in a developing solution by the action of an acid, the resist composition containing a base material component (A) which exhibits changed solubility in a developing solution by the action of an acid; and the base material component (A) containing a resin component (A1) having a constituent unit (a0) derived from a compound represented by the general formula (a0-1), at least two or more kinds of a constituent unit (a1) containing an acid dissociable group represented by the general formula (a1-r-1) or (a1-r-2), and a constituent unit (a2) containing a lactone-containing cyclic group, an —SO$_2$—-containing cyclic group, or a carbonate-containing cyclic group.

The resist composition of the present invention is a resist composition which generates an acid upon exposure and exhibits changed solubility in a developing solution by the action of an acid and contains a base material component (A) which exhibits changed solubility in a developing solution by the action of an acid (the base material component (A) will be hereinafter also referred to as "component (A)").

When a resist film is formed using such a resist composition, and the resist film is subjected to selective exposure, in exposed areas, an acid is generated, and the solubility of the component (A) in a developing solution changes by the action of the acid, whereas in unexposed areas, the solubility of the component (A) in a developing solution does not change. Therefore, a difference in solubility in a developing solution is generated between the exposed areas and the unexposed areas. For that reason, when the resist film is developed, in the case where the resist composition is a positive type, the exposed areas are dissolved and removed to form a positive-type resist pattern, whereas in the case where the resist composition is a negative type, the unexposed areas are dissolved and removed to form a negative-type resist pattern.

In the present specification, a resist composition capable of forming a positive-type resist pattern upon dissolution and removal of exposed areas is referred to as a positive-type resist composition, and a resist composition capable of forming a negative-type resist pattern upon dissolution and removal of unexposed areas is referred to as a negative-type resist composition.

The resist composition of the present invention may be either a positive-type resist composition or a negative-type resist composition.

In addition, the resist composition of the present invention may be either a resist composition for an alkali developing process using an alkali developing solution for a development treatment at the time of forming a resist pattern or a resist composition for a solvent developing process using a developing solution containing an organic solvent (organic developing solution) for the development treatment.

The resist composition of the present invention has acid generating ability such that it generates an acid upon exposure. The acid may be generated upon exposure of the component (A), or the acid may be generated upon exposure of an additive component which is blended separately from the component (A).

Specifically, the resist composition of the present invention may be any of the following compositions.

(1) A composition containing an acid generator component (B) which generates an acid upon exposure (the acid generator component (B) will be hereinafter referred to as "component (B)");

(2) A composition in which the component (A) is a component which generates an acid upon exposure; and (3) A composition in which the component (A) is a component which generates an acid upon exposure, and which further contains the component (B).

That is, in the case of (2) and (3) as described above, the component (A) is a "base material component which generates an acid upon exposure and exhibits changed solubility in a developing solution by the action of an acid". In the case where the component (A) is a base material component which generates an acid upon exposure and exhibits changed solubility in a developing solution by the action of an acid, it is preferable that a component (A1) as described later is a high-molecular weight compound which generates an acid upon exposure and exhibits changed solubility in a developing solution by the action of an acid. As such a high-molecular weight compound, a resin having a constituent unit which generates an acid upon exposure can be used. As the constituent unit which generates an acid upon exposure, known constituent units can be used.

It is especially preferable that the resist composition of the present invention is the case as described above in (1).

<Component (A)>

In the present invention, the term "base material component" refers to an organic compound having film-forming ability, and preferably, an organic compound having a molecular weight of 500 or more is used. When the molecular weight of the organic compound is 500 or more, the film-forming ability is enhanced, and in addition thereto, it is liable to form a resist pattern on a nano level.

The organic compound which is used as the base material component is roughly classified into a non-polymer and a polymer.

In general, a compound having a molecular weight of 500 or more and less than 4,000 is used as the non-polymer. In the case where the term "low-molecular weight compound" is hereunder referred to, it means a non-polymer having a molecular weight of 500 or more and less than 4,000.

In general, a compound having a molecular weight of 1,000 or more is used as the polymer. In the case where the term "resin" is hereunder referred to, it means a polymer having a molecular weight of 1,000 or more.

As the molecular weight of the polymer, a weight average molecular weight as reduced into standard polystyrene by means of GPC (gel permeation chromatography) is adopted.

As the component (A), a resin may be used, or a low-molecular compound may be used, or these may also be used in combination.

The component (A) may be a component whose solubility in a developing solution increases by the action of an acid, or may be a compound whose solubility in a developing solution decreases by the action of an acid.

In addition, in the present invention, the component (A) may also be a component which generates an acid upon exposure.

[Resin Component (A1)]

In the present invention, the component (A) contains a resin component (A1) having a constituent unit (a0) derived from a compound represented by the following general formula (a0-1), a constituent unit (a2) containing a lactone-containing cyclic group, an —SO$_2$—-containing cyclic group, or a carbonate-containing cyclic group, and a constituent unit (a1) containing an acid decomposable group whose polarity increases by the action of an acid (the resin component (A1) will be also referred to as "component (A1)").

(Chemical formula 2)

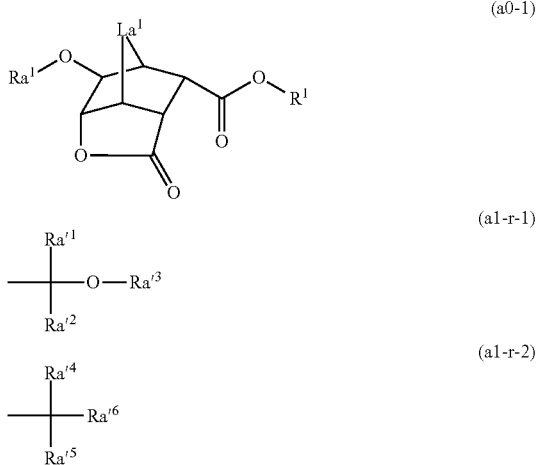

In the formula (a0-1), Ra$^1$ represents a monovalent substituent having a polymerizable group; La$^1$ represents an oxygen atom, a sulfur atom, or a methylene group; and R$^1$ represents a linear or branched hydrocarbon group having 2 to 20 carbon atoms, which may have a substituent (provided that R$^1$ does not contain an ester bond), or a cyclic hydrocarbon group which may have a hetero atom. In the formula (a1-r-1), each of Ra$'^1$ and Ra$'^2$ represents a hydrogen atom or an alkyl group; and Ra$'^3$ represents a hydrocarbon group, and Ra$'^3$ may be bonded to either Ra$'^1$ or Ra$'^2$ to form a ring. In the formula (a1-r-2), each of Ra$'^4$ to Ra$'^6$ represents a hydrocarbon group, and Ra$'^5$ and Ra$'^6$ may be bonded to each other to form a ring.

(Constituent Unit (a0))

The constituent unit (a0) is a constituent unit derived from the compound represented by the general formula (a0-1).

In the formula (a0-1), Ra$^1$ represents a monovalent substituent having a polymerizable group.

The term "polymerizable group" refers to a group capable of allowing a compound having the polymerizable group to polymerize by means of radical polymerization or the like, and for example, it refers to a group containing a multiple bond between carbon atoms, such as an ethylenic double bond.

Examples of the polymerizable group which Ra$^1$ has include a vinyl group, an allyl group, an acryloyl group, a methacryloyl group, a fluorovinyl group, a difluorovinyl group, a trifluorovinyl group, a difluorotrifluoromethylvinyl group, a trifluoroallyl group, a perfluoroallyl group, a trifluoromethylacryloyl group, a nonylfluorobutylacryloyl group, a vinyl ether group, a fluorine-containing vinyl ether group, an allyl ether group, a fluorine-containing allyl ether group, a styryl group, a vinylnaphthyl group, a fluorine-containing styryl group, a fluorine-containing vinylnaphthyl group, a norbornyl group, a fluorine-containing norbornyl group, and a silyl group. As the polymerizable group which Ra$^1$ has, an alkylene group which may have a substituent is preferable. Examples thereof include a linear, branched or cyclic alkylene group having 1 to 20 carbon atoms and an alkylene group composed of a combination thereof, and an alkylene group having 2 to 10 carbon atoms is more preferable. Examples of the substituent include a monovalent group such as an alkyl group having 1 to 5 carbon atoms, an alkoxy group, a hydroxyl group, a thiol group, an amino group, and a phenyl group; and a divalent group such as an ether bond and a phenylene group.

In the formula (a0-1), La$^1$ represents an oxygen atom, a sulfur atom, or a methylene group.

In the formula (a0-1), R$^1$ represents a linear or branched hydrocarbon group having 2 to 20 carbon atoms, which may have a substituent, or a cyclic hydrocarbon group which may have a hetero atom.

Examples of the linear or branched hydrocarbon group having 2 to 20 carbon atoms, which may have a substituent, or the cyclic hydrocarbon group which may have a hetero atom, as represented by R$^1$, include an aliphatic hydrocarbon group and an aromatic hydrocarbon group, with an aliphatic hydrocarbon group being preferable. Examples of the aliphatic hydrocarbon group include a linear or branched alkyl group, and a cyclic alkyl group which may have a hetero atom, each having 2 to 20 carbon atoms.

The aromatic hydrocarbon group is a hydrocarbon group having an aromatic ring and preferably has 5 to 30 carbon atoms. Specifically, examples of the aromatic ring which the aromatic hydrocarbon group has include an aromatic hydrocarbon ring such as benzene, biphenyl, fluorene, naphthalene, anthracene, and phenanthrene; and an aromatic heterocyclic ring in which a part of the carbon atoms constituting the above-described aromatic hydrocarbon ring is substituted with a hetero atom. Examples of the hetero atom in the aromatic heterocyclic ring include an oxygen atom, a sulfur atom, and a nitrogen atom.

Specifically, examples of the aromatic hydrocarbon group include an aryl group; and a group in which one of hydrogen atoms of an aryl group is substituted with an alkylene group (for example, an arylalkyl group such as a benzyl group, a phenethyl group, a 1-napthylmethyl group, a 2-naphthylmethyl group, a 1-naphthylethyl group, and a 2-naphthylethyl group). The carbon number of the alkylene group (the alkyl chain in the arylalkyl group) is preferably 1 to 4, more preferably 1 to 2, and especially preferably 1.

Examples of the substituent which R$^1$ may have include an alkyl group, an alkoxy group, a halogen atom, a halogenated alkyl group, a hydroxyl group, —COOR", —OC(=O)R" (R" represents a hydrogen atom or an alkyl group), a hydroxyalkyl group, and a cyano group.

The alkyl group as the substituent is preferably an alkyl group having 1 to 6 carbon atoms. The alkyl group is preferably linear or branched. Specifically, examples thereof include a methyl group, an ethyl group, a propyl group, an isopropyl group, an n-butyl group, an isobutyl group, a tert-butyl group, a pentyl group, an isopentyl group, a neopentyl group, and a hexyl group. Of these, a methyl group or an ethyl group is preferable, and a methyl group is especially preferable.

The alkoxy group as the substituent is preferably an alkoxy group having 1 to 6 carbon atoms. The alkoxy group is preferably linear or branched. Specifically, examples thereof include a group in which an oxygen atom (—O—) is bonded to the alkyl group exemplified above for the alkyl group as the substituent.

Examples of the halogen atom as the substituent include a fluorine atom, a chlorine atom, a bromine atom, and an iodine atom, with a fluorine atom being preferable.

Examples of the halogenated alkyl group as the substituent include a group in which a part or all of the hydrogen atoms of the above-described alkyl group are substituted with the above-described halogen atom.

Examples of the halogenated alkyl group as the substituent include a group in which a part or all of the hydrogen atoms of the alkyl group exemplified above for the alkyl group as the substituent are substituted with the above-described halogen atom. The halogenated alkyl group is preferably a fluorinated alkyl group, and especially preferably a perfluoroalkyl group.

The carbon number of the linear alkyl group represented by $R^1$ is preferably 2 to 5, and more preferably 2 to 4. Specifically, examples thereof include an ethyl group, an n-propyl group, an n-butyl group, and an n-pentyl group. Of these, an ethyl group or an n-butyl group is preferable.

The carbon number of the branched alkyl group represented by $R^1$ is preferably 3 to 10, and more preferably 3 to 5. Specifically, examples thereof include an isopropyl group, an isobutyl group, a tert-butyl group, an isopentyl group, a neopentyl group, a 1,1-diethylpropyl group, and a 2,2-dimethylbutyl group, with an isopropyl group being preferable.

The carbon number of the cyclic alkyl group which may have a hetero atom, as represented by $R^1$, is preferably 3 to 20, and more preferably 4 to 12. Specifically, examples thereof include a monocycloalkane such as cyclopentane and cyclohexane; and a group in which one or more hydrogen atoms are eliminated from a polycycloalkane such as adamantane, norbornane, isobornane, tricyclodecane, and tetracyclododecane. A part of the carbon atoms constituting the ring of the cyclic alkyl group may be substituted with an ethereal oxygen atom (—O—).

In addition, the above-described branched alkyl group or the above-described cyclic alkyl group as represented by $R^1$ may be an acid dissociable group as described later, and examples thereof include acid dissociable groups represented by the following general formula (a1-r-1) and the following general formula (a1-r-2). Above all, a group represented by (a1-r2-1) or (a1-r2-2) is preferable, and a group represented by (a1-r2-1) is more preferable.

In addition, examples of the cyclic hydrocarbon group which may have a hetero atom, as represented by $R^1$, include a lactone-containing cyclic group, an —$SO_2$—-containing cyclic group, and a carbonate-containing cyclic group. Incidentally, the cyclic hydrocarbon group which may have a hetero atom may have the above-described substituent.

The term "lactone-containing cyclic group" refers to a cyclic group containing a ring (lactone ring) containing —O—C(=O)— in the ring skeleton thereof. When the lactone ring is counted as the first ring, a lactone-containing cyclic group in which the only ring structure is the lactone ring is called a monocyclic group, whereas a lactone-containing cyclic group containing other ring structure is called a polycyclic group regardless of the structure of the other rings. The lactone-containing cyclic group may be either a monocyclic group or a polycyclic group.

The lactone-containing cyclic group as the cyclic hydrocarbon group, as represented by $R^1$, is not particularly limited, but any optional lactone-containing cyclic group can be used. Specifically, examples thereof include groups represented by the following general formulae (a2-r-1) to (a2-r-7). Hereinafter, * represents a bond.

(Chemical formula 3)

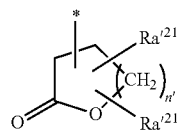

(a2-r-1)

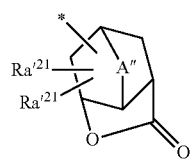

(a2-r-2)

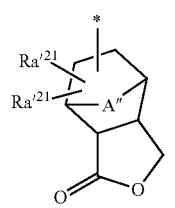

(a2-r-3)

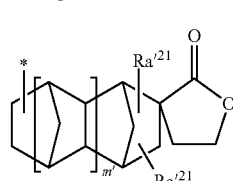

(a2-r-4)

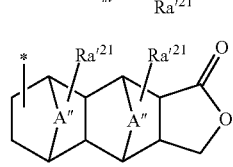

(a2-r-5)

(a2-r-6)

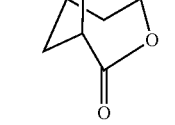

(a2-r-7)

In the formulae, each $Ra'^{21}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom or an alkyl group; A" represents an alkylene group having 1 to 5 carbon atoms, which may contain an oxygen atom or a sulfur atom, an oxygen atom, or a sulfur atom; n' is an integer of 0 to 2; and m' is 0 or 1.

In the general formulae (a2-r-1) to (a2-r-7), A" represents an alkylene group having 1 to 5 carbon atoms, which may contain an oxygen atom (—O—) or a sulfur atom (—S—), an oxygen atom, or a sulfur atom. The alkylene group having 1 to 5 carbon atoms, as represented by A", is preferably a linear or branched alkylene group, and examples thereof include a methylene group, an ethylene, an n-propylene group, and an isopropylene group. In the case where the alkylene group contains an oxygen atom or a sulfur atom, specific examples thereof include a group in which —O— or —S— intervenes at the terminal or between the carbon atoms of the alkylene group. Examples thereof include —O—CH$_2$—, —CH$_2$—O—CH$_2$—, —S—CH$_2$—, and —CH$_2$—S—CH$_2$—. A" is preferably an alkylene group having 1 to 5 carbon atoms or —O—, more preferably an alkylene group having 1 to 5 carbon atoms, and most preferably a methylene group. Each Ra'$^{21}$ independently represents an alkyl group, an alkoxy group, a halogen atom, a halogenated alkyl group, —COOR", —OC(=O)R", a hydroxyalkyl group, or a cyano group.

The alkyl group represented by Ra'$^{21}$ is preferably an alkyl group having 1 to 5 carbon atoms.

The alkoxy group represented by Ra'$^{21}$ is preferably an alkoxy group having 1 to 6 carbon atoms. The alkoxy group is preferably linear or branched. Specifically, examples thereof include a group in which the alkyl group exemplified above for Ra'$^{21}$ and an oxygen atom (—O—) are linked to each other.

Examples of the halogen atom represented by Ra'$^{21}$ include a fluorine atom, a chlorine atom, a bromine atom, and an iodine atom, with a fluorine atom being preferable.

Examples of the halogenated alkyl group represented by Ra'$^{21}$ include a group in which a part or all of hydrogen atoms of the alkyl group represented by Ra'$^{21}$ are substituted with a halogen atom. The halogenated alkyl group is preferably a fluorinated alkyl group, and especially preferably a perfluoroalkyl group.

Specific examples of the groups represented by the general formulae (a2-r-1) to (a2-r-7) are given below.

(Chemical formula 4)

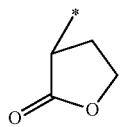
(r-lc-1-1)

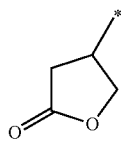
(r-lc-1-2)

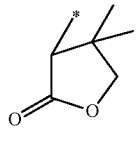
(r-lc-1-3)

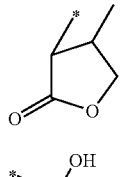
(r-lc-1-4)

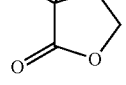
(r-lc-1-5)

-continued

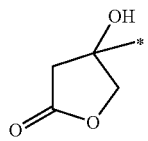
(r-lc-1-6)

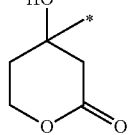
(r-lc-1-7)

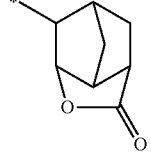
(r-lc-2-1)

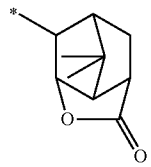
(r-lc-2-2)

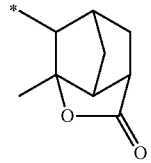
(r-lc-2-3)

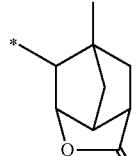
(r-lc-2-4)

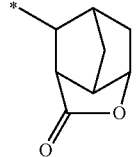
(r-lc-2-5)

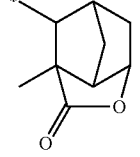
(r-lc-2-6)

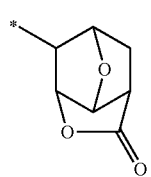
(r-lc-2-7)

(r-lc-2-8)
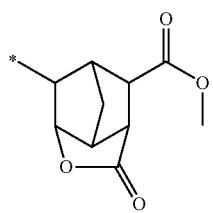
(r-lc-2-9)
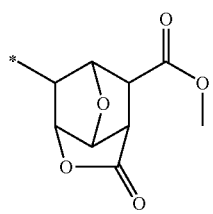
(r-lc-2-10)
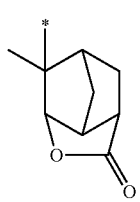
(r-lc-2-11)
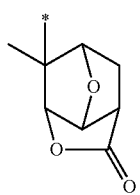
(r-lc-2-12)
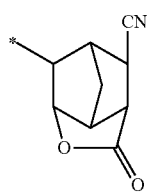
(r-lc-2-13)
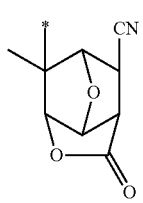
(r-lc-3-1)
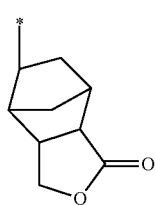
(r-lc-3-2)
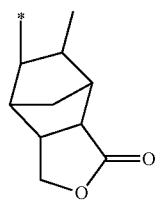
(r-lc-3-3)
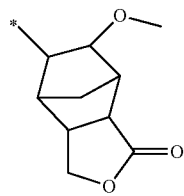
(r-lc-3-4)
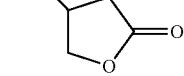
(r-lc-3-5)
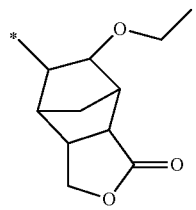
(r-lc-4-1)
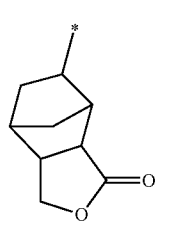
(r-lc-4-2)
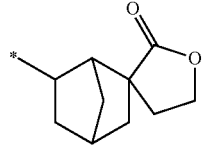
(r-lc-4-3)
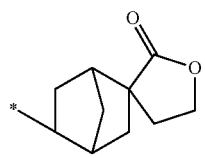
(r-lc-4-4)
(r-lc-4-5)
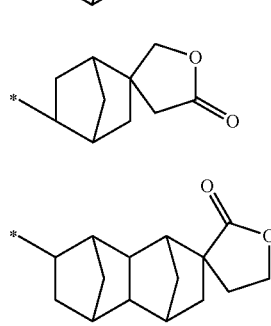

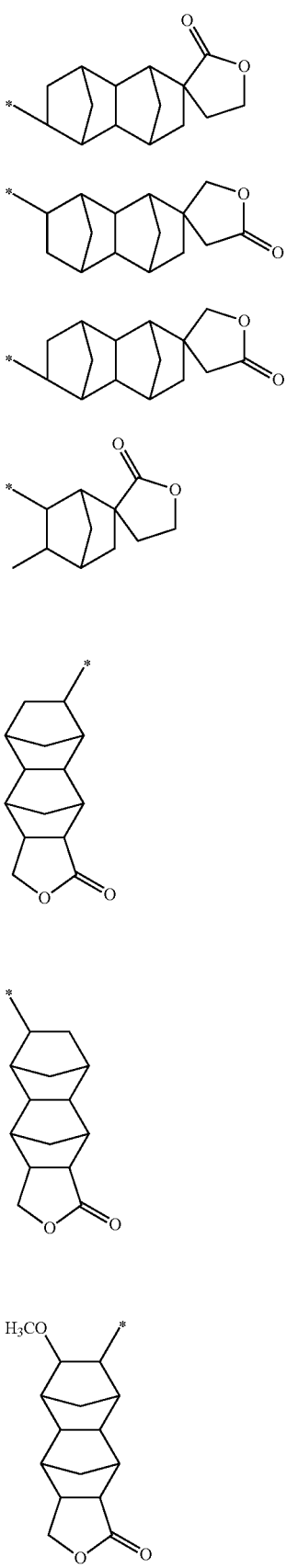
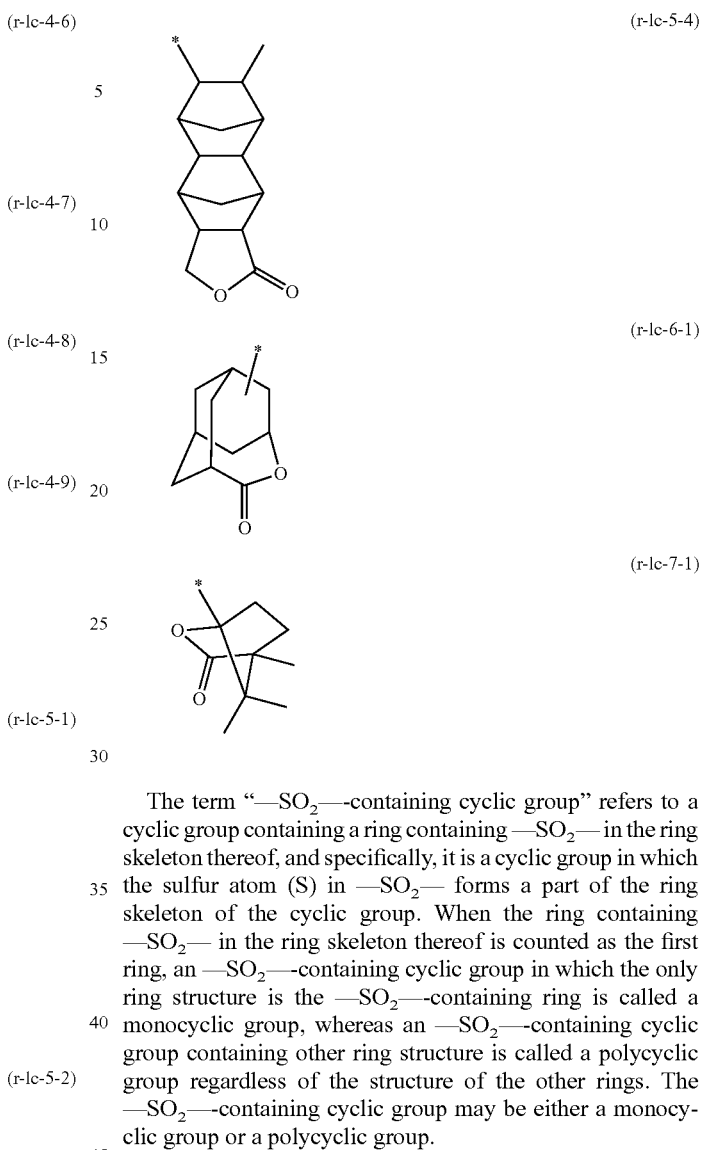

The term "—$SO_2$—-containing cyclic group" refers to a cyclic group containing a ring containing —$SO_2$— in the ring skeleton thereof, and specifically, it is a cyclic group in which the sulfur atom (S) in —$SO_2$— forms a part of the ring skeleton of the cyclic group. When the ring containing —$SO_2$— in the ring skeleton thereof is counted as the first ring, an —$SO_2$—-containing cyclic group in which the only ring structure is the —$SO_2$—-containing ring is called a monocyclic group, whereas an —$SO_2$—-containing cyclic group containing other ring structure is called a polycyclic group regardless of the structure of the other rings. The —$SO_2$—-containing cyclic group may be either a monocyclic group or a polycyclic group.

The —$SO_2$—-containing cyclic group as the cyclic hydrocarbon group, as represented by $R^1$, is especially preferably a cyclic group containing —O—$SO_2$— in the ring skeleton thereof, namely a cyclic ring containing a sultone ring in which —O—S— in —O—$SO_2$— forms a part of the ring skeleton. More specifically, examples of the —$SO_2$—-containing cyclic group include groups represented by the following general formulae (a5-r-1) to (a5-r-4).

(Chemical formula 5)

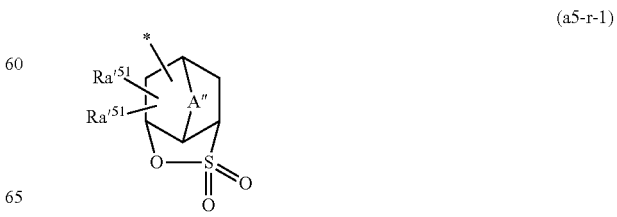

(a5-r-1)

(a5-r-2)

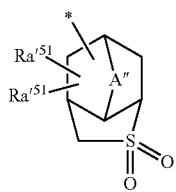

(a5-r-3)

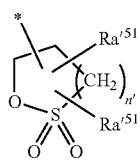

(a5-r-4)

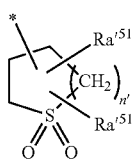

In the formulae, each Ra'⁵¹ independently represents a hydrogen atom, an alkyl group, an alkoxy group, a halogen atom, a halogenated alkyl group, a hydroxyl group, —COOR″, —OC(═O)R″, a hydroxyalkyl group, or a cyano group; R″ represents a hydrogen atom or an alkyl group; A″ represents an alkylene group having 1 to 5 carbon atoms, which may contain an oxygen atom or a sulfur atom, an oxygen atom, or a sulfur atom; and n' is an integer of 0 to 2.

In the general formulae (a5-r-1) to (a5-r-4), A″ is the same as A″ in the general formulae (a2-r-1) to (a2-r-7). The alkyl group, the alkoxy group, the halogen atom, the halogenated alkyl group, —COOR″, —OC(═O)R″, or the hydroxyalkyl group as represented by Ra'⁵¹ is the same as that in Ra'²¹ in the general formulae (a2-r-1) to (a2-r-7).

Specific examples of the groups represented by the general formulae (a5-r-1) to (a5-r-4) are given below. In the following formulae, "Ac" represents an acetyl group.

(Chemical formula 6)

(r-sl-1-1)

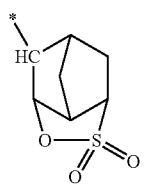

(r-sl-1-2)

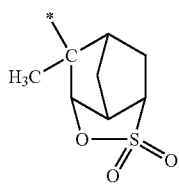

(r-sl-1-3)

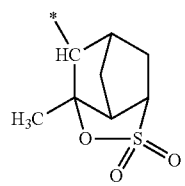

(r-sl-1-4)

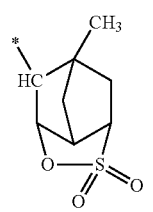

(r-sl-1-5)

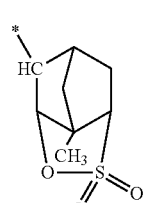

(r-sl-1-6)

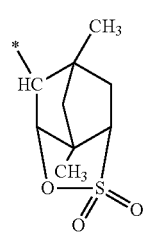

(r-sl-1-7)

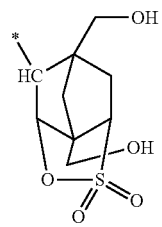

(r-sl-1-8)

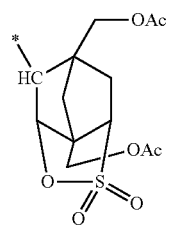

(r-sl-1-9)

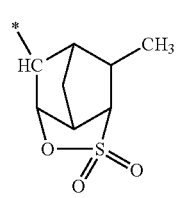

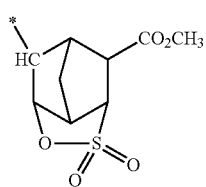 (r-sl-1-10)
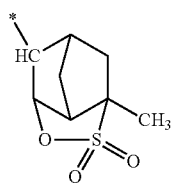 (r-sl-1-11)
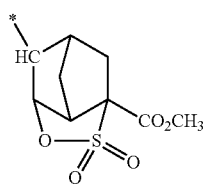 (r-sl-1-12)
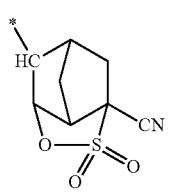 (r-sl-1-13)
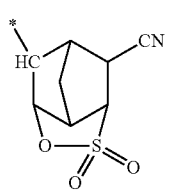 (r-sl-1-14)
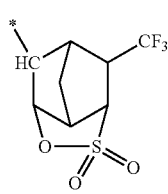 (r-sl-1-15)
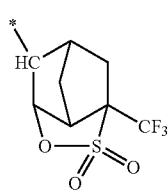 (r-sl-1-16)
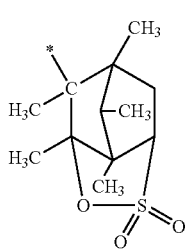 (r-sl-1-17)
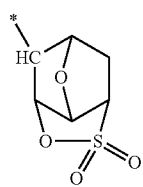 (r-sl-1-18)
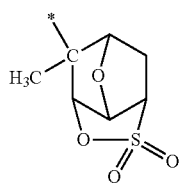 (r-sl-1-19)
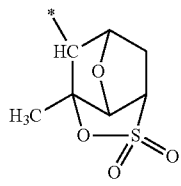 (r-sl-1-20)
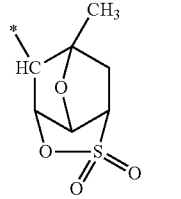 (r-sl-1-21)
(Chemical formula 7)
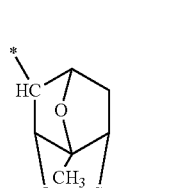 (r-sl-1-22)
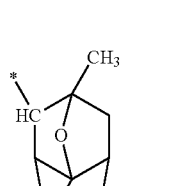 (r-sl-1-23)
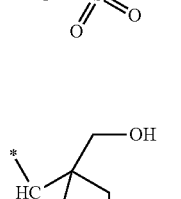 (r-sl-1-24)

-continued (r-sl-1-25) 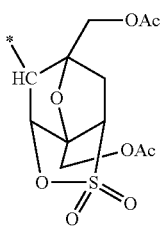

(r-sl-1-26) 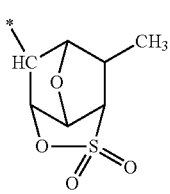

(r-sl-1-27) 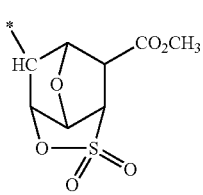

(r-sl-1-28) 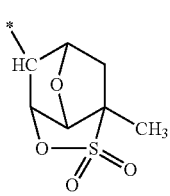

(r-sl-1-29) 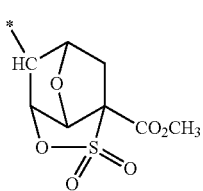

(r-sl-1-30) 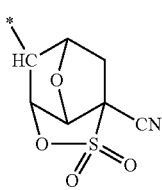

(r-sl-1-31) 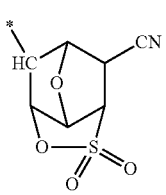

(r-sl-1-32) 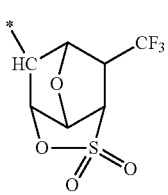

(r-sl-1-33) 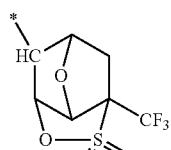

(Chemical formula 8)

(r-sl-2-1) 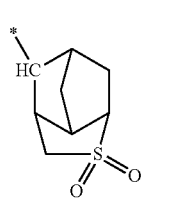

(r-sl-2-2) 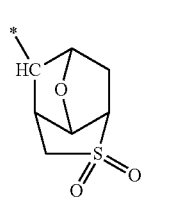

(r-sl-3-1) 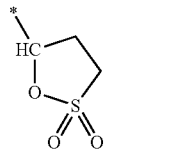

(r-sl-4-1) 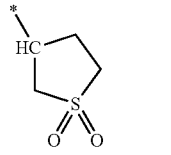

Among those described above, the —SO$_2$—-containing cyclic group is preferably the group represented by the general formula (a5-r-1). It is more preferable to use at least one member selected from the group consisting of the groups represented by the chemical formulae (r-s1-1-1), (r-s1-1-18), (r-s1-3-1), and (r-s1-4-1), with the group represented by the chemical formula (r-s1-1-1) being the most preferable.

The term "carbonate-containing cyclic group" refers to a cyclic group containing a ring containing —O—C(=O)—O— in the ring skeleton thereof (carbonate ring). When the carbonate ring is counted as the first ring, a carbonate-containing cyclic group in which the only ring structure is the carbonate ring is called a monocyclic group, whereas a carbonate-containing cyclic group containing other ring structure is called a polycyclic group regardless of the structure of the other rings. The carbonate-containing cyclic group may be either a monocyclic group or a polycyclic group.

The carbonate ring-containing cyclic group as the cyclic hydrocarbon group, as represented by R$^1$, is not particularly limited, and any optional carbonate ring-containing cyclic group can be used. Specifically, examples thereof include groups represented by the following general formulae (ax3-r-1) to (ax3-r-3).

(Chemical formula 9)

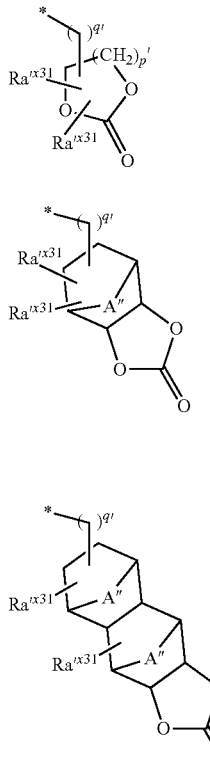

(ax3-r-1)

(ax3-r-2)

(ax3-r-3)

In the formulae, each $Ra'^{x31}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group; R" represents a hydrogen atom or an alkyl group; A" represents an alkylene group having 1 to 5 carbon atoms, which may contain an oxygen atom or a sulfur atom, an oxygen atom, or a sulfur atom; and q' is 0 or 1.

A" in the general formulae (ax3-r-1) to (ax3-r-3) is the same as A" in the general formula (a2-r-1).

The alkyl group, the alkoxy group, the halogen atom, the halogenated alkyl group, —COOR", —OC(=O)R", and the hydroxyalkyl group, as represented by $Ra'^{31}$, are the same as those in $Ra'^{21}$ in the general formulae (a2-r-1) to (a2-r-7), respectively.

Specific examples of the groups represented by the general formulae (ax3-r-1) to (ax3-r-3) are given below.

(Chemical formula 10)

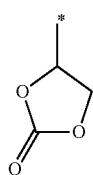

(r-cr-1-1)

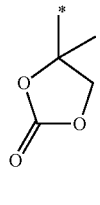

(r-cr-1-2)

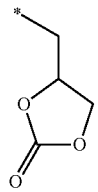

(r-cr-1-3)

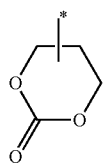

(r-cr-1-4)

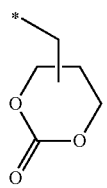

(r-cr-1-5)

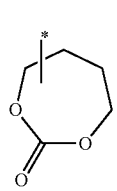

(r-cr-1-6)

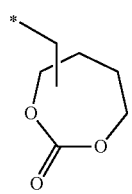

(r-cr-1-6)

(r-cr-2-1)

(r-cr-2-2)
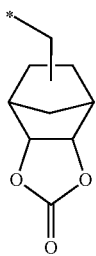

(r-cr-2-3)
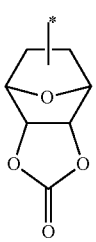

(r-cr-2-4)
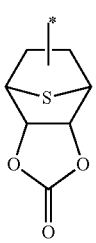

(r-cr-3-1)
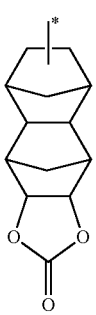

(r-cr-3-2)
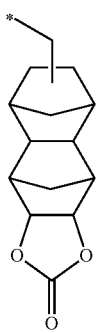

(r-cr-3-3)
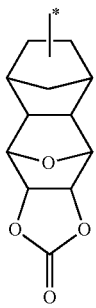

(r-cr-3-4)
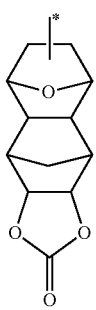

(r-cr-3-5)
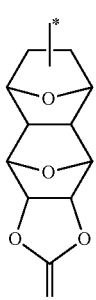

Among those described above, the lactone-containing cyclic group or the —$SO_2$—-containing cyclic group is preferable as the $R^1$. The group represented by the general formula (a2-r-1), (a2-r-2), or (a5-r-1) is preferable, and any one of the groups represented by the chemical formulae (r-1c-1-1) to (r-1c-1-7), (r-1c-2-1) to (r-1c-2-13), (r-s1-1-1), and (r-s1-1-18) is more preferable.

In the present invention, the compound represented by the general formula (a0-1) is preferably a compound represented by the following general formula (a0-1-1).

(Chemical formula 11)

(a0-1-1)
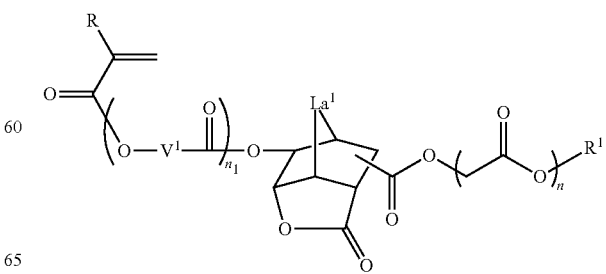

In the formula (a0-1-1), R represents a hydrogen atom, an alkyl group having 1 to 5 carbon atoms, or a halogenated alkyl group having 1 to 5 carbon atoms; $V^1$ represents a divalent hydrocarbon group which may have an ether bond, a urethane bond, or an amide bond; $n_1$ is an integer of 0 to 2; $La^1$ represents an oxygen atom, a sulfur atom, or a methylene group; and $R^1$ represents a linear or branched hydrocarbon group having 2 to 20 carbon atoms, which may have a substituent (provided that $R^1$ does not contain an ester bond), or a cyclic hydrocarbon group which may have a hetero atom.

In the formula (a0-1-1), R represents a hydrogen atom, an alkyl group having 1 to 5 carbon atoms, or a halogenated alkyl group having 1 to 5 carbon atoms. The alkyl group having 1 to 5 carbon atoms is preferably a linear or branched alkyl group having 1 to 5 carbon atoms, and specifically, examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group in which a part or all of the hydrogen atoms of the above-described alkyl group having 1 to 5 carbon atoms are substituted with a halogen atom. Examples of the halogen atom include a fluorine atom, a chlorine atom, a bromine atom, and an iodine atom, with a fluorine atom being especially preferable.

R is preferably a hydrogen atom, an alkyl group having 1 to 5 carbon atoms, or a fluorinated alkyl group having 1 to 5 carbon atoms, and R is most preferably a hydrogen atom or a methyl group from the viewpoint of easiness of availability in the industry.

In the formula (a0-1-1), $V^1$ represents a divalent hydrocarbon group which may have an ether bond, a urethane bond, or an amide bond. In the formula (a0-1-1), examples of $V^1$ include the same groups as those in $Va^1$ in the general formula (a1-1) as described later. In the present invention, $V^1$ is preferably a linear or branched alkylene group, and preferred examples thereof include a methylene group, an ethylene group, an n-propylene group, and an isopropylene group.

In the formula (a0-1-1), $n_1$ is an integer of 0 to 2.

In the formula (a0-1-1), the explanation regarding La and $R^1$ is the same as the explanation in the general formula (a0-1).

Specific examples of the compound represented by the formula (a0-1) are given below. In the following formulae, $R^\alpha$ represents a hydrogen atom, a methyl group, or a trifluoromethyl group.

(Chemical formula 12)

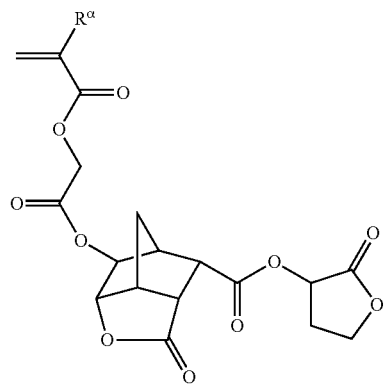

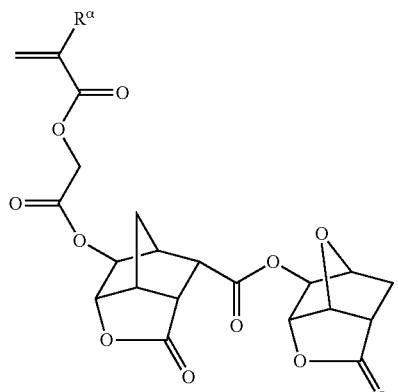

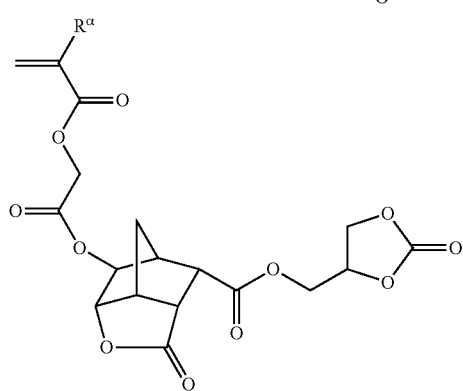

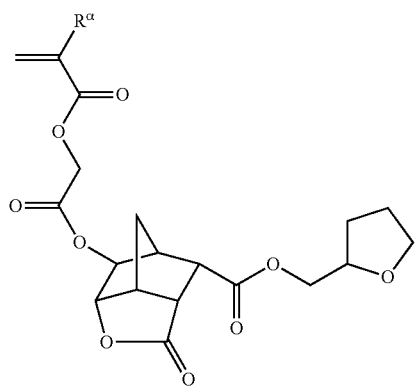

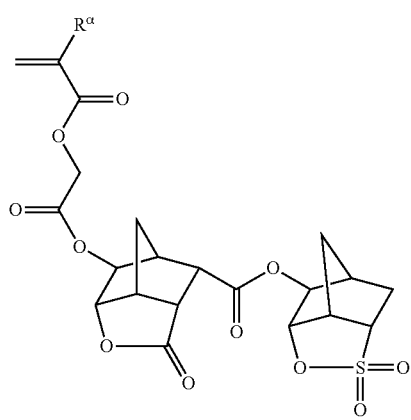

-continued

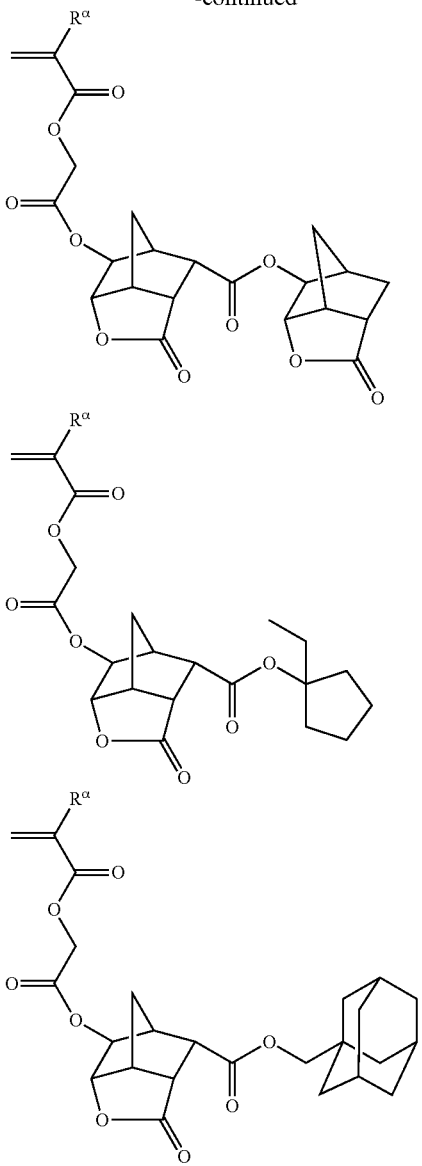

The constituent unit (a0) which the component (A1) has may be either one kind or two or more kinds. A proportion of the constituent unit (a0) in the component (A1) is preferably 1 to 50 mol %, more preferably 5 to 45 mol %, and still more preferably 10 to 40 mol % relative to a total sum of all of the constituent units constituting the component (A1).

When the proportion of the constituent unit (a0) is the lower limit value or more, lithography properties such as resist pattern shape, MEEF, exposure margin degree, and residual film properties are enhanced. In addition, when the proportion of the constituent unit (a0) is not more than the upper limit value, a balance with other constituent units is easily taken, and a resist pattern having a satisfactory shape is easily obtained.

(Constituent Unit (a1))

The constituent unit (a1) is a constituent unit containing an acid dissociable group represented by the following general formula (a1-r-1) or (a1-r-2).

The "acid dissociable group" as referred to herein refers to a group having acid dissociation properties, in which a bond between the acid dissociable group and an atom adjacent to the acid dissociable group may be cleaved by the action of an acid.

In the present invention, the constituent unit (a1) contains an acid dissociable group represented by the following general formula (a1-r-1) (hereinafter sometimes referred to as "acetal-type acid dissociable group" for the sake of convenience) or (a1-r-2) (hereinafter sometimes referred to as "tertiary alkyl ester-type acid dissociable group" for the sake of convenience).

(Chemical formula 13)

(a1-r-1)

In the formula, each of $Ra'^1$ and $Ra'^2$ represents a hydrogen atom or an alkyl group; $Ra'^3$ represents a hydrocarbon group; and $Ra'^3$ may be bonded to any one of $Ra'^1$ and $Ra'^2$ to form a ring.

In the formula (a1-r-1), examples of the alkyl group represented by $Ra'^1$ and $Ra'^2$ include the same alkyl groups as those exemplified above as the substituent which may be bonded to the carbon atom at the α-position in the explanation regarding the α-substituted acrylic ester. The alkyl group is preferably a methyl group or an ethyl group, and most preferably a methyl group.

The hydrocarbon group represented by $Ra'^3$ is preferably an alkyl group having 1 to 20 carbon atoms, and more preferably an alkyl group having 1 to 10 carbon atoms; and preferably a linear or branched alkyl group. Specifically, examples thereof include a methyl group, an ethyl group, a propyl group, an isopropyl group, an n-butyl group, an isobutyl group, a tert-butyl group, a pentyl group, an isopentyl group, a neopentyl group, a 1,1-dimethylethyl group, a 1,1-diethylpropyl group, a 2,2-dimethylpropyl group, and a 2,2-dimethylbutyl group.

In the case where $Ra'^3$ is a cyclic hydrocarbon group, the cyclic hydrocarbon group may be either aliphatic or aromatic, and it may be either polycyclic or monocyclic. The monocyclic alicyclic hydrocarbon group is preferably a group in which one hydrogen atom is eliminated from a monocycloalkane. The monocycloalkane is preferably one having 3 to 8 carbon atoms, and specifically, examples thereof include cyclopentane, cyclohexane, and cyclooctane. The polycyclic alicyclic hydrocarbon group is preferably a group in which one hydrogen atom is eliminated from a polycycloalkane. The polycycloalkane is preferably one having 7 to 12 carbon atoms, and specifically, examples thereof include adamantane, norbornane, isobornane, tricyclodecane, and tetracyclododecane.

In the case where $Ra'^3$ is an aromatic hydrocarbon group, specifically, examples of the aromatic ring which is contained include an aromatic hydrocarbon ring such as benzene, biphenyl, fluorene, naphthalene, anthracene, and phenanthrene; and an aromatic heterocyclic ring in which a part of the carbon atoms constituting the above-described aromatic hydrocarbon ring is substituted with a hetero atom. Examples of the hetero atom in the aromatic heterocyclic ring include an oxygen atom, a sulfur atom, and a nitrogen atom.

Specifically, examples of the aromatic hydrocarbon group include a group (aryl group) in which one hydrogen atom is eliminated from the above-described aromatic hydrocarbon ring; and a group in which one hydrogen atom of the above-described aryl group is substituted with an alkylene group (for example, an arylalkyl group such as a benzyl group, a phenethyl group, a 1-naphthylmethyl group, a 2-naphthylmethyl group, a 1-naphthylethyl group, and a 2-naphthylethyl group). The carbon number of the alkylene group (the alkyl chain in the arylalkyl group) is preferably 1 to 4, more preferably 1 to 2, and especially preferably 1.

In the case where $Ra'^3$ is bonded to any one of $Ra'^1$ and $Ra'^2$ to forma ring, the cyclic group is preferably a 4-membered to 7-membered ring, and more preferably a 4-membered to 6-membered ring. Specific examples of the cyclic group include a tetrahydropyranyl group and a tetrahydrofuranyl group.

(Chemical formula 14)

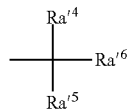

(a-1-r-2)

In the formula, each of $Ra'^4$ to $Ra'^6$ represents a hydrocarbon group, and $Ra'^5$ and $Ra'^6$ may be bonded to each other to form a ring.

In the formula (a1-r-2), examples of the hydrocarbon group represented by $Ra'^4$ to $Ra'^6$ include the same hydrocarbon groups as those exemplified above for $Ra'^3$. $Ra'^4$ is preferably an alkyl group having 1 to 5 carbon atoms.

The hydrocarbon group in the formula (a1-r-2) is preferably a hydrocarbon group represented by the following general formula (a1-r2-1) or (a1-r2-2).

(Chemical formula 15)

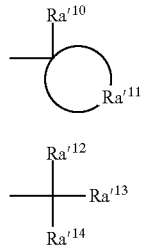

(a1-r2-1)

(a1-r2-2)

In the formulae, $Ra'^{10}$ represents an alkyl group having 1 to 10 carbon atoms; $Ra'^{11}$ represents a group for forming an aliphatic cyclic group together with the carbon atom to which $Ra'^{10}$ is bonded; and each of $Ra'^{12}$ to $Ra'^{14}$ independently represents a hydrocarbon group.

In the formula (a1-r2-1), the alkyl group having 1 to 10 carbon atoms represented by $Ra'^{10}$ is preferably the group exemplified as the linear or branched alkyl group represented by $Ra'^3$ in the formula (a1-r-1). In the formula (a1-r2-1), the aliphatic cyclic group which is constituted by $Ra'^{11}$ is preferably the group exemplified as the cyclic alkyl group represented by $Ra'^3$ in the formula (a1-r-1).

In the formula (a1-r2-2), each of $Ra'^{12}$ and $Ra'^{14}$ is preferably independently an alkyl group having 1 to 10 carbon atoms. The alkyl group is more preferably the group exemplified as the linear or branched alkyl group represented by $Ra'^3$ in the formula (a1-r-1), still more preferably a linear alkyl group having 1 to 5 carbon atoms, and especially preferably a methyl group or an ethyl group.

In the formula (a1-r2-2), $Ra'^{13}$ is preferably the linear, branched, or cyclic alkyl group exemplified as the hydrocarbon group represented by $Ra'^3$ in the formula (a1-r-1). Of these, $Ra'^{13}$ is more preferably the group exemplified as the cyclic alkyl group represented by $Ra'^3$.

Specific examples of the formula (a1-r2-1) are given below. In the following formulae, * represents a bond.

(Chemical formula 16)

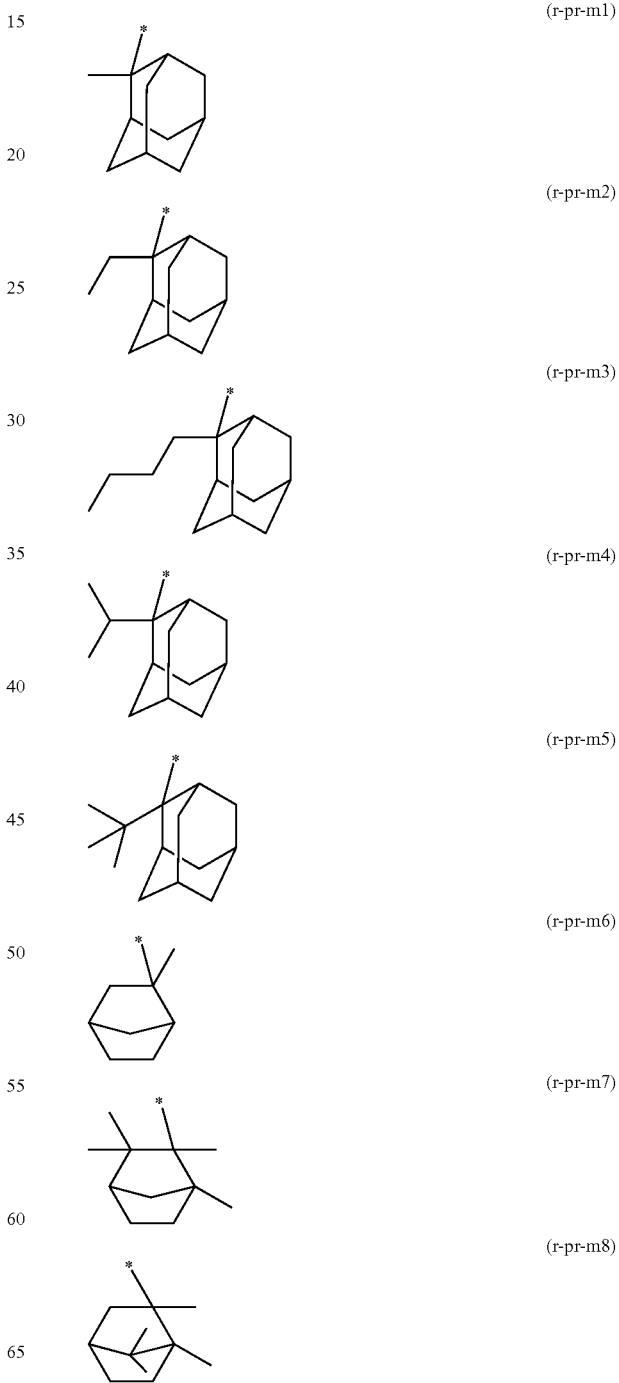

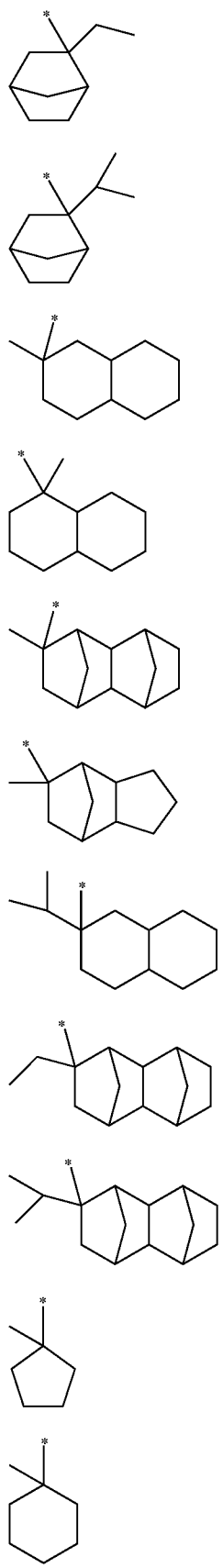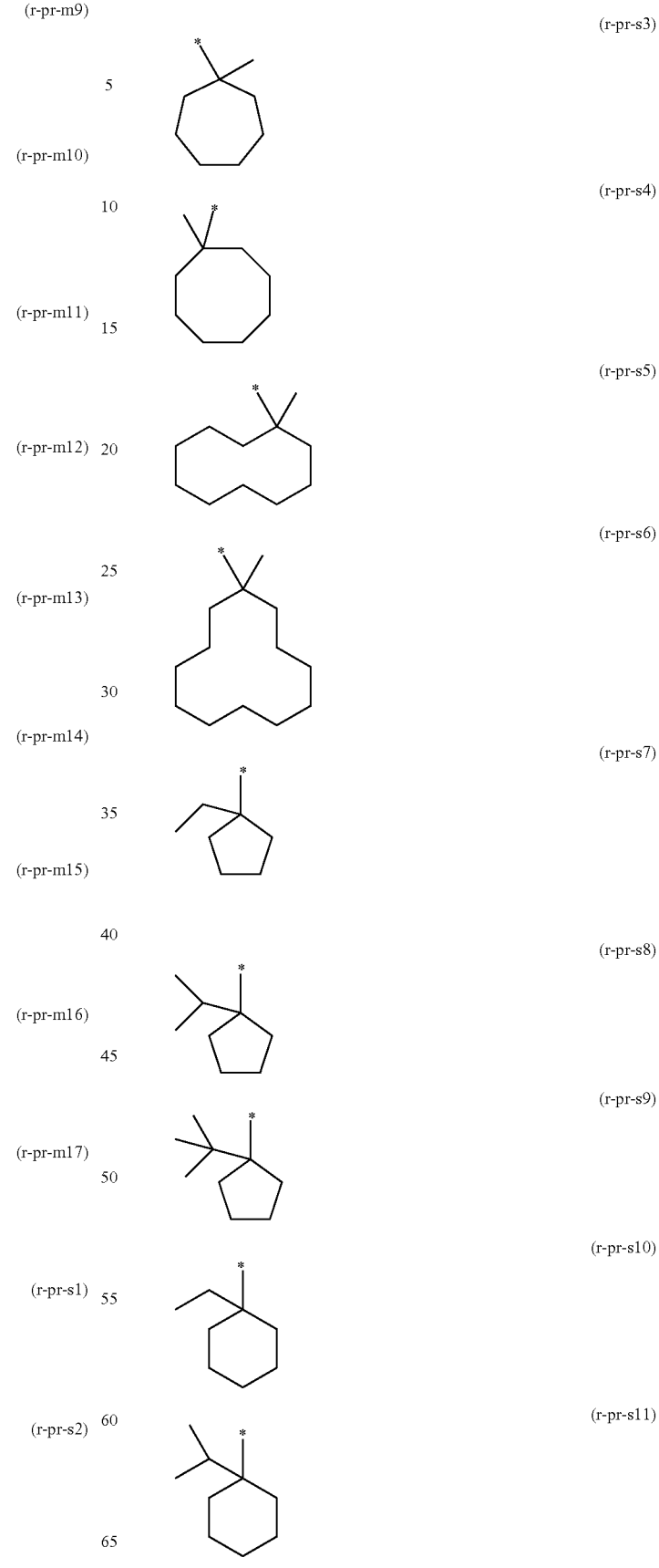

(r-pr-s12)
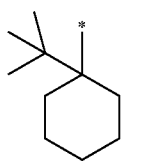
(r-pr-s13)
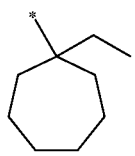
(r-pr-s14)
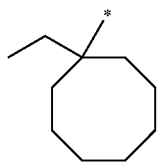
(r-pr-s15)
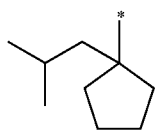
(r-pr-s16)
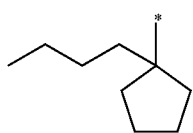
(r-pr-s17)
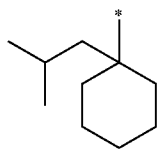
(r-pr-s18)
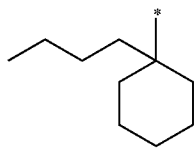
In the present invention, the group represented by the general formula (a1-r2-1) is preferably a group represented by the formula (r-pr-m1), (r-pr-m4), (r-pr-s1), or (r-pr-s8).
Specific examples of the formula (a1-r2-2) are given below.
(Chemical formula 17)
(r-pr-cm1)
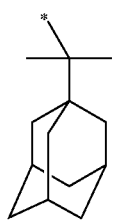
(r-pr-cm2)
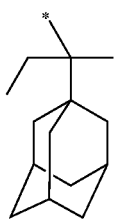
(r-pr-cm3)
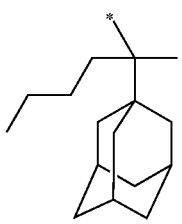
(r-pr-cm4)
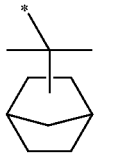
(r-pr-cm5)
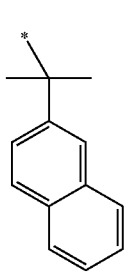
(r-pr-cm6)
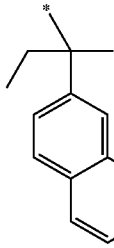
(r-pr-cm7)
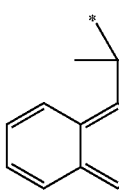
(r-pr-cm8)
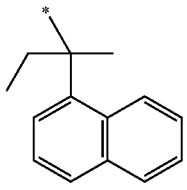

(r-pr-cs1) 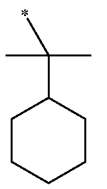

(r-pr-cs2) 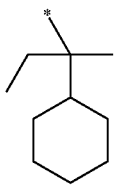

(r-pr-cs3) 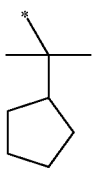

(r-pr-cs4) 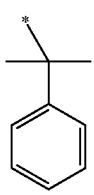

(r-pr-cs5) 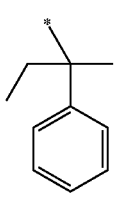

(r-pr-c1) 

(r-pr-c2) 

(r-pr-c3) 

In the present invention, the group represented by the general formula (a1-r2-2) is preferably a group represented by any one of the formulae (r-pr-cm1) to (r-pr-cm2) and (r-pr-cs1) to (r-pr-cs3).

In addition, in the present invention, examples of the acid dissociable group include an acid dissociable group represented by the following general formula (a1-r-3) (hereinafter sometimes referred to as "tertiary alkyloxycarbonyl acid dissociable group" for the sake of convenience).

(Chemical formula 18)

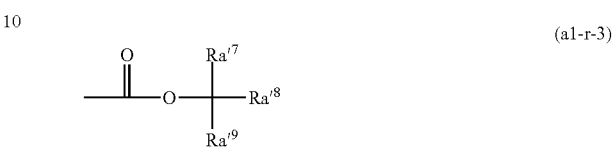

(a1-r-3)

In the formula, each of $Ra'^7$ to $Ra'^9$ represents an alkyl group.

In the formula (a1-r-3), each of $Ra'^7$ to $Ra'^9$ is preferably an alkyl group having 1 to 5 carbon atoms, and more preferably an alkyl group having 1 to 3 carbon atoms.

In addition, the carbon number of a total sum of the respective alkyl groups is preferably 3 to 7, more preferably 3 to 5, and most preferably 3 to 4.

The constituent unit (a1) is a constituent unit derived from an acrylic ester in which the hydrogen atom bonded to the carbon atom at the α-position may be substituted with a substituent. Examples thereof include a constituent unit containing an acid decomposable group whose polarity increases by the action of an acid; a constituent unit in which at least a part of the hydrogen atom in the hydroxyl group of a constituent unit derived from hydroxystyrene or a hydroxystyrene derivative is protected with a substituent which contains the above-described acid decomposable group; and a constituent unit in which at least a part of the hydrogen atom in —C(C=O)—OH of a constituent unit derived from vinylbenzoic acid or a vinylbenzoic acid derivative is protected with a substituent which contains the acid decomposable group.

Of these, the constituent unit (a1) is preferably a constituent unit derived from an acrylic ester in which the hydrogen atom bonded to the carbon atom at the α-position may be substituted with a substituent.

The constituent unit (a1) is preferably a constituent unit represented by the following general formula (a1-1) or (a1-2).

(Chemical formula 19)

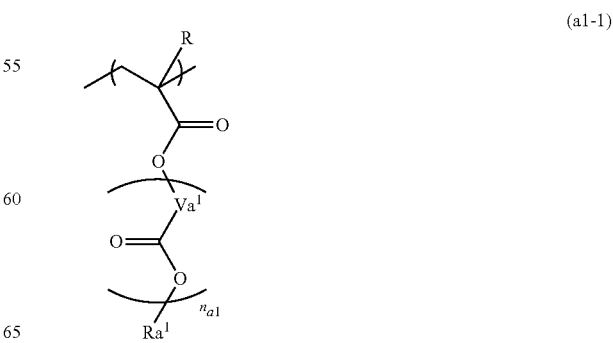

(a1-1)

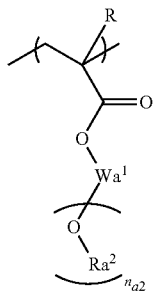

(a1-2)

In the formulae, R represents a hydrogen atom, an alkyl group having 1 to 5 carbon atoms, or a halogenated alkyl group having 1 to 5 carbon atoms; $Va^1$ represents a divalent hydrocarbon group which may have an ether bond, a urethane bond, or an amide bond; $n_{a1}$ is 0 to 2; $Ra^1$ represents the acid dissociable group represented by the formula (a1-r-1) or (a1-r-2); $Wa^1$ represents an ($n_{a2}$+1)-valent hydrocarbon group; $n_{a2}$ is 1 to 3; and $Ra^2$ represents the acid dissociable group represented by the formula (a1-r-1) or (a1-r-3).

In the general formula (a1-1) or (a1-2), the alkyl group having 1 to 5 carbon atoms is preferably a linear or branched alkyl group having 1 to 5 carbon atoms. Specifically, examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group in which a part or all of the hydrogen atoms of the above-described alkyl group having 1 to 5 carbon atoms are substituted with a halogen atom. Examples of the halogen atom include a fluorine atom, a chlorine atom, a bromine atom, and an iodine atom, with a fluorine atom being especially preferable.

R is preferably a hydrogen atom, an alkyl group having 1 to 5 carbon atoms, or a fluorinated alkyl group having 1 to 5 carbon atoms, and R is most preferably a hydrogen atom or a methyl group from the viewpoint of easiness of availability in the industry.

In the general formula (a1-1), the hydrocarbon group represented by $Va^1$ may be either an aliphatic hydrocarbon group or an aromatic hydrocarbon group. The aliphatic hydrocarbon group means a hydrocarbon group having no aromaticity. The aliphatic hydrocarbon group as the divalent hydrocarbon group represented by $Va^1$ may be either saturated or unsaturated, and in general, it is preferably saturated.

More specifically, examples of the aliphatic hydrocarbon group include a linear or branched aliphatic hydrocarbon group and an aliphatic hydrocarbon group containing a ring in a structure thereof.

In addition, examples of $Va^1$ include a hydrocarbon group in which the above-described divalent hydrocarbon group is bonded via an ether bond, a urethane bond, or an amide bond.

The linear or branched aliphatic hydrocarbon group is preferably one having 1 to 10 carbon atoms, more preferably one having 1 to 6 carbon atoms, still more preferably one having 1 to 4 carbon atoms, and most preferably one having 1 to 3 carbon atoms.

The linear aliphatic hydrocarbon group is preferably a linear alkylene group. Specifically, examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group is preferably a branched alkylene group. Specifically, examples thereof include an alkylalkylene group such as an alkylmethylene group, for example, —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, and —C($CH_2CH_3$)—; an alkylethylene group, for example, —CH($CH_3$)$CH_2$—, —CH($CH_3$)CH($CH_3$)—, —C($CH_3$)$_2CH_2$—, —CH($CH_2CH_3$)$CH_2$—, and —C($CH_2CH_3$)$_2$—$CH_2$—; an alkyltrimethylene group, for example, —CH($CH_3$)$CH_2CH_2$— and —$CH_2$CH($CH_3$)$CH_2$—; and an alkyltetramethylene group, for example, —CH($CH_3$)$CH_2CH_2CH_2$— and —$CH_2$CH($CH_3$)$CH_2CH_2$—. The alkyl group in the alkylalkylene group is preferably a linear alkyl group having 1 to 5 carbon atoms.

Examples of the aliphatic hydrocarbon group containing a ring in a structure thereof include an alicyclic hydrocarbon group (a group in which two hydrogen atoms are eliminated from an aliphatic hydrocarbon ring), a group in which an alicyclic hydrocarbon group is bonded to the terminal of a linear or branched aliphatic hydrocarbon group, and a group in which an alicyclic hydrocarbon group intervenes on the way of a linear or branched aliphatic hydrocarbon group. Examples of the linear or branched aliphatic hydrocarbon group include the same groups as those described above.

The alicyclic hydrocarbon group has preferably 3 to 20 carbon atoms, and more preferably 3 to 12 carbon atoms.

The alicyclic hydrocarbon group may be either polycyclic group or monocyclic group. The monocyclic alicyclic hydrocarbon group is preferably a group in which two hydrogen atoms are eliminated from a monocycloalkane. The monocycloalkane is preferably one having 3 to 6 carbon atoms. Specifically, examples thereof include cyclopentane and cyclohexane. The polycyclic alicyclic hydrocarbon group is preferably a group in which two hydrogen atoms are eliminated from a polycycloalkane. The polycycloalkane is preferably one having 7 to 12 carbon atoms. Specifically, examples thereof include adamantane, norbornane, isobornane, tricyclodecane, and tetracyclododecane.

The aromatic hydrocarbon group is a hydrocarbon group having an aromatic ring.

The aromatic hydrocarbon group as the divalent hydrocarbon group represented by $Va^1$ has preferably 3 to 30 carbon atoms, more preferably 5 to 30 carbon atoms, still more preferably 5 to 20 carbon atoms, especially preferably 6 to 15 carbon atoms, and most preferably 6 to 10 carbon atoms. However, the carbon number does not include the carbon number in the substituent.

Specifically, examples of the aromatic ring which the aromatic hydrocarbon group has include an aromatic hydrocarbon ring such as benzene, biphenyl, fluorene, naphthalene, anthracene, and phenanthrene; and an aromatic heterocyclic ring in which a part of the carbon atoms constituting the aromatic hydrocarbon ring is substituted with a hetero atom. Examples of the hetero atom in the aromatic heterocyclic ring include an oxygen atom, a sulfur atom, and a nitrogen atom.

Specifically, examples of the aromatic hydrocarbon group include a group (arylene group) in which two hydrogen atoms are eliminated from the above-described aromatic hydrocarbon ring; and a group in which one of the hydrogen atoms of a group (aryl group) in which one hydrogen atom is eliminated from the above-described aromatic hydrocarbon ring is substituted with an alkylene group (a group in which one hydrogen atom is further eliminated from an aryl group in an arylalkyl group, for example, a benzyl group, a phenethyl group, a 1-naphthylmethyl group, a 2-naphthylmethyl group, a 1-naphthylethyl group, or a 2-naphthylethyl group). The carbon number of the alkylene group (the alkyl chain in the arylalkyl group) is preferably 1 to 4, more preferably 1 to 2, and especially preferably 1.

In the formula (a1-2), the $(n_{a2}+1)$-valent hydrocarbon group represented by $Wa^1$ may be either an aliphatic hydrocarbon group or an aromatic hydrocarbon group. The aliphatic hydrocarbon group means a hydrocarbon group having no aromaticity. The aliphatic hydrocarbon group may be either saturated or unsaturated, and in general, it is preferably saturated. Examples of the aliphatic hydrocarbon group include a linear or branched aliphatic hydrocarbon group, an aliphatic hydrocarbon group containing a ring in a structure thereof, and a group in which a linear or branched aliphatic hydrocarbon group and an aliphatic hydrocarbon group containing a ring in a structure thereof are combined. Specifically, examples thereof include the same groups as those for $Va^1$ of the formula (a1-1).

The valence of $(n_{a2}+1)$ is preferably divalent to tetravalent, and more preferably divalent or trivalent.

In particular, the formula (a1-2) is preferably a constituent unit represented by the following general formula (a1-2-01).

(Chemical formula 20)

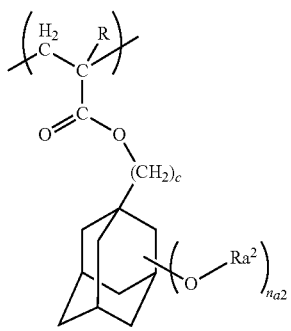

(a1-2-01)

In the formula (a1-2-01), $Ra^2$ represents an acid dissociable group represented by the formula (a1-r-1) or (a1-r-3). $n_{a2}$ is an integer of 1 to 3, preferably 1 or 2, and more preferably 1. c is an integer of 0 to 3, preferably 0 or 1, and more preferably 1. R is the same as that described above.

In the resist composition of the present invention, the resin component (A) contains at least two or more kinds of the constituent unit (a1) containing the acid dissociable group represented by the general formula (a1-r-1) or (a1-r-2).

In the present invention, it is preferable that the constituent unit (a1) contains (I) at least two or more kinds of constituent units selected from the group consisting of the constituent unit represented by the general formula (a1-1); or (II) at least two or more kinds of constituent units selected from the group consisting of the constituent unit represented by the general formula (a1-1) and the constituent unit represented by the general formula (a1-2).

In the case of (I) as described above, in the general formula (a1-1), it is preferable that $Ra^1$ is different from each other. As for a combination of $Ra^1$s, plural kinds can be combined from the acid dissociable groups represented by the formula (a1-r-2). Above all, it is preferable to contain at least two or more kinds of groups selected from the group consisting of groups represented by the following general formulae (r-pr1) to (r-pr5). Two or more kinds composed of a combination of those shown in the following (I-1) to (I-4) are more preferable, and two kinds of constituent units composed of the foregoing combination are still more preferable.

(I-1): A combination of a monocyclic acid dissociable group with a polycyclic acid dissociable group, in which two or more kinds of groups composed of a combination of the general formula (r-pr1) or (r-pr3) with the general formula (r-pr2) or (r-pr4), respectively are preferable, and two or more kinds of groups composed of a combination of the general formula (r-pr1) with the general formula (r-pr2), or a combination of the general formula (r-pr1) with the general formula (r-pr4) are more preferable.

(I-2): A combination of monocyclic acid dissociable groups with each other, in which two or more kinds of groups composed of a combination of any one or both of the general formula (r-pr1) and the general formula (r-pr3) are preferable, and two or more kinds of groups composed of a combination in the general formula (r-pr1) are more preferable.

(I-3): A combination of polycyclic acid dissociable groups with each other, in which two or more kinds of groups composed of a combination of any one or both of the general formula (r-pr2) and the general formula (r-pr4) are preferable, and two or more kinds of groups composed of a combination of the general formula (r-pr2) with the general formula (r-pr4) or a combination in the general formula (r-pr2) are more preferable.

(I-4): A combination of a tertiary alkyl ester-type acid dissociable group with an acetal-type acid dissociable group, in which two or more kinds of groups composed of a combination of one or more kinds of any of the general formulae (r-pr1) to (r-pr4) with the general formula (r-pr5) are preferable, and two or more kinds of groups composed of a combination of one or more kinds of any of the general formulae (r-pr1) to (r-pr2) with the general formula (r-pr5) are more preferable.

(Chemical formula 21)

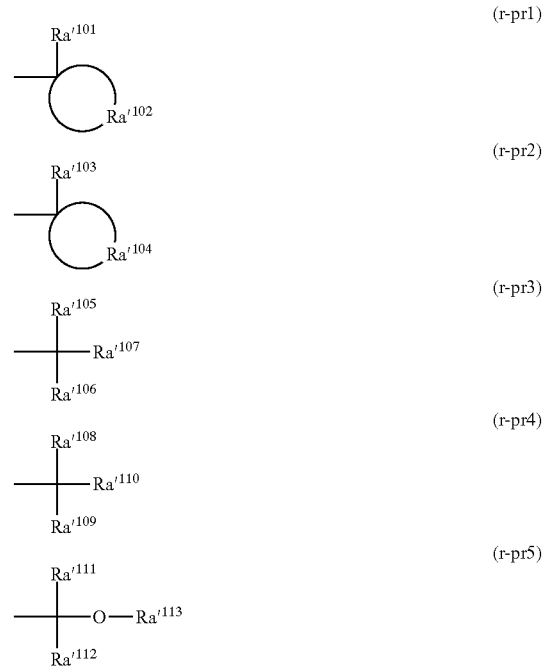

In the formulae, each of $Ra'^{101}$ and $Ra'^{103}$ represents an alkyl group having 1 to 10 carbon atoms; $Ra'^{102}$ represents a group for forming an aliphatic monocyclic group together with the carbon atom to which $Ra'^{101}$ is bonded; $Ra'^{104}$ represents a group for forming an aliphatic polycyclic group together with the carbon atom to which $Ra'^{103}$ is bonded; each of $Ra'^{105}$ to $Ra'^{106}$ and $Ra'^{108}$ to $Ra'^{109}$ represents a chain alkyl group having 1 to 10 carbon atoms; $Ra'^{107}$ represents a monocyclic hydrocarbon group having 3 to 10 carbon atoms; $Ra'^{110}$ represents a polycyclic hydrocarbon group having 7 to 20 carbon atoms; each of $Ra'^{111}$ to $Ra'^{112}$ represents a hydrogen atom or an alkyl group having 1 to 10 carbon atoms; and $Ra'^{113}$ represents an alkyl group having 1 to 20 carbon atoms or a cyclic hydrocarbon group having 3 to 20 carbon atoms.

In the formulae, the alkyl group having 1 to 10 carbon atoms, as represented by $Ra'^{101}$ and $Ra'^{103}$, is the same as that described above, and an alkyl group having 1 to 5 carbon atoms is more preferable.

In the formulae, the group for forming an aliphatic monocyclic group together with the carbon atom to which $Ra'^{101}$ in $Ra'^{102}$ is bonded is the same as that in the above-described monocyclic aliphatic hydrocarbon group, and an aliphatic monocyclic group having 3 to 8 carbon atoms is more preferable.

In the formulae, the group for forming an aliphatic polycyclic group together with the carbon atom to which $Ra'^{103}$ in $Ra'^{104}$ is bonded is the same as that in the above-described polycyclic aliphatic hydrocarbon group, and an aliphatic polycyclic group having 7 to 12 carbon atoms is more preferable.

In the formulae, the chain alkyl group having 1 to 10 carbon atoms, as represented by $Ra'^{105}$ to $Ra'^{106}$ and $Ra'^{108}$ to $Ra'^{109}$, is the same as that described above, and an alkyl group having 1 to 5 carbon atoms is more preferable.

In the formulae, the monocyclic hydrocarbon group having 3 to 10 carbon atoms, as represented by $Ra'^{107}$, is the same as the above-described monocyclic hydrocarbon group in the cyclic hydrocarbon group as represented by $Ra'^{3}$, and it is preferably a monocyclic aliphatic hydrocarbon group.

In the formulae, the polycyclic hydrocarbon group having 7 to 20 carbon atoms, as represented by $Ra'^{110}$, is the same as the above-described polycyclic hydrocarbon group in the cyclic hydrocarbon group as represented by $Ra'^{3}$, and it is preferably a polycyclic aliphatic hydrocarbon group.

In the formulae, the alkyl group having 1 to 10 carbon atoms, as represented by $Ra'^{111}$ to $Ra'^{112}$, is the same as that described above, and it is preferably an alkyl group having 1 to 5 carbon atoms. Each of $Ra'^{111}$ to $Ra'^{112}$ is preferably a hydrogen atom.

In the formulae, the alkyl group having 1 to 20 carbon atoms, as represented by $Ra'^{113}$, is the same as the above-described alkyl group having 1 to 20 carbon atoms, as represented by $Ra'^{3}$, and it is preferably an alkyl group having 1 to 10 carbon atoms.

In the formulae, the cyclic hydrocarbon group having 3 to 20 carbon atoms, as represented by $Ra'^{113}$, is the same as the above-described cyclic hydrocarbon group as represented by $Ra'^{3}$, and it is preferably a polycyclic aliphatic hydrocarbon group.

More specifically, the general formula (r-pr1) is corresponding to the formulae (r-pr-s1) to (r-pr-s18); the general formula (r-pr2) is corresponding to the formulae (r-pr-m1) to (r-pr-m17); the general formula (r-pr3) is corresponding to the formulae (r-pr-cs1) to (r-pr-cs5); and the general formula (r-pr4) is corresponding to the formulae (r-pr-cm1) to (r-pr-cm8).

So far as the combination of the case of (II) as described above is concerned, as for the general formula (a1-1), $Ra^{1}$ contains preferably a group selected from the group consisting of the groups represented by the general formulae (r-pr1) to (r-pr5), and more preferably the group represented by the general formula (r-pr1) or (r-pr2). As for the general formula (a1-2), it is preferably the constituent unit represented by the general formula (a1-2-01). In the case of (II) as described above, two or more kinds of constituent units composed of the foregoing combination are preferable, and two kinds of constituent units composed of the foregoing combination are more preferable.

In the case of (I) as described above, examples of the combination of the constituent unit (a1) include the following.

(I-1): There are exemplified combinations in which the monocyclic acid dissociable group is any one or more kinds of (a1-1-22) to (a1-1-40), and the polycyclic acid dissociable group is any one or more kinds of (a1-1-1) to (a1-1-21). More specifically, examples thereof include a combination of (a1-1-22) and (a1-1-4).

(I-2): There are exemplified combinations in which the monocyclic acid dissociable group is any two or more kinds of (a1-1-22) to (a1-1-40). More specifically, examples thereof include a combination of (a1-1-22) and (a1-1-24).

(I-3): There are exemplified combinations in which the polycyclic acid dissociable group is any two or more kinds of (a1-1-1) to (a1-1-21). More specifically, examples thereof include a combination of (a1-1-1) and (a1-1-18).

(I-4): There are exemplified combinations in which the tertiary alkyl ester-type acid dissociable group is any one or more kinds of (a1-1-1) to (a1-1-40), and the acetal-type acid dissociable group is any one or more kinds of (a1-2-1) to (a1-2-20). More specifically, examples thereof include a combination of (a1-1-22) and (a1-2-6).

In the case of (II) as described above, examples of the combination of the constituent unit (a1) include combinations in which the constituent unit (a1-1) is any one or more kinds of (a1-1-1) to (a1-1-40), and the constituent unit (a1-2) is any one or more kinds of (a1-2-1) to (a1-2-24) and (a1-2-01-1) to (a1-2-01-9). More specifically, examples thereof include a combination of (a1-1-4) and (a1-2-01-5).

Specific examples of the formulae (a1-1) and (a1-2) are given below. In each of the following formulae, $R^{\alpha}$ represents a hydrogen atom, a methyl group, or a trifluoromethyl group.

(Chemical formula 22)

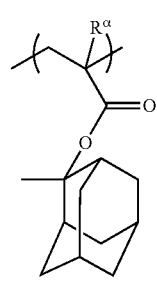

(a1-1-1)

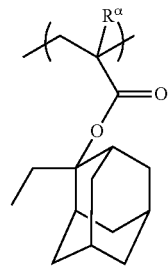

(a1-1-2)

(a1-1-3) 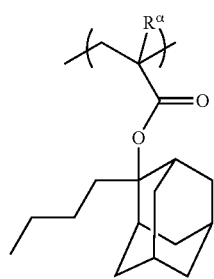
(a1-1-4) 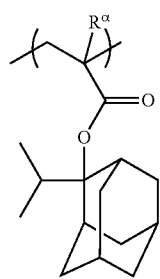
(a1-1-5) 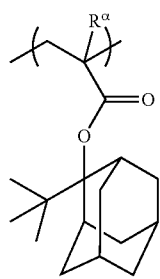
(a1-1-6) 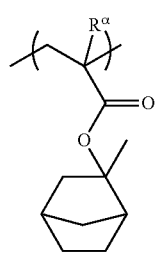
(a1-1-7) 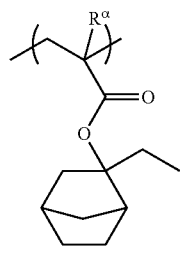
(a1-1-8) 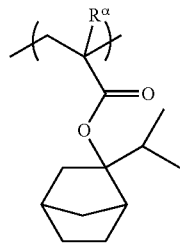
(a1-1-9) 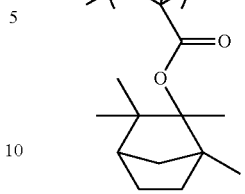
(a1-1-10) 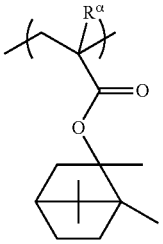
(a1-1-11) 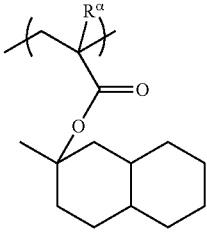
(a1-1-12) 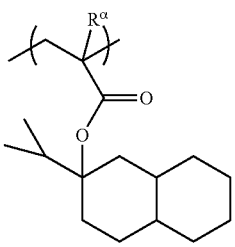
(a1-1-13) 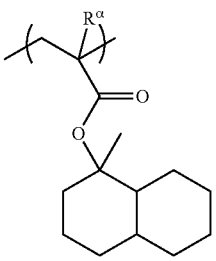
(a1-1-14) 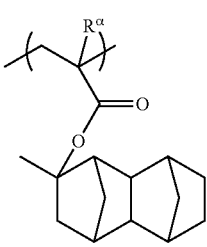

(a1-1-15)
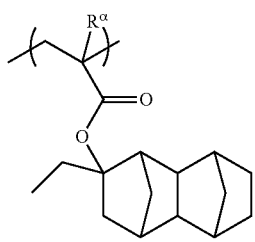
(a1-1-16)
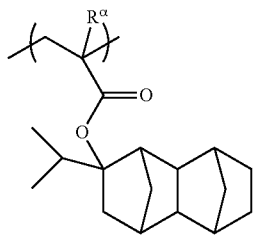
(a1-1-17)
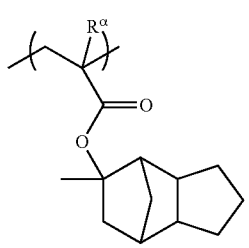
(Chemical formula 23)
(a1-1-18)
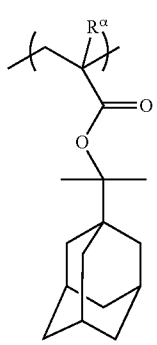
(a1-1-19)
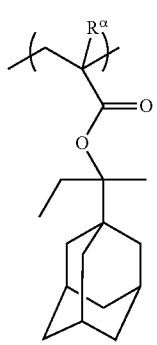
(a1-1-20)
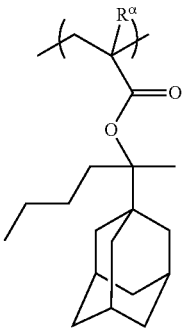
(a1-1-21)
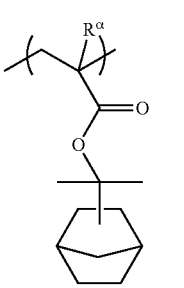
(Chemical formula 24)
(a1-1-22)
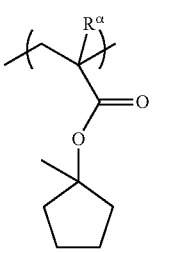
(a1-1-23)
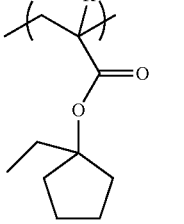
(a1-1-24)
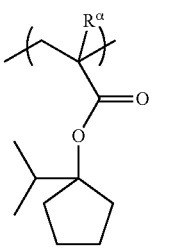
(a1-1-25)
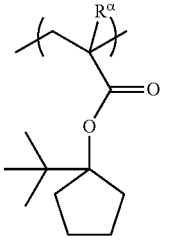

(a1-1-26) 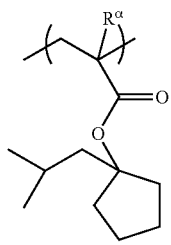
(a1-1-27) 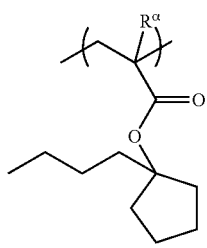
(a1-1-28) 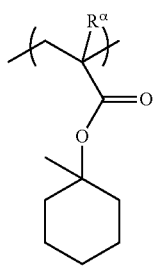
(a1-1-29) 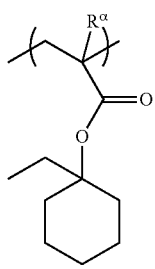
(a1-1-30) 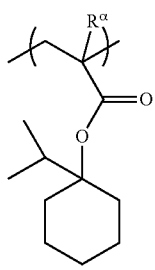
(a1-1-31) 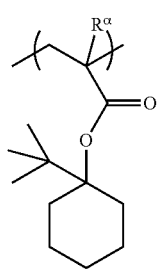
(a1-1-32) 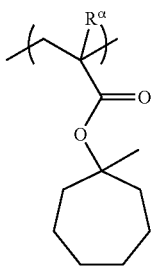
(a1-1-33) 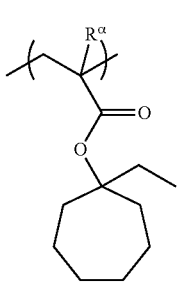
(a1-1-34) 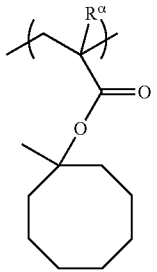
(a1-1-35) 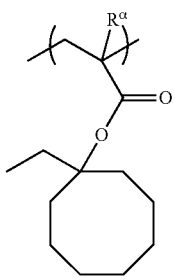
(a1-1-36) 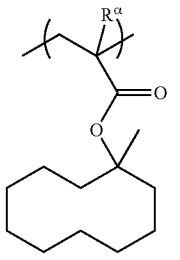

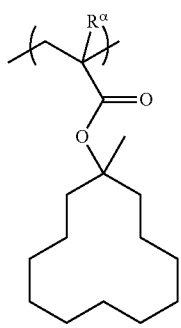 (a1-1-37)
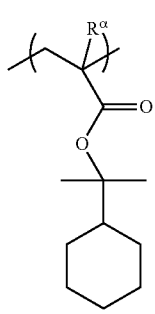 (a1-1-38)
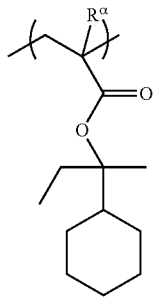 (a1-1-39)
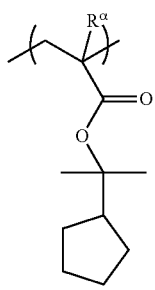 (a1-1-40)
(Chemical formula 25)
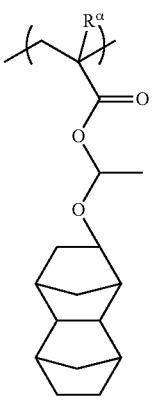 (a1-2-1)
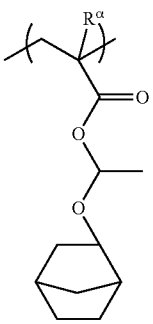 (a1-2-2)
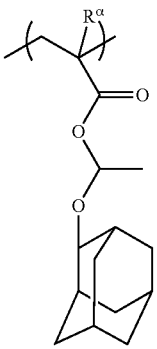 (a1-2-3)
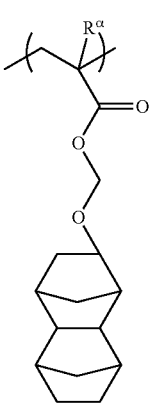 (a1-2-4)

(a1-2-5)
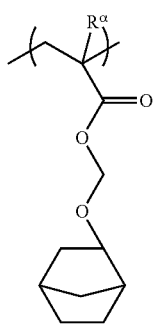
(a1-2-6)
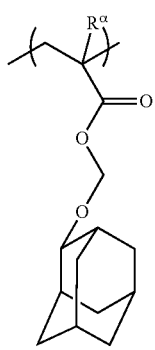
(a1-2-7)
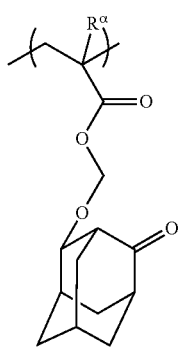
(a1-2-8)
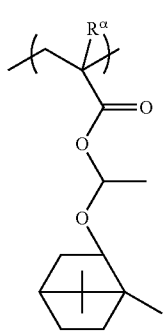
(a1-2-9)
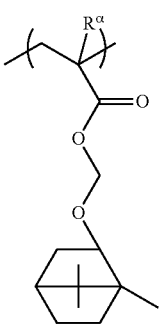
(a1-2-10)
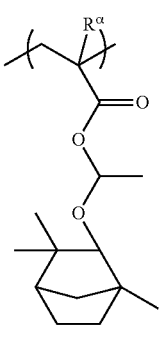
(a1-2-11)
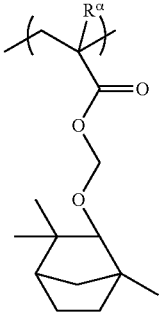
(a1-2-12)
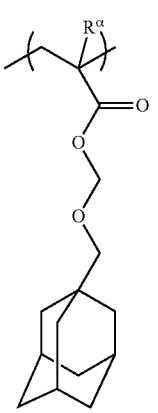

(a1-2-13)
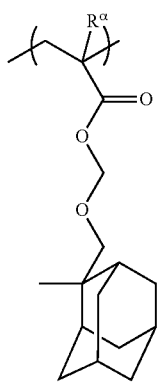
(a1-2-14)
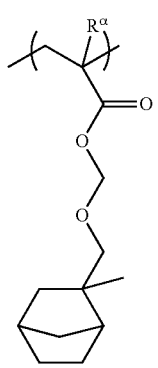
(Chemical formula 26)
(a1-2-15)
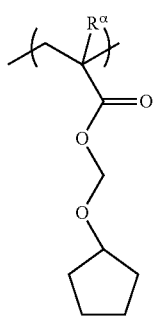
(a1-2-16)
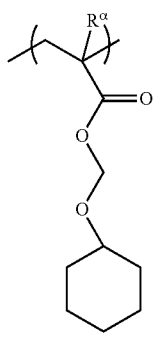
(a1-2-17)
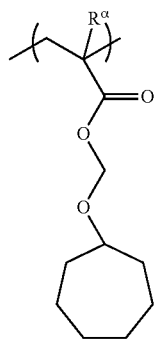
(a1-2-18)
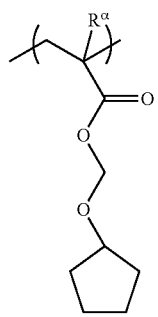
(a1-2-19)
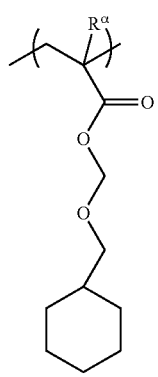
(a1-2-20)
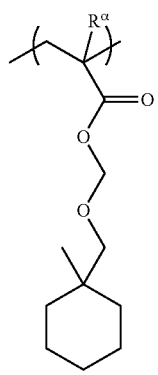
(a1-2-21)

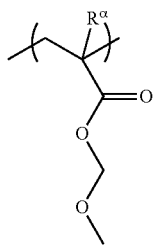
(a1-2-22)
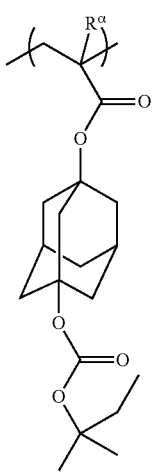
(a1-2-01-2)
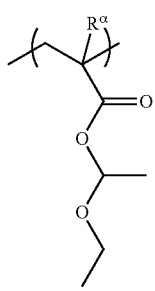
(a1-2-23)
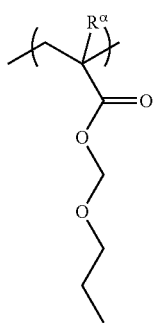
(a1-2-24)
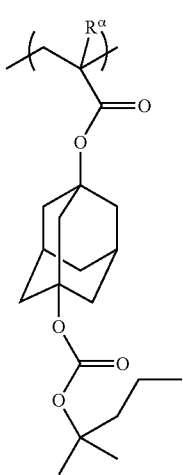
(a1-2-01-3)
(Chemical formula 27)
(a1-2-01-1)
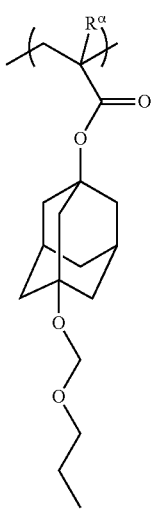
(a1-2-01-4)

(a1-2-01-5)
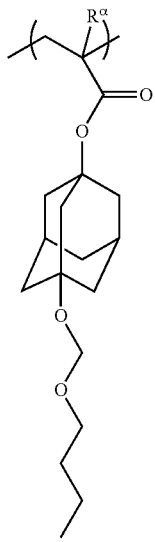

(a1-2-01-6)
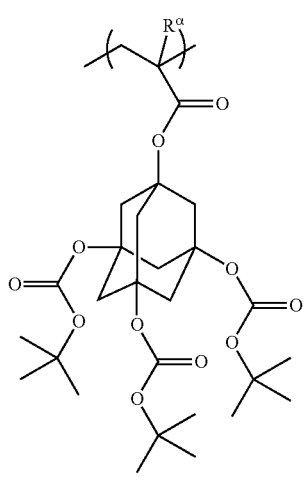

(a1-2-01-7)
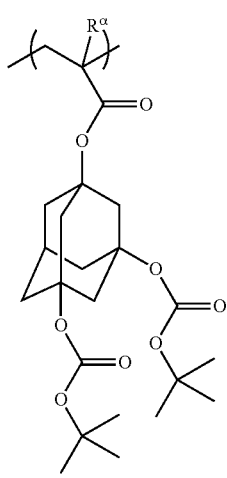

(a1-2-01-8)
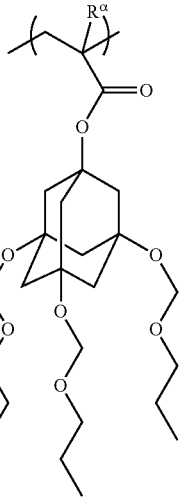

(a1-2-01-9)
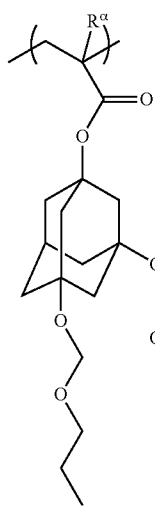

A proportion of the constituent unit (a1) in the component (A) is preferably 20 to 80 mol %, more preferably 20 to 75 mol %, and still more preferably 25 to 70 mol % relative to all of the constituent units constituting the component (A). When the proportion of the constituent unit (a1) in the component (A) is the lower limit value or more, lithography properties such as sensitivity, resolution, and LWR are also enhanced. In addition, when the proportion of the constituent unit (a1) in the component (A) is not more than the upper limit value, a balance with other constituent units can be taken.

In addition, as for the two or more kinds of constituent units contained in the constituent unit (a1), two or three kinds of constituent units are preferable, two or three kinds composed of a combination in the foregoing (I-1) to (I-4) and (II) are more preferable, and two kinds composed of the foregoing combination are still more preferable. In the case of two kinds of constituent units, a blending ratio thereof is preferably 5/95 to 95/5, and more preferably 10/90 to 90/10 (while defining the proportion of (a1) as 100).

(Constituent Unit (a2))

The constituent unit (a2) is a constituent unit containing a lactone-containing cyclic group, a carbonate-containing cyclic group, or an —$SO_2$—-containing cyclic group, and it is a constituent unit which does not fall under the definition of the constituent unit (a0). The constituent unit (a2) is preferably a constituent unit represented by the following general formula (a2-1), and more preferably a constituent unit derived from an acrylic ester.

In the case of using the component (A1) for the formation of a resist film, the lactone-containing cyclic group or the carbonate-containing cyclic group of the constituent unit (a2) is effective for increasing the adhesion of the resist film to a substrate.

Incidentally, in the case where the constituent unit (a1) is one containing a lactone-containing cyclic group or a carbonate-containing cyclic group in a structure thereof, the constituent unit also falls under the definition of the constituent unit (a2). However, it should be construed that such a constituent unit falls under the definition of the constituent unit (a1) but does not fall under the definition of the constituent unit (a2).

In the case of using the component (A1) for the formation of a resist film, the —$SO_2$—-containing cyclic group of the constituent unit (a2) is effective for increasing the adhesion of the resist film to a substrate.

Incidentally, in the case where the constituent unit (a1) is a constituent unit containing an —$SO_2$—-containing cyclic group in a structure thereof, the constituent unit also falls under the definition of the constituent unit (a2). However, it should be construed that such a constituent unit falls under the definition of the constituent unit (a1) but does not fall within the definition of the constituent unit (a2).

The constituent unit (a2) is preferably a constituent unit represented by the following general formula (a2-1).

(Chemical formula 28)

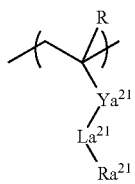

(a2-1)

In the formula, R represents a hydrogen atom, an alkyl group having 1 to 5 carbon atoms, or a halogenated alkyl group having 1 to 5 carbon atoms; $Ya^{21}$ represents a single bond or a divalent linking group; $La^{21}$ represents —O—, —COO—, —CON(R')—, —OCO—, —CONHCO—, or —CONHCS—; R' represents a hydrogen atom or a methyl group, provided that in the case where $La^{21}$ is —O—, $Ya^{21}$ is not —CO—; and $Ra^{21}$ represents a lactone-containing cyclic group, a carbonate-containing cyclic group, or an —$SO_2$—-containing cyclic group.

Though the divalent linking group represented by $Ya^{21}$ is not particularly limited, suitable examples thereof include a divalent hydrocarbon group which may have a substituent; and a divalent linking group containing a hetero atom.

(Divalent Hydrocarbon Group which May have a Substituent)

The hydrocarbon group as the divalent linking group may be either an aliphatic hydrocarbon group or an aromatic hydrocarbon group.

The aliphatic hydrocarbon group means a hydrocarbon group having no aromaticity. The aliphatic hydrocarbon group may be either saturated or unsaturated, and in general, it is preferably saturated.

Examples of the aliphatic hydrocarbon group include a linear or branched aliphatic hydrocarbon group and an aliphatic hydrocarbon group containing a ring in a structure thereof. Specifically, examples thereof include the same groups as those exemplified above for $Va^1$ in the formula (a1-1).

The linear or branched aliphatic hydrocarbon group may or may not have a substituent. Examples of the substituent include a fluorine atom, a fluorinated alkyl group having 1 to 5 carbon atoms, which is substituted with a fluorine atom, and a carbonyl group.

Examples of the aliphatic hydrocarbon group containing a ring in a structure thereof include a cyclic aliphatic hydrocarbon group containing a hetero atom in a ring structure thereof, which may contain a substituent (a group in which two hydrogen atoms are eliminated from an aliphatic hydrocarbon ring); a group in which the above-described cyclic aliphatic hydrocarbon group is bonded to the terminal of a linear or branched aliphatic hydrocarbon group; and a group in which the above-described cyclic aliphatic hydrocarbon group intervenes on the way of a linear or branched aliphatic hydrocarbon group. Examples of the linear or branched aliphatic hydrocarbon group include the same groups as those described above.

The cyclic aliphatic hydrocarbon group has preferably 3 to 20 carbon atoms, and more preferably 3 to 12 carbon atoms.

Specifically, examples of the cyclic aliphatic hydrocarbon group include the same groups as those exemplified above for $Va^1$ in the formula (a1-1).

The cyclic aliphatic hydrocarbon group may or may not have a substituent. Examples of the substituent include an alkyl group, an alkoxy group, a halogen atom, a halogenated alkyl group, a hydroxyl group, and a carbonyl group.

The alkyl group as the substituent is preferably an alkyl group having 1 to 5 carbon atoms, and most preferably a methyl group, an ethyl group, a propyl group, an n-butyl group, or a tert-butyl group.

The alkoxy group as the substituent is preferably an alkoxy group having 1 to 5 carbon atoms, more preferably a methoxy group, an ethoxy group, an n-propoxy group, an isopropoxy group, an n-butoxy group, or a tert-butoxy group, and most preferably a methoxy group or an ethoxy group.

Examples of the halogen atom as the substituent include a fluorine atom, a chlorine atom, a bromine atom, and an iodine atom, with a fluorine atom being preferable.

Examples of the halogenated alkyl group as the substituent include a group in which a part or all of the hydrogen atoms of the above-described alkyl group are substituted with the above-described halogen atom.

In the cyclic aliphatic hydrocarbon group, a part of the carbon atoms constituting the ring structure thereof may be substituted with a substituent containing a hetero atom. The substituent containing a hetero atom is preferably —O—, —C(C=O)—O—, —S—, —S(=O)$_2$—, or —S(=O)$_2$—O—.

Specifically, examples of the aromatic hydrocarbon group as the divalent hydrocarbon group include the same groups as those exemplified above for $Va^1$ in the formula (a1-1).

In the aromatic hydrocarbon group, the hydrogen atom which the aromatic hydrocarbon group has may be substituted with a substituent. For example, the hydrogen atom bonded to the aromatic ring in the aromatic hydrocarbon group may be substituted with a substituent. Examples of the substituent include an alkyl group, an alkoxy group, a halogen atom, a halogenated alkyl group, and a hydroxyl group.

The alkyl group as the substituent is preferably an alkyl group having 1 to 5 carbon atoms, and most preferably a methyl group, an ethyl group, a propyl group, an n-butyl group, or a tert-butyl group.

Examples of the alkoxy group, the halogen atom, and the halogenated alkyl group as the substituent include the same groups as those exemplified above for the substituent with which the hydrogen atom which the cyclic aliphatic hydrocarbon group has is substituted.

(Divalent Linking Group Containing a Hetero Atom)

The hetero atom in the divalent linking group containing a hetero atom is an atom other than a carbon atom or a hydrogen atom, and examples thereof include an oxygen atom, a nitrogen atom, a sulfur atom, and a halogen atom.

In the case where $Ya^{21}$ is a divalent linking group containing a hetero atom, suitable examples of the linking group include —O—, —C(C=O)—O—, —C(C=O)—, —O—C(C=O)—O—, —C(=O)—NH—, —NH—, —NH—C(=NH)— (H may be substituted with a substituent such as an alkyl group and an acyl group), —S—, —S(=O)$_2$—, —S(=O)$_2$—O—, and a group represented by the general formula: —$Y^{21}$—O—$Y^{22}$—, —$Y^{21}$—O—, —$Y^{21}$—C(=O)—O—, —C(=O)—O—$Y^{21}$—, —[$Y^{21}$—C(=O)—O]$_{m'}$—$Y^{22}$—, or —$Y^{21}$—O—C(=O)—$Y^{22}$— [wherein each of $Y^{21}$ and $Y^{22}$ independently represents a divalent hydrocarbon group which may have a substituent; O represents an oxygen atom; and m' is an integer of 0 to 3].

In the case where the divalent linking group containing a hetero atom is —C(C=O)—NH—, —NH—, or —NH—C(=NH)—, H may be substituted with a substituent such as an alkyl group and an acyl group. The substituent (for example, an alkyl group or an acyl group) has preferably 1 to 10 carbon atoms, more preferably 1 to 8 carbon atoms, and especially preferably 1 to 5 carbon atoms.

In the formula: —$Y^{21}$—O—$Y^{22}$—, —$Y^{21}$—O—, —$Y^{21}$—C(=O)—O—, —C(=O)—O—$Y^{21}$—, —[$Y^{21}$—C(=O)—O]$_{m'}$—$Y^{22}$—, or —$Y^{21}$—O—C(=O)—$Y^{22}$—, each of $Y^{21}$ and $Y^{22}$ independently represents a divalent hydrocarbon group which may have a substituent. Examples of the divalent hydrocarbon group include the same groups as those of the "divalent hydrocarbon group which may have a substituent" exemplified above in the explanation for the divalent linking group.

$Y^{21}$ is preferably a linear aliphatic hydrocarbon group, more preferably a linear alkylene group, still more preferably a linear alkylene group having 1 to 5 carbon atoms, and especially preferably a methylene group or an ethylene group.

$Y^{22}$ is preferably a linear or branched aliphatic hydrocarbon group, and more preferably a methylene group, an ethylene group, or an alkylmethylene group. The alkyl group in the alkylmethylene group is preferably a linear alkyl group having 1 to 5 carbon atoms, more preferably a linear alkyl group having 1 to 3 carbon atoms, and most preferably a methyl group.

In the group represented by the formula: —[$Y^{21}$—C(=O)—O]$_{m'}$—$Y^{22}$—, m' is an integer of 0 to 3, preferably an integer of 0 to 2, more preferably 0 or 1, and especially preferably 1. Namely, the group represented by the formula: —[$Y^{21}$—C(=O)—O]$_{m'}$—$Y^2$— is especially preferably a group represented by the formula: —$Y^{21}$—C(=O)—O—$Y^{22}$—. Above all, a group represented by the formula: —(CH$_2$)$_{a'}$—C(=O)—O—(CH$_2$)$_{b'}$— is preferable. In the formula, a' is an integer of 1 to 10, preferably an integer of 1 to 8, more preferably an integer of 1 to 5, still more preferably 1 or 2, and most preferably 1. b' is an integer of 1 to 10, preferably an integer of 1 to 8, more preferably an integer of 1 to 5, still more preferably 1 or 2, and most preferably 1.

In the present invention, $Ya^{21}$ is preferably a single bond, or an ester bond [—C(C=O)—O—], an ether bond (—O—), a linear or branched alkylene group, or a combination thereof.

In the formula (a2-1), $Ra^{21}$ represents a lactone-containing cyclic group, a carbonate-containing cyclic group, or an —SO$_2$—-containing cyclic group.

The "lactone-containing cyclic group" is the same as the lactone-containing cyclic group exemplified above in the explanation for $R^1$ in the general formula (a0-1). However, in the formula (a2-r-1), a cyclic group having —COOR" in the substituent is excluded.

The "carbonate-containing cyclic group" represented by $Ra^{21}$ is the same as the carbonate-containing cyclic group exemplified above in the explanation for $R^1$ in the general formula (a0-1).

The "—SO$_2$—-containing cyclic group" represented by $Ra^{21}$ is the same as the —SO$_2$—-containing cyclic group exemplified above in the explanation for $R^1$ in the general formula (a0-1).

The constituent unit (a2) which the component (A1) has may be either one kind or two or more kinds.

In the case where the component (A1) has the constituent unit (a2), a proportion of the constituent unit (a2) is preferably 1 to 80 mol %, more preferably 5 to 70 mol %, still more preferably 10 to 65 mol %, and especially preferably 10 to 60 mol % relative to a total sum of all of the constituent units constituting the component (A1). When the proportion of the constituent unit (a2) in the component (A1) is the lower limit value or more, the effects to be brought due to the fact that the constituent unit (a2) is contained are sufficiently obtained. When the proportion of the constituent unit (a2) in the component (A1) is not more than the upper limit value, a balance with other constituent units can be taken, and various lithography properties such as DOF and CDU and the pattern shape become satisfactory.

(Other Constituent Units)

The resist composition of the present invention may have the following constituent unit (a3) and constituent unit (a4) in addition to the constituent unit (a0) the constituent unit (a1), and the constituent unit (a2).

(Constituent Unit (a3))

A constituent unit (a3) is a constituent unit containing a polar group-containing aliphatic hydrocarbon group (however, those falling within the definitions of the constituent units (a0), (a1), and (a2) are excluded).

In view of the fact that the component (A1) contains the constituent unit (a3), it may be considered that the hydrophilicity of the component (A) increases, thereby contributing to an enhancement of the resolution.

Examples of the polar group include a hydroxyl group, a cyano group, a carboxy group, and a hydroxyalkyl group in which apart of hydrogen atoms of an alkyl group is substituted with a fluorine atom, with a hydroxyl group being especially preferable.

Examples of the aliphatic hydrocarbon group include a linear or branched hydrocarbon group having 1 to 10 carbon atoms (preferably an alkylene group) and a cyclic aliphatic hydrocarbon group (cyclic group). The cyclic group may be either a monocyclic group or a polycyclic group. For example, the cyclic group can be selected appropriately from a large number of groups proposed for resins of resist compositions for ArF excimer lasers. The cyclic group is preferably a polycyclic group, and more preferably, it has 7 to 30 carbon atoms.

Above all, constituent units derived from an acrylic ester containing an aliphatic polycyclic group containing a hydroxyl group, a cyano group, a carboxy group, or a hydroxyalkyl group in which a part of hydrogen atoms of an alkyl group is substituted with a fluorine atom, are more preferable. Examples of the polycyclic group include a group in which two or more hydrogen atoms are eliminated from a bicycloalkane, a tricycloalkane, a tetracycloalkane, or the like. Specifically, examples thereof include a group in which two or more hydrogen atoms are eliminated from a polycycloalkane such as adamantane, norbornane, isobornane, tricyclodecane, and tetracyclododecane. Of these polycyclic groups, a group in which two or more hydrogen atoms are eliminated from adamantane, a group in which two or more hydrogen atoms are eliminated from norbornane, or a group in which two or more hydrogen atoms are eliminated from tetracyclododecane is industrially preferable.

The constituent unit (a3) is not particularly limited so long as it is a constituent unit containing a polar group-containing aliphatic hydrocarbon group, and any optional constituent unit can be used.

The constituent unit (a3) is preferably a constituent unit containing a polar group-containing aliphatic hydrocarbon group, which is a constituent unit derived from an acrylic ester in which the hydrogen atom bonded to the carbon atom at the α-position may be substituted with a substituent.

When the hydrocarbon group in the polar group-containing aliphatic hydrocarbon group is a linear or branched hydrocarbon group having 1 to 10 carbon atoms, the constituent unit (a3) is preferably a constituent unit derived from a hydroxyethyl ester of acrylic acid; and when the hydrocarbon group is a polycyclic group, preferred examples thereof include a constituent unit represented by the following formula (a3-1), a constituent unit represented by the following formula (a3-2), and a constituent unit represented by the following formula (a3-3).

(Chemical formula 29)

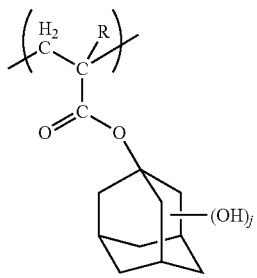

(a3-1)

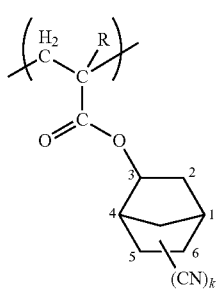

(a3-2)

-continued

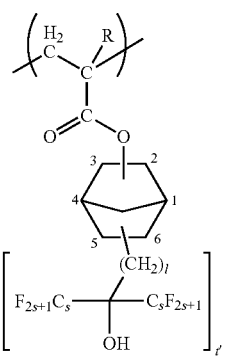

(a3-3)

In the formulae, R is the same as that described above; j is an integer of 1 to 3; k is an integer of 1 to 3; t' is an integer of 1 to 3; l is an integer of 1 to 5; and s is an integer of 1 to 3.

In the formula (a3-1), j is preferably 1 or 2, and more preferably 1. In the case where j is 2, the hydroxyl group is preferably bonded to the 3-position and 5-position of the adamantyl group, respectively. In the case where j is 1, the hydroxyl group is preferably bonded to the 3-position of the adamantyl group.

j is preferably 1, and in particular, it is preferable that the hydroxyl group is bonded to the 3-position of the adamantyl group.

In the formula (a3-2), k is preferably 1; and the cyano group is preferably bonded to the 5-position or 6-position of the norbornyl group.

In the formula (a3-3), t' is preferably 1; l is preferably 1; and s is preferably 1. It is preferable that the 2-norbornyl group or 3-norbonnyl group is bonded to the terminal of the carboxy group of acrylic acid. The fluorinated alkyl alcohol is preferably bonded to the 5-position or 6-position of the norbornyl group.

The constituent unit (a3) which the component (A1) contains may be either one kind or two or more kinds.

A proportion of the constituent unit (a3) in the component (A1) is preferably 5 to 50 mol %, more preferably 5 to 40 mol %, and still more preferably 5 to 25 mol % relative to a total sum of all of the constituent units constituting the resin component (A1).

When the proportion of the constituent unit (a3) is the lower limit value or more, the effects to be brought due to the fact that the constituent unit (a3) is contained are sufficiently obtained. When the proportion of the constituent unit (a3) is not more than the upper limit value, a balance with other constituent units is easily taken.

(Constituent Unit (a4))

A constituent unit (a4) is a constituent unit containing an acid non-dissociable cyclic group. When the component (A1) has the constituent unit (a4), the dry etching resistance of a resist pattern to be formed is enhanced. In addition, the hydrophobicity of the component (A1) increases. It may be considered that in particular, in the case of organic solvent development, the enhancement of the hydrophobicity contributes to an enhancement of resolution, a resist pattern shape, or the like.

The "acid non-dissociable cyclic group" in the constituent unit (a4) is a cyclic group which on the occasion of the generation of an acid from the component (B) upon exposure, remains in the constituent unit as it is without being dissociated even by the action of the acid.

The constituent unit (a4) is preferably a constituent unit derived from, for example, an acrylic ester containing an acid non-dissociable aliphatic cyclic group. Examples of the cyclic group include the same groups as those exemplified above in the case of the constituent unit (a1), and a large number of groups which have hitherto been known as the groups useful for the resin components of resist compositions for ArF excimer laser, for KrF excimer laser (preferably for ArF excimer layer), or the like can be used.

In particular, it is preferable from the standpoint of easiness of industrial availability or the like that the cyclic group is at least one member selected from a tricyclodecyl group, an adamantyl group, a tetracyclododecyl group, an isobornyl group, and a norbornyl group. Such a polycyclic ring may have a linear or branched alkyl group having 1 to 5 carbon atoms as a substituent.

Specifically, examples of the constituent unit (a4) include a constituent unit having a structure represented by each of the following general formulae (a4-1) to (a4-7).

(Chemical formula 30)

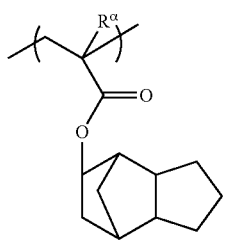
(a4-1)

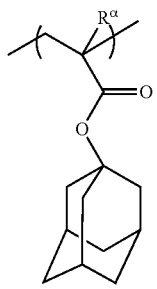
(a4-2)

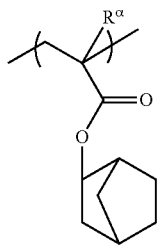
(a4-3)

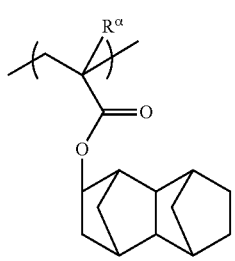
(a4-4)

-continued

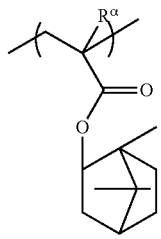
(a4-5)

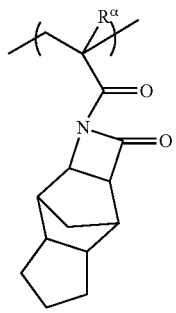
(a4-6)

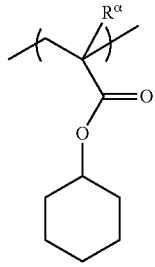
(a4-7)

In the formulae, $R^\alpha$ represents a hydrogen atom, a methyl group, or a trifluoromethyl group.

The constituent unit (a4) which the component (A1) contains may be either one kind or two or more kinds.

On the occasion of incorporating the constituent unit (a4) into the component (A1), a proportion of the constituent unit (a4) is preferably 1 to 30 mol %, and more preferably 10 to 20 mol % relative to a total sum of all of the constituent units constituting the component (A1).

The component (A1) is a copolymer having at least the constituent units (a0), (a1), and (a2), and the copolymer is preferably a copolymer having the constituent units (a0), (a1), (a2), and (a3).

A weight average molecular weight (Mw) of the component (A1) (as reduced into standard polystyrene by means of gel permeation chromatography) is not particularly limited, but it is preferably 1,000 to 50,000, more preferably 1,500 to 30,000, and most preferably 2,000 to 20,000. When the weight average molecular weight of the component (A1) is not more than the upper limit value of this range, sufficient solubility in a resist solvent for the use as a resist is exhibited, whereas when it is the lower limit value of this range or more, the dry etching resistance and the cross-sectional shape of a resist pattern are satisfactory.

In addition, a degree of dispersion (Mw/Mn) of the component (A1) is not particularly limited, but it is preferably 1.0 to 5.0, more preferably 1.0 to 3.0, and most preferably 1.2 to 2.5. Incidentally, Mn refers to a number average molecular weight.

The component (A1) may be used solely or in combination of two or more kinds thereof.

A proportion of the component (A1) in the base material component (A) is preferably 25 mass % or more, more preferably 50 mass % or more, and still more preferably 75 mass % or more relative to a total mass of the base material component (A), and it may be even 100 mass %. When the proportion of the component (A1) in the base material component (A) is 25 mass % or more, lithography properties such as MEF, circularity, and a decrease of roughness are more enhanced.

[Component (A2)]

The resist composition of the present invention may contain, as the component (A), a base material component whose polarity increases by the action of an acid, which does not fall under the definition of the component (A1) (this base material component will be hereinafter referred to as "component (A2)").

The component (A2) is not particularly limited, and it may be optionally selected and used among a large number of materials which have hitherto been known as the base material components for the chemically amplified resist compositions (for example, base resins for ArF excimer laser, for KrF excimer laser (preferably for ArF excimer layer), or the like). Examples of the base resin for ArF excimer laser include a resin having the constituent unit (a1) as an essential constituent unit and further optionally having the constituent units (a2) to (a4).

The component (A2) may be used solely or in combination of two or more kinds thereof.

In the resist composition of the present invention, the component (A) may be used solely or in combination of two or more kinds thereof.

In the resist composition of the present invention, the content of the component (A) may be adjusted in conformity with the thickness of the resist film to be formed, or the like.

<Acid Generator Component; Component (B)>

It is preferable that the resist composition of the present invention contains an acid generator component (B) which generates an acid upon exposure (hereinafter referred to as "component (B)"). The component (B) is not particularly limited, and those which have been so far proposed as the acid generator for a chemically amplified resist can be used.

As such an acid generator, a variety of materials are known, and examples thereof include an onium salt-based acid generator such as an iodonium salt and a sulfonium salt; an oxime sulfonate-based acid generator; a diazomethane-based acid generator such as a bisalkyl or bisaryl sulfonyl diazomethane and a poly(bissulfonyl)diazomethane; a nitrobenzylsulfonate-based acid generator; an iminosulfonate-based acid generator; and a disulfone-based acid generator. Above all, it is preferable to use an onium salt-based acid generator.

As the onium salt-based acid generator, for example, a compound represented by the following general formula (b-1) (hereinafter also referred to as "component (b-1)"), a compound represented by the following general formula (b-2) (hereinafter also referred to as "component (b-2)"), or a compound represented by the following general formula (b-3) (hereinafter also referred to as "component (b-3)") can be used.

(Chemical formula 31)

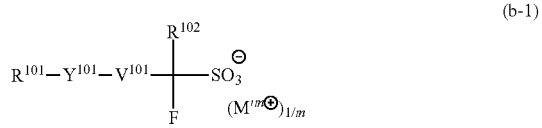

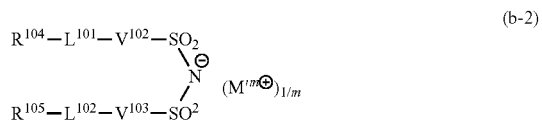

In the formulae, each of $R^{101}$ and $R^{104}$ to $R^{108}$ independently represents a cyclic group which may have a substituent, a chain alkyl group which may have a substituent, or a chain alkenyl group which may have a substituent; $R^{104}$ and $R^{105}$ may be bonded to each other to form a ring; any two of $R^{106}$ to $R^{107}$ may be bonded to each other to form a ring; $R^{102}$ represents a fluorine atom or a fluorinated alkyl group having 1 to 5 carbon atoms; $Y^{101}$ represents a single bond or a divalent linking group containing an oxygen atom; each of $V^{101}$ to $V^{103}$ independently represents a single bond, an alkylene group, or a fluorinated alkylene group; each of $L^{101}$ to $L^{102}$ independently represents a single bond or an oxygen atom; each of $L^{103}$ to $L^{105}$ independently represents a single bond, —CO—, or —SO$_2$—; and $M'^{m+}$ represents an m-valent organic cation (exclusive of a cation in the compound of the formula (b1-1)).

{Anion Moiety}

Anion Moiety of the Component (b-1):

In the formula (b-1), $R^{101}$ represents a cyclic group which may have a substituent, a chain alkyl group which may have a substituent, or a chain alkenyl group which may have a substituent.

(Cyclic Group which May have a Substituent)

The cyclic group is preferably a cyclic hydrocarbon group, and the cyclic hydrocarbon group may be either an aromatic hydrocarbon group or an aliphatic hydrocarbon group.

Examples of the aromatic hydrocarbon group represented by $R^{101}$ include an aromatic hydrocarbon ring exemplified above as the divalent aromatic hydrocarbon group for Va$^1$ in the formula (a1-1), and an aryl group in which one hydrogen atom is eliminated from an aromatic compound containing two or more aromatic rings. Of these, a phenyl group or a naphthyl group is preferable.

Examples of the cyclic aliphatic hydrocarbon group represented by $R^{101}$ include a group in which one hydrogen atom is eliminated from the monocycloalkane or polycycloalkane exemplified above as the divalent aliphatic hydrocarbon group for Va$^1$ in the formula (a1-1). Of these, an adamantyl group or a norbornyl group is preferable.

In addition, the cyclic hydrocarbon group represented by $R^{101}$ may contain a hetero atom as in a heterocyclic ring or the like. Specifically, examples thereof include the lactone-containing cyclic groups represented by the general formulae (a2-r-1) to (a2-r-7), respectively and the —SO$_2$—-containing cyclic groups represented by the general formulae (a5-r-1) to (a5-r-4), respectively, and besides, heterocyclic groups as described below.

(Chemical formula 32)

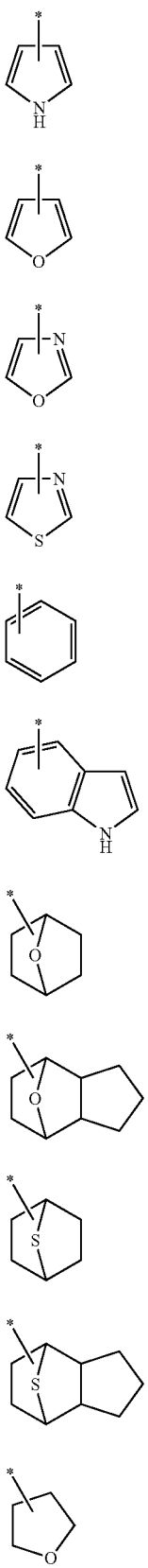

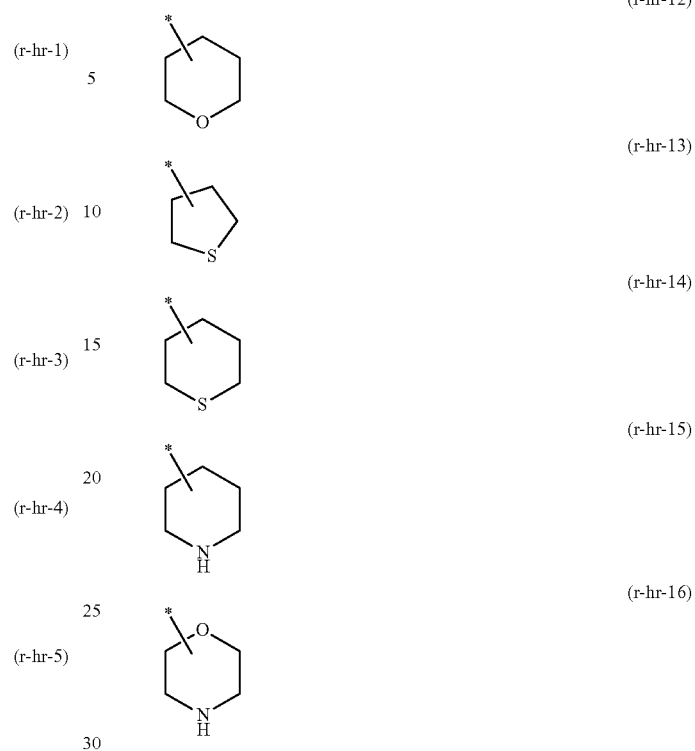

Examples of the substituent in the cyclic hydrocarbon group represented by $R^{101}$ include an alkyl group, an alkoxy group, a halogen atom, a halogenated alkyl group, a hydroxyl group, a carbonyl group, and a nitro group.

The alkyl group as the substituent is preferably an alkyl group having 1 to 5 carbon atoms, and most preferably a methyl group, an ethyl group, a propyl group, an n-butyl group, or a tert-butyl group.

The alkoxy group as the substituent is preferably an alkoxy group having 1 to 5 carbon atoms, more preferably a methoxy group, an ethoxy group, an n-propoxy group, an isopropoxy group, an n-butoxy group, or a tert-butoxy group, and most preferably a methoxy group or an ethoxy group.

Examples of the halogen atom as the substituent include a fluorine atom, a chlorine atom, a bromine atom, and an iodine atom, with a fluorine atom being preferable.

Examples of the halogenated alkyl group as the substituent include a group in which a part or all of the hydrogen atoms of an alkyl group having 1 to 5 carbon atoms, for example, a methyl group, an ethyl group, a propyl group, an n-butyl group, or a tert-butyl group, is substituted with the above-described halogen atom.

(Chain Alkyl Group which May have a Substituent)

The chain alkyl group represented by $R^{101}$ may be either linear or branched.

The linear alkyl group has preferably 1 to 20 carbon atoms, more preferably 1 to 15 carbon atoms, and most preferably 1 to 10 carbon atoms. Specifically, examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an eicosyl group, a heneicosyl group, and a docosyl group.

The branched alkyl group has preferably 3 to 20 carbon atoms, more preferably 3 to 15 carbon atoms, and most preferably 3 to 10 carbon atoms. Specifically, examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

(Chain Alkenyl Group which May have a Substituent)

The chain alkenyl group represented by $R^{101}$ may be either linear or branched and has preferably 2 to 10 carbon atoms, more preferably 2 to 5 carbon atoms, still more preferably 2 to 4 carbon atoms, and especially preferably 3 carbon atoms. Examples of the linear alkenyl group include a vinyl group, a propenyl group (allyl group), and a butynyl group. Examples of the branched alkenyl group include a 1-methylpropenyl group and a 2-methylpropenyl group.

Of the foregoing, the chain alkenyl group is especially preferably a propenyl group.

Examples of the substituent in the chain alkyl group or alkenyl group represented by $R^{101}$ include an alkoxy group, a halogen atom, a halogenated alkyl group, a hydroxyl group, a carbonyl group, a nitro group, an amino group, and the above-described cyclic group in $R^{101}$.

Above all, $R^{101}$ is preferably a cyclic group which may have a substituent, and more preferably a cyclic hydrocarbon group which may have a substituent. More specifically, a phenyl group, a naphthyl group, a group in which one or more hydrogen atoms are eliminated from a polycycloalkane, the lactone-containing cyclic groups represented by the general formulae (a2-r-1) to (a2-r-7), respectively and the —$SO_2$—-containing cyclic groups represented by the general formulae (a5-r-1) to (a5-r-4), respectively, and the like are preferable.

In the formula (b-1), $Y^{101}$ represents a single bond or a divalent linking group containing an oxygen atom.

In the case where $Y^{101}$ is a divalent linking group containing an oxygen atom, $Y^{101}$ may contain an atom other than an oxygen atom. Examples of the atom other than an oxygen atom include a carbon atom, a hydrogen atom, a sulfur atom, and a nitrogen atom.

Examples of the divalent linking group containing an oxygen atom include a non-hydrocarbon-based oxygen atom-containing linking group such as an oxygen atom (ether bond: —O—), an ester bond (—C(C=O)—O—), an oxycarbonyl group (—O—C(C=O)—), an amide bond (—C(C=O)—NH—), a carbonyl group (—C(=O)—), and a carbonate bond (—O—C(=O)—O—); and a combination of the non-hydrocarbon-based oxygen atom-containing linking group with an alkylene group. A sulfonyl group (—$SO_2$—) may be further linked to the combination. Examples of the combination include linking groups represented by the following formulae (y-a1-1) to (y-a1-7), respectively.

(Chemical formula 33)

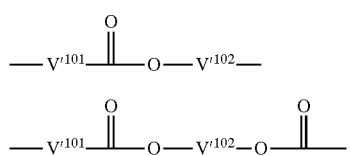

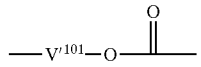

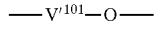

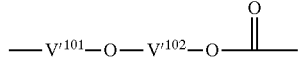

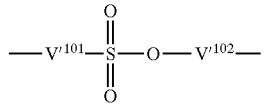

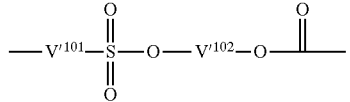

In the formulae, $V'^{101}$ represents a single bond or an alkylene group having 1 to 5 carbon atoms; and $V'^{102}$ represents a divalent saturated hydrocarbon group having 1 to 30 carbon atoms.

The divalent saturated hydrocarbon group represented by $V'^{102}$ preferably an alkylene group having 1 to 30 carbon atoms.

The alkylene group represented by $V'^{101}$ and $V'^{102}$ may be either a linear alkylene group or a branched alkylene group, and it is preferably a linear alkylene group.

Specifically, examples of the alkylene group represented by $V'^{101}$ and $V'^{102}$ include a methylene group [—$CH_2$—]; an alkylmethylene group such as —CH($CH_3$)—, —CH($CH_2CH_3$)—, —C($CH_3$)$_2$—, —C($CH_3$)($CH_2CH_3$)—, —C($CH_3$)($CH_2CH_2CH_3$)—, and —C($CH_2CH_3$)$_2$—; an ethylene group [—$CH_2CH_2$—]; an alkylethylene group such as —CH($CH_3$)$CH_2$—, —CH($CH_3$)CH($CH_3$)—, —C($CH_3$)$_2$$CH_2$—, and —CH($CH_2CH_3$)$CH_2$—; a trimethylene group (n-propylene group) [—$CH_2CH_2CH_2$—]; an alkyltrimethylene group such as —CH($CH_3$)$CH_2CH_2$— and —$CH_2$CH($CH_3$)$CH_2$—; a tetramethylene group [—$CH_2CH_2CH_2CH_2$—]; an alkyltetramethylene group such as —CH($CH_3$)$CH_2CH_2CH_2$— and —$CH_2$CH($CH_3$)$CH_2CH_2$—; and a pentamethylene group [—$CH_2CH_2CH_2CH_2CH_2$—].

In addition, a part of the methylene groups in the alkylene group represented by $V'^{101}$ and $V'^{102}$ may be substituted with a divalent aliphatic cyclic group having 5 to 10 carbon atoms. The aliphatic cyclic group is preferably a divalent group in which one hydrogen atom is further eliminated from the cyclic aliphatic hydrocarbon group represented by $Ra^{t3}$ in the formula (a1-r-1), and more preferably a cyclohexylene group, a 1,5-adamantylene group, or a 2,6-adamantylene group.

$Y^{101}$ is preferably a divalent linking group containing an ester bond or an ether bond, and those represented by the formulae (y-a1-1) to (y-a1-5) are preferable.

In the formula (b-1), $V^{101}$ represents a single bond, an alkylene group, or a fluorinated alkylene group. The alkylene group or the fluorinated alkylene group represented by $V^{101}$ preferably has 1 to 4 carbon atoms. Examples of the fluorinated alkylene group represented by $V^{101}$ include a group in which a part or all of the hydrogen atoms of the alkylene group represented by $V^{101}$ are substituted with a fluorine atom. Above all, $V^{101}$ is preferably a single bond or a fluorinated alkylene group having 1 to 4 carbon atoms.

In the formula (b-1), $R^{102}$ represents a fluorine atom or a fluorinated alkyl group having 1 to 5 carbon atoms. R'2 is preferably a fluorine atom or a perfluoroalkyl group having 1 to 5 carbon atoms, and more preferably a fluorine atom.

Specific examples of the anion moiety of the component (b-1) are as follows.

That is, in the case where $Y^{101}$ is a single bond, examples thereof include a fluorinated alkyl sulfonate anion such as a trifluoromethane sulfonate anion and a perfluorobutane sulfonate anion; and in the case where $Y^{101}$ is a divalent linking group containing an oxygen atom, examples thereof include an anion represented by any one of the following formulae (an-1) to (an-3).

(Chemical formula 34)

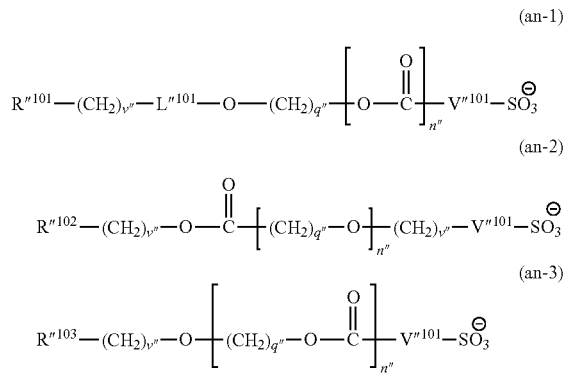

In the formulae, $R''^{101}$ represents an aliphatic cyclic group which may have a substituent, a group represented by any one of the formulae (r-hr-1) to (r-hr-6), or a chain alkyl group which may have a substituent; $R''^{102}$ represents an aliphatic cyclic group which may have a substituent, a lactone-containing cyclic group represented by any one of the formulae (a2-r-1) to (a2-r-7), or an —$SO_2$—-containing cyclic group represented by any one of the general formulae (a5-r-1) to (a5-r-4); $R''^{103}$ represents an aromatic cyclic group which may have a substituent, an aliphatic cyclic group which may have a substituent, or a chain alkenyl group which may have a substituent; $V''^{101}$ represents a fluorinated alkylene group; $L''^{101}$ represents —C(=O)— or —$SO_2$—; each V" is independently an integer of 0 to 3; each q" is independently an integer of 1 to 20; and n" is 0 or 1.

The aliphatic cyclic group which may have a substituent, as represented by $R''^{101}$, $R''^{102}$, and $R''^{103}$, is preferably the group exemplified above as the cyclic aliphatic hydrocarbon group represented by $R^{101}$. Examples of the substituent include the same substituents as those with which the cyclic aliphatic hydrocarbon group represented by $R^{101}$ may be substituted.

The aromatic cyclic group which may have a substituent, as represented by $R''^{133}$, is preferably the group exemplified above as the aromatic hydrocarbon group in the cyclic hydrocarbon group represented by $R^{101}$. Examples of the substituent include the same substituents as those with which the aromatic hydrocarbon group represented by $R^{101}$ may be substituted.

The chain alkyl group which may have a substituent, as represented by $R''^{101}$, is preferably the group exemplified above as the chain alkyl group represented by $R^{101}$. The chain alkenyl group which may have a substituent, as represented by $R''^{103}$, is preferably the group exemplified above as the chain alkenyl group represented by $R^{101}$. $V''^{101}$ is preferably a fluorinated alkylene group having 1 to 3 carbon atoms, and especially preferably —$CF_2$—, —$CF_2CF_2$—, —$CHFCF_2$—, —$CF(CF_3)CF_2$—, or —$CH(CF_3)CF_2$—.

Anion Moiety of the Component (b-2):

In the formula (b-2), each of $R^{104}$ and $R^{105}$ independently represents a cyclic group which may have a substituent, a chain alkyl group which may have a substituent, or a chain alkenyl group which may have a substituent, and examples of each of these groups include the same groups as those for $R^{101}$ in the formula (b-1). However, $R^{104}$ and $R^{105}$ may be bonded to each other to form a ring.

Each of $R^{104}$ and $R^{105}$ is preferably a chain alkyl group which may have a substituent, and more preferably a linear or branched alkyl group or a linear or branched fluorinated alkyl group.

The carbon number of the chain alkyl group is preferably 1 to 10, more preferably 1 to 7, and still more preferably 1 to 3. It is preferable that the carbon number of the chain alkyl group of each of $R^{104}$ and $R^{105}$ is small as far as possible within the foregoing range of the carbon number for a reason that the solubility in the resist solvent is satisfactory, or the like. In addition, in the chain alkyl group of each of $R^{104}$ and $R^{105}$, it is preferable that the number of hydrogen atoms which are substituted with a fluorine atom is large as far as possible because the intensity of the acid becomes strong, and the transparency to high energy light or electron beams of not more than 200 nm is enhanced. A proportion of the fluorine atom in the chain alkyl group, namely a fluorination ratio, is preferably 70 to 100%, and more preferably 90 to 100%. A perfluoroalkyl group in which all of the hydrogen atoms are substituted with a fluorine atom is the most preferable.

In the formula (b-2), each of $V^{102}$ and $V^{103}$ independently represents a single bond, an alkylene group, or a fluorinated alkylene group, and examples of each of these groups include the same groups as those for $V^{101}$ in the formula (b-1).

In the formula (b-2), each of $L^{101}$ to $L^{102}$ independently represents a single bond or an oxygen atom.

Anion Moiety of the Component (b-3):

In the formula (b-3), each of $R^{106}$ to $R^{108}$ independently represents a cyclic group which may have a substituent, a chain alkyl group which may have a substituent, or a chain alkenyl group which may have a substituent, and examples of each of these groups include the same groups as those for $R^{101}$ in the formula (b-1).

Each of $L^{103}$ to $L^{105}$ independently represents a single bond, —CO—, or —$SO_2$—.

{Cation Moiety}

In the formulae (b-1), (b-2), and (b-3), $M^{m+}$ represents an m-valent organic cation other than the cation in the compound of the formula (b1-1). Above all, $M^{m+}$ is preferably a sulfonium cation or an iodonium cation, and especially preferably a cation represented by any one of the following general formulae (ca-1) to (ca-4).

(Chemical formula 35)

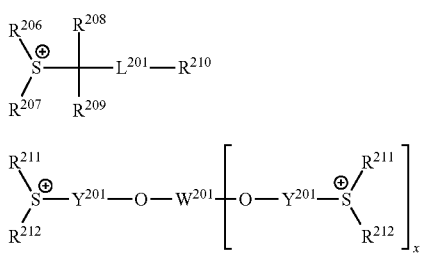

(ca-3)

(ca-4)

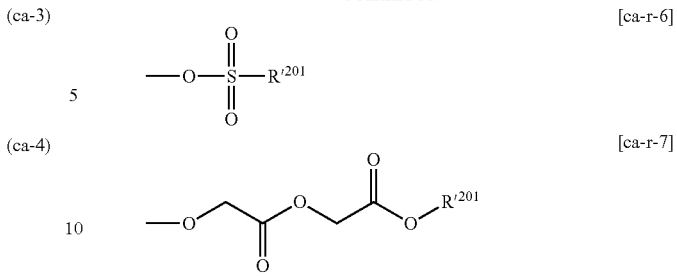

[ca-r-6]

[ca-r-7]

In the formulae, each of $R^{201}$ to $R^{207}$ and $R^{211}$ to $R^{212}$ independently represents an aryl group, an alkyl group, or an alkenyl group, each of which may have a substituent, and $R^{201}$ to $R^{203}$, $R^{206}$ to $R^{207}$, or $R^{211}$ to $R^{212}$ may be bonded to each other to form a ring together with the sulfur atom in the formula. Each of $R^{208}$ to $R^{209}$ independently represents a hydrogen atom or an alkyl group having 1 to 5 carbon atoms; $R^{210}$ represents an aryl group, an alkyl group, an alkenyl group, or an —$SO_2$—-containing cyclic group, each of which may have a substituent; $L^{201}$ represents —C(=O)— or —C(=O)—O—; each $Y^{201}$ independently represents an arylene group, an alkylene group, or an alkenylene group; x is 1 or 2; and $W^{201}$ represents an (x+1)-valent linking group.

Examples of the aryl group represented by $R^{201}$ to $R^{207}$ and $R^{211}$ to $R^{212}$ include an unsubstituted aryl group having 6 to 20 carbon atoms, and a phenyl group or a naphthyl group is preferable.

The alkyl group represented by $R^{201}$ to $R^{207}$ and $R^{211}$ to $R^{212}$ is a chain or cyclic alkyl group, and preferably a chain or cyclic alkyl group having 1 to 30 carbon atoms.

The alkenyl group represented by $R^{201}$ to $R^{207}$ and $R^{211}$ to $R^{212}$ is preferably an alkenyl group having 2 to 10 carbon atoms.

Examples of the substituent which each of $R^{201}$ to $R^{207}$ and $R^{210}$ to $R^{212}$ may have include an alkyl group, a halogen atom, a halogenated alkyl group, a carbonyl group, a cyano group, an amino group, an aryl group, an arylthio group, and a substituent represented by any one of the formulae (ca-r-1) to (ca-r-7).

The aryl group in the arylthio group as the substituent is the same as that exemplified for $R^{101}$, and specifically, examples thereof include a phenylthio group and a biphenylthio group.

(Chemical formula 36)

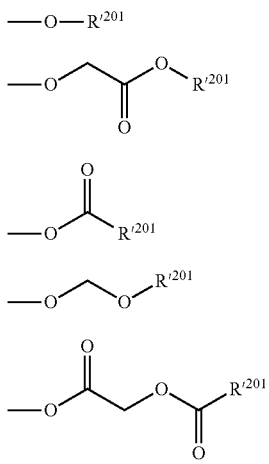

[ca-r-1]

[ca-r-2]

[ca-r-3]

[ca-r-4]

[ca-r-5]

In the formulae, each $R'^{201}$ independently represents a hydrogen atom, a cyclic group which may have a substituent, a chain alkyl group which may have a substituent, or a chain alkenyl group which may have a substituent.

Examples of the cyclic group which may have a substituent, the chain alkyl group which may have a substituent, or the chain alkenyl group which may have a substituent, as represented by $R'^{201}$, include the same groups as those for $R^{101}$ in the formula (b-1). Besides, examples of the cyclic group which may have a substituent, or the chain alkyl group which may have a substituent, include the same group as the acid dissociable group represented by the formula (a1-r-2).

In the case where $R^{201}$ to $R^{203}$, $R^{206}$ to $R^{207}$, or $R^{211}$ to $R^{212}$ are bonded to each other to form a ring together with the sulfur atom in the formula, they may be bonded via a hetero atom such as a sulfur atom, an oxygen atom, and a nitrogen atom, or a functional group such as a carbonyl group, —SO—, —$SO_2$—, —$SO_3$—, —COO—, —CONH—, and —N($R_N$)— ($R_N$ represents an alkyl group having 1 to 5 carbon atoms). As the ring to be formed, one ring containing the sulfur atom in the formula in a ring skeleton thereof is preferably a 3-membered to 10-membered ring, and especially preferably a 5-membered to 7-membered ring, each including the sulfur atom. Specific examples of the ring to be formed include a thiophene ring, a thiazole ring, a benzothiophene ring, a thianthrene ring, a dibenzothiophene ring, a 9H-thioxanthene ring, a thioxanthone ring, a phenoxathine ring, a tetrahydrothiophenium ring, and a tetrahydrothiopyranium ring.

Each of $R^{208}$ to $R^{209}$ independently represents a hydrogen atom or an alkyl group having 1 to 5 carbon atoms, and preferably a hydrogen atom or an alkyl group having 1 to 3 carbon atoms, and in the case of an alkyl group, $R^{208}$ to $R^{209}$ may be bonded to each other to form a ring.

$R^{210}$ represents an aryl group which may have a substituent, an alkyl group which may have a substituent, an alkenyl group which may have a substituent, or an —$SO_2$—-containing cyclic group which may have a substituent.

Examples of the aryl group represented by $R^{210}$ include an unsubstituted aryl group having 6 to 20 carbon atoms, and a phenyl group or a naphthyl group is preferable.

The alkyl group represented by $R^{210}$ is a chain or cyclic alkyl group, and preferably a chain or cyclic alkyl group having 1 to 30 carbon atoms.

The alkenyl group represented by $R^{210}$ is preferably an alkenyl group having 2 to 10 carbon atoms.

Examples of the —$SO_2$—-containing cyclic group which may have a substituent, as represented by $R^{210}$, include the same groups as those of the "—$SO_2$—-containing cyclic group" represented by $Ra^{21}$ in the general formula (a2-1), and the group represented by the general formula (a5-r-1) is preferable.

Each $Y^{201}$ independently represents an arylene group, an alkylene group, or an alkenylene group.

Examples of the arylene group represented by $Y^{201}$ include a group in which one hydrogen atom is eliminated from the aryl group exemplified as the aromatic hydrocarbon group represented by $R^{101}$ in the formula (b-1).

Examples of the alkylene group and the alkenylene group represented by $Y^{201}$ include the same aliphatic hydrocarbon groups as those as the divalent hydrocarbon group represented by $Va^1$ in the general formula (a1-1).

In the formula (ca-4), x is 1 or 2.

$W^{201}$ represents an (x+1)-valent (namely divalent or trivalent) linking group.

The divalent linking group represented by $W^{201}$ is preferably a divalent hydrocarbon group which may have a substituent, and examples thereof include the same hydrocarbon groups as those for $Ya^{21}$ in the general formula (a2-1). The divalent linking group represented by $W^{201}$ may be linear, branched, or cyclic, and it is preferably cyclic. Above all, a group in which a carbonyl group is combined with each of the both terminals of an arylene group is preferable. Examples of the arylene group include a phenylene group and a naphthylene group, with a phenylene group being especially preferable.

Examples of the trivalent linking group represented by $W^{201}$ include a group in which one hydrogen atom is eliminated from the above-described divalent linking group represented by $W^{201}$; and a group in which the above-described divalent linking group is further bonded to the above-described divalent linking group. The trivalent linking group represented by $W^{201}$ is preferably a group in which two carbonyl groups are bonded to an arylene group.

Specifically, suitable examples of the cation represented by the formula (ca-1) include cations represented by the following formulae (ca-1-1) to (ca-1-63), respectively.

(Chemical formula 37)

(ca-1-1)

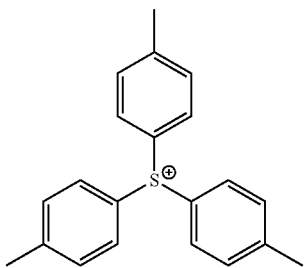

(ca-1-2)

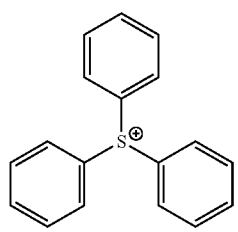

(ca-1-3)

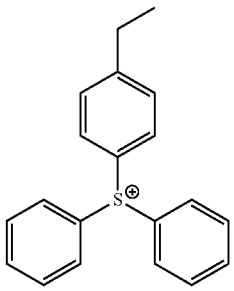

(ca-1-4)

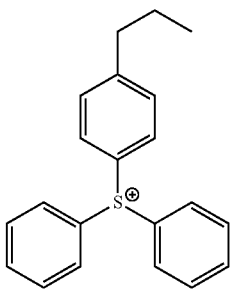

(ca-1-5)

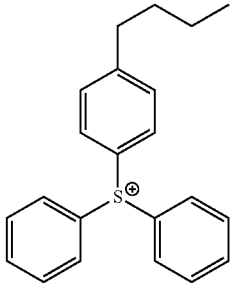

(ca-1-6)

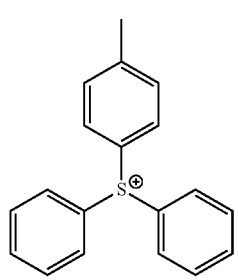

(ca-1-7)

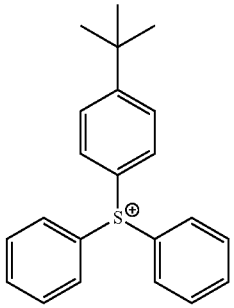

(ca-1-8)
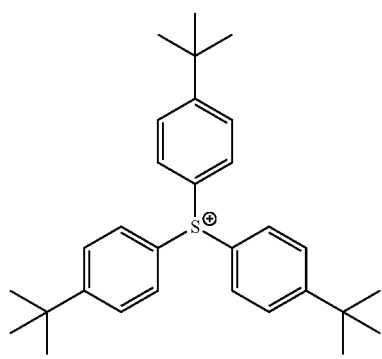
(ca-1-9)
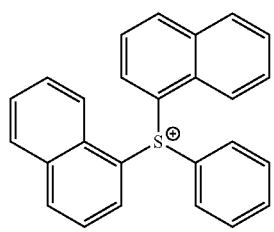
(ca-1-10)
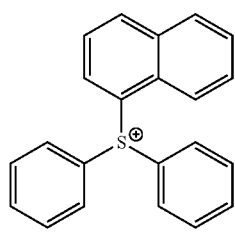
(ca-1-11)
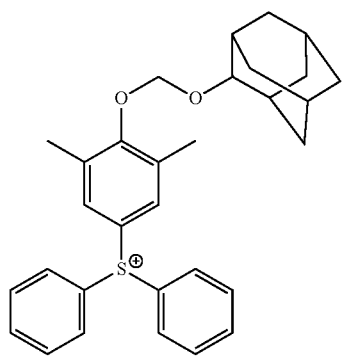
(ca-1-12)
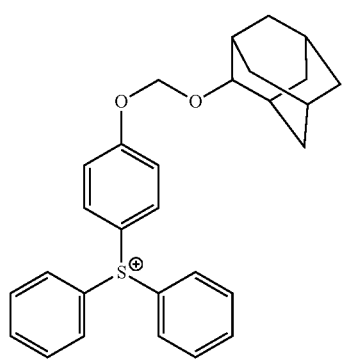
(ca-1-13)
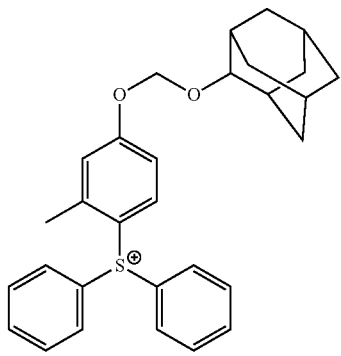
(ca-1-14)
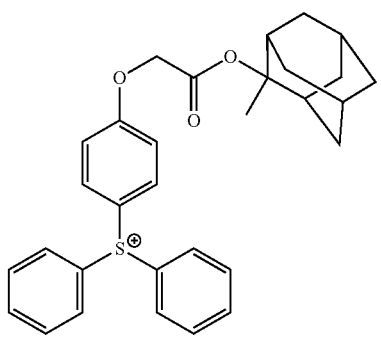
(ca-1-15)
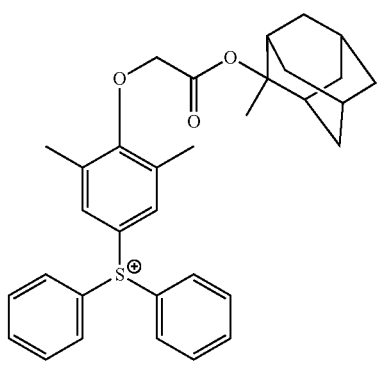
(ca-1-16)

(Chemical formula 38)
(ca-1-17)
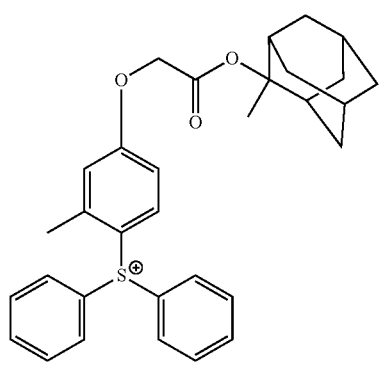
(ca-1-18)
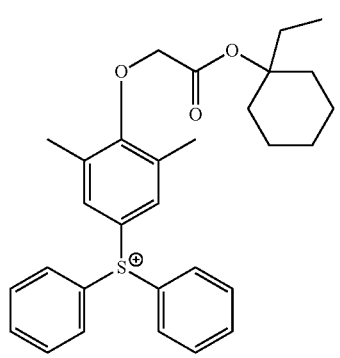
(ca-1-19)
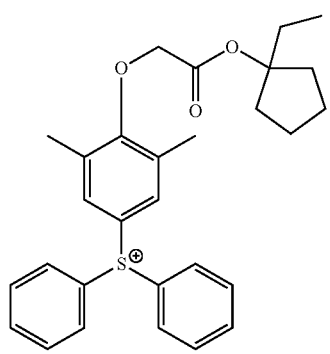
(ca-1-20)
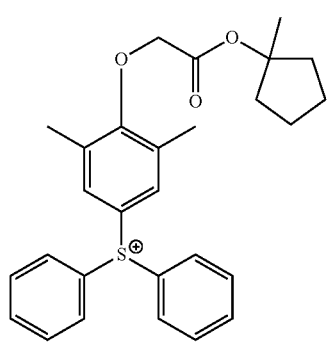
(ca-1-21)
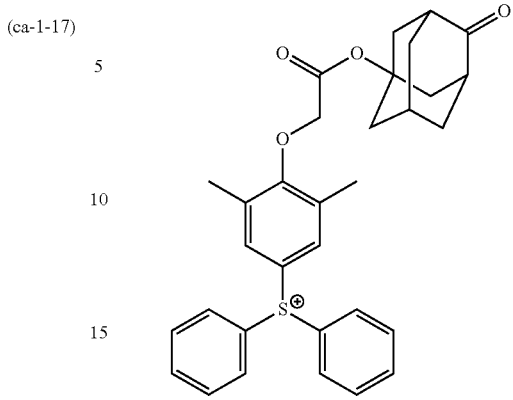
(ca-1-22)
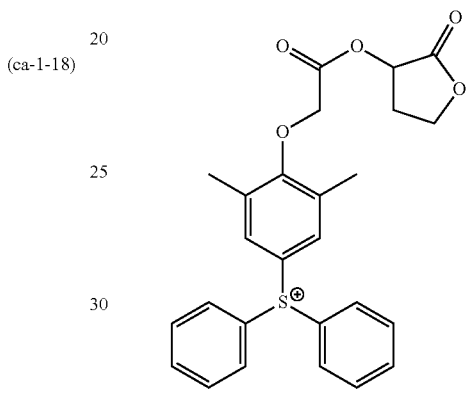
(ca-1-23)
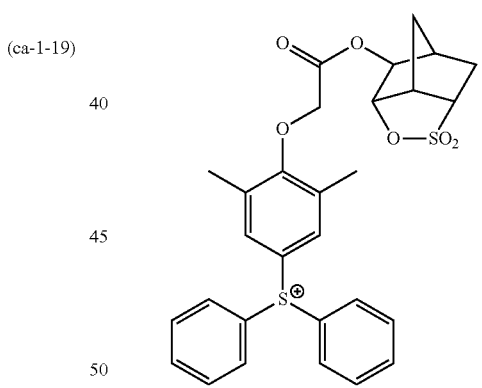
(ca-1-24)
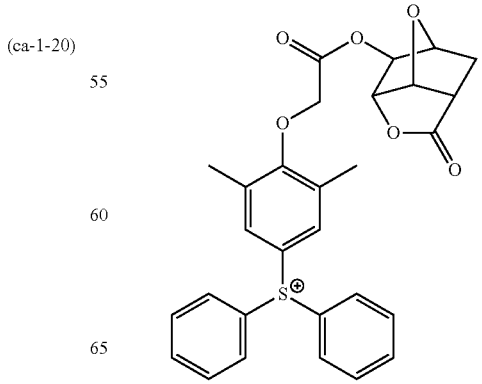

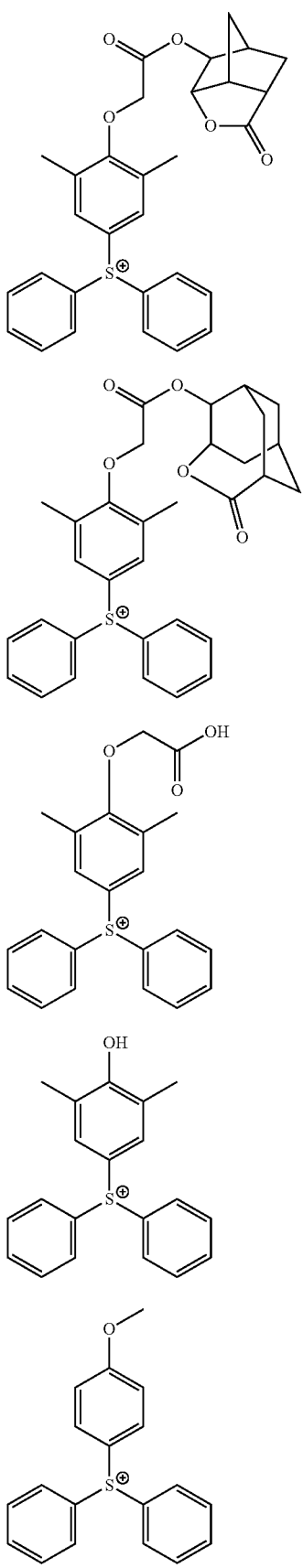
(ca-1-25)
(ca-1-26)
(ca-1-27)
(ca-1-28)
(ca-1-29)
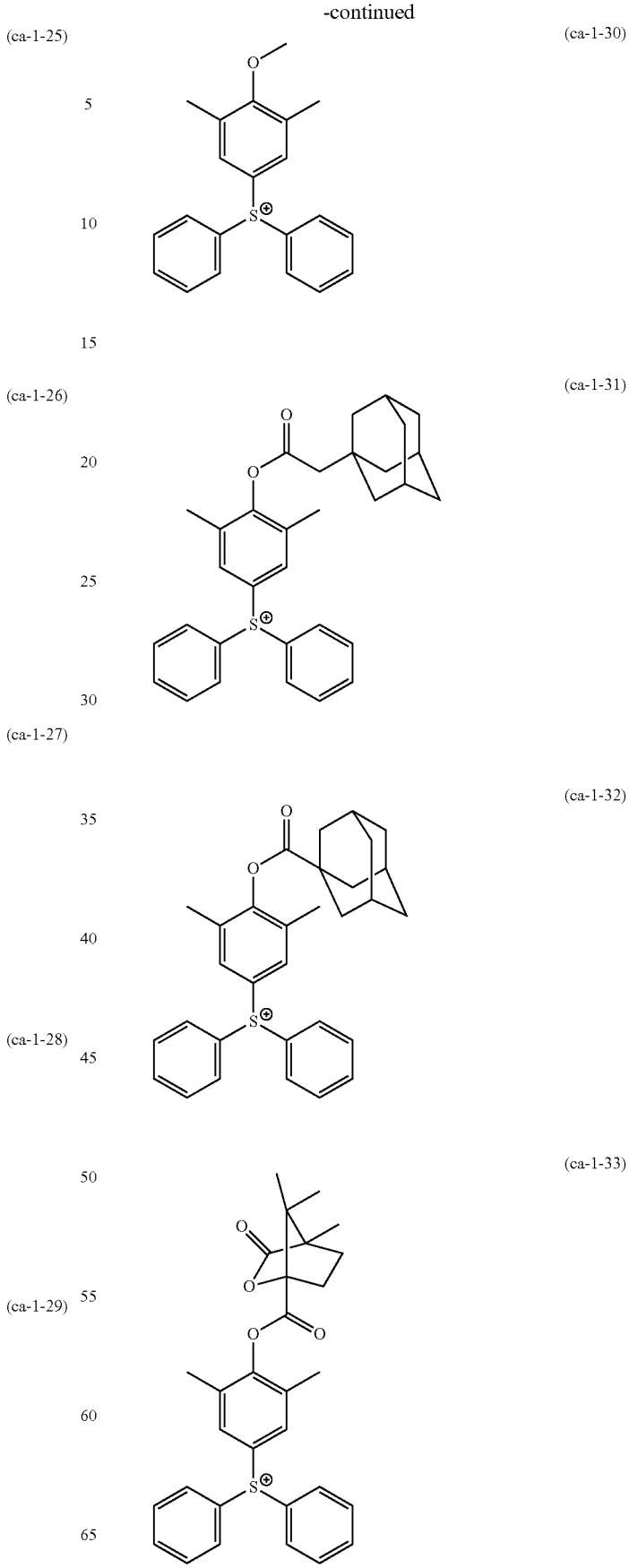
(ca-1-30)
(ca-1-31)
(ca-1-32)
(ca-1-33)

(Chemical formula 39)
(ca-1-34)
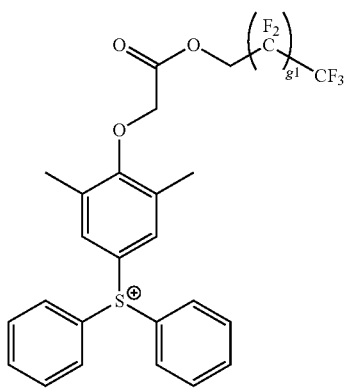
(ca-1-35)
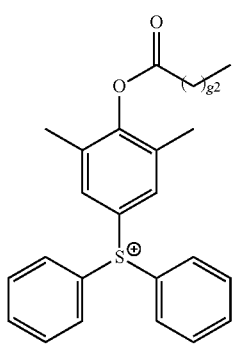
(ca-1-36)
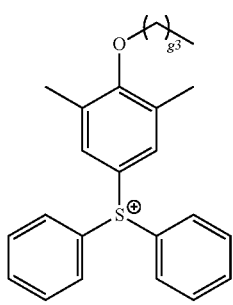
(ca-1-37)
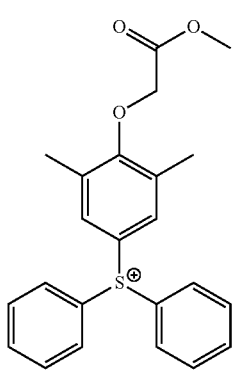
(ca-1-38)
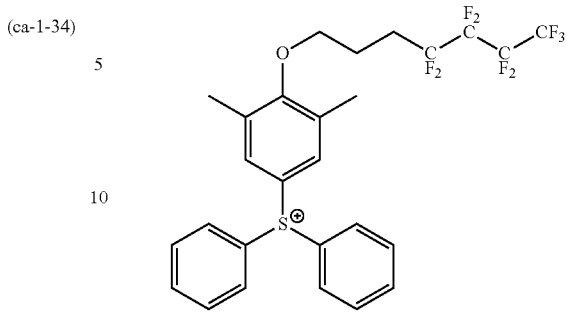
(ca-1-39)
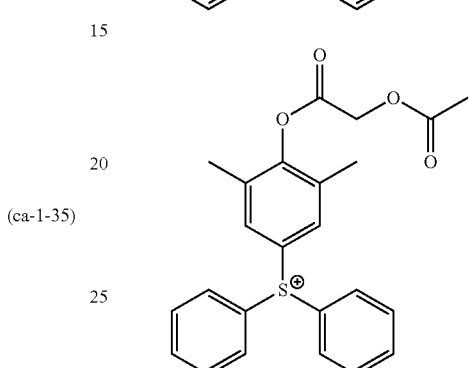
(ca-1-40)
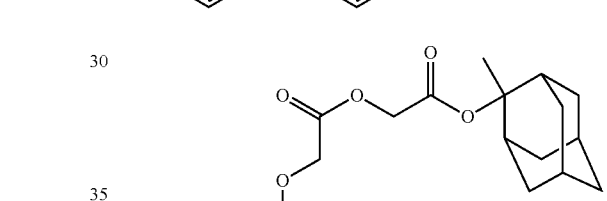
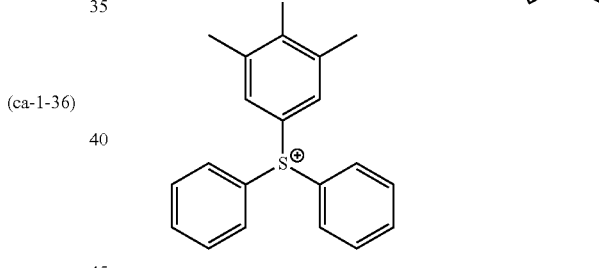
(ca-1-41)
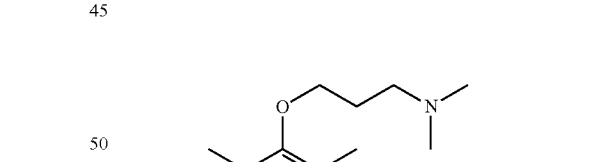
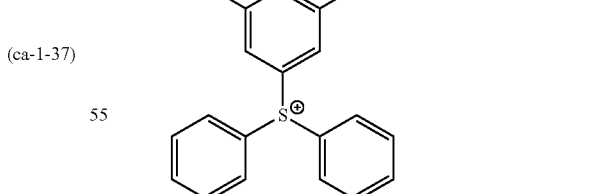
(ca-1-42)
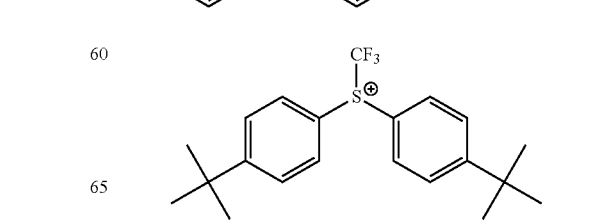

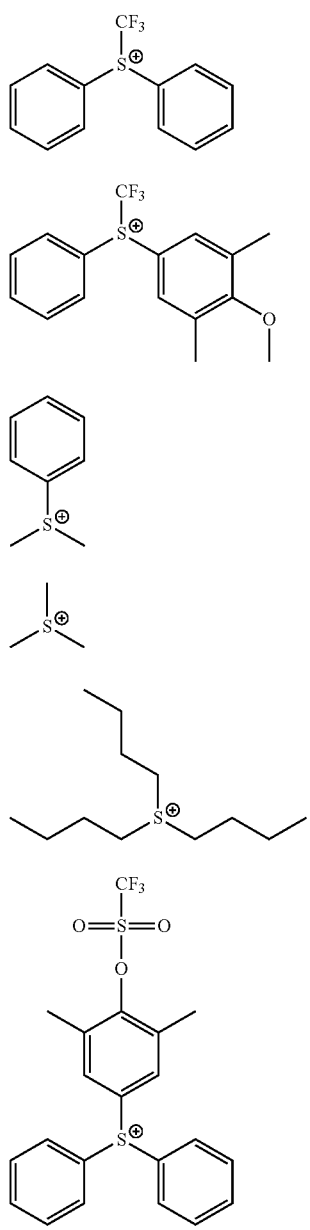
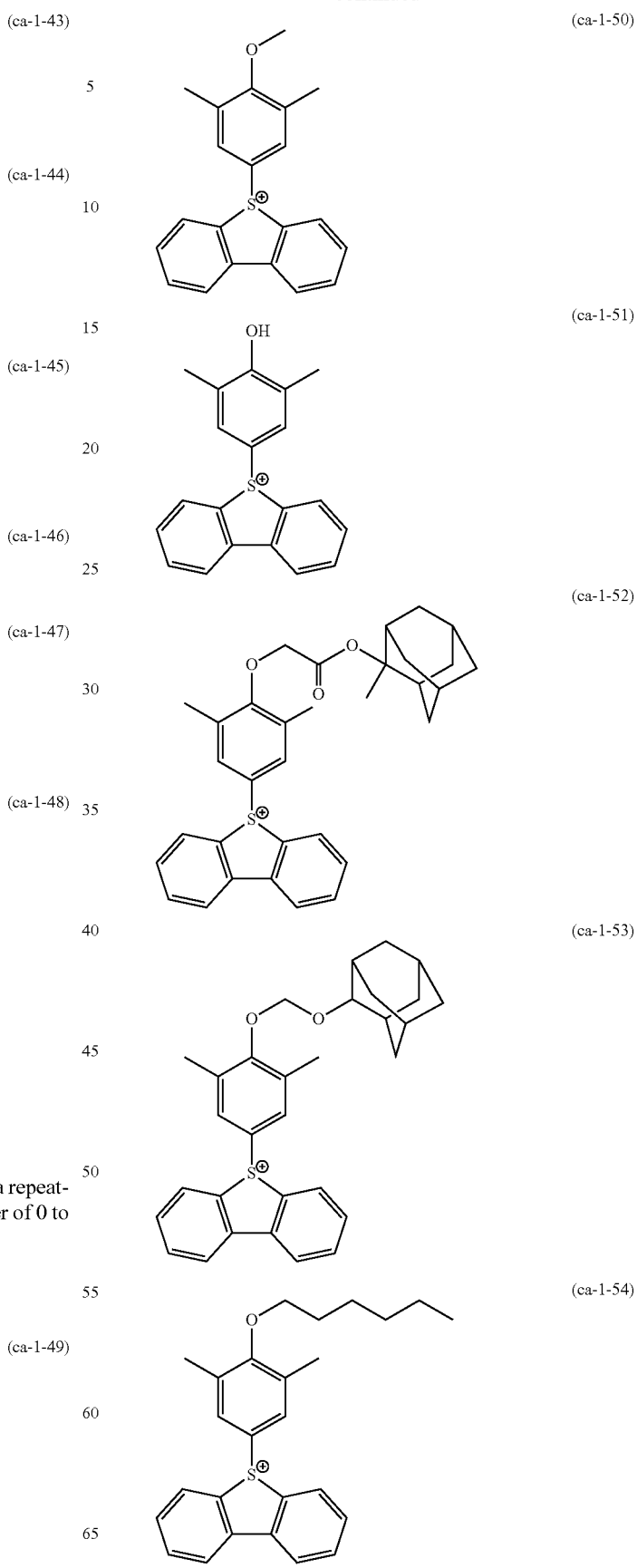
In the formulae, each of g1, g2, and g3 represents a repeating number; g1 is an integer of 1 to 5; g2 is an integer of 0 to 20; and g3 is an integer of 0 to 20.
(Chemical formula 40)
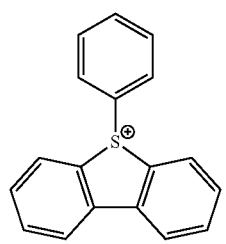

(ca-1-55)
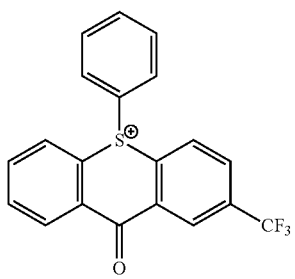
(ca-1-56)
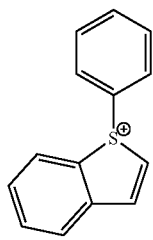
(ca-1-57)
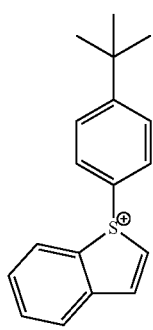
(ca-1-58)
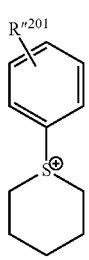
(ca-1-59)
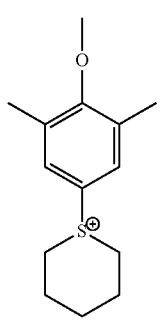
(ca-1-60)
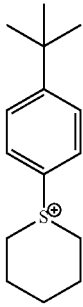
(ca-1-61)
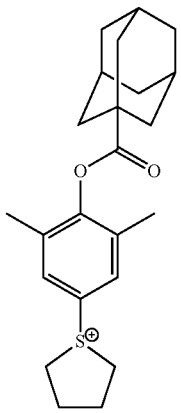
(ca-1-62)
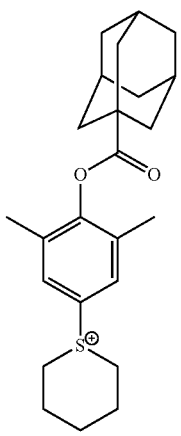
(ca-1-63)
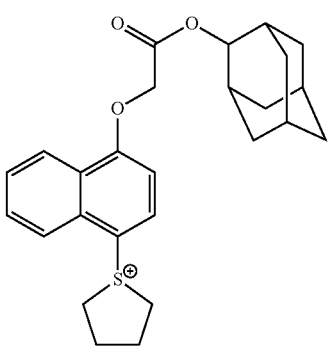
In the formulae, $R''^{201}$ represents a hydrogen atom or a substituent, and examples of the substituent include the same groups as those exemplified above for the substituent which each of $R^{201}$ to $R^{207}$ and $R^{210}$ to $R^{212}$ may have.

Specifically, suitable examples of the cation represented by the formula (ca-3) include cations represented by the following formulae (ca-3-1) to (ca-3-6), respectively.

(Chemical formula 41)

(ca-3-1)
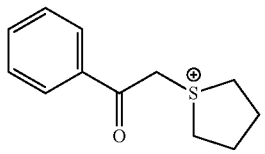

(ca-3-2)
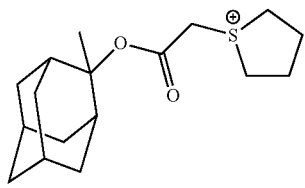

(ca-3-3)
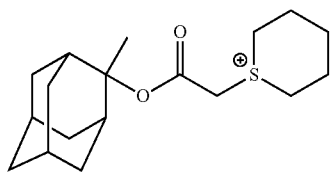

(ca-3-4)
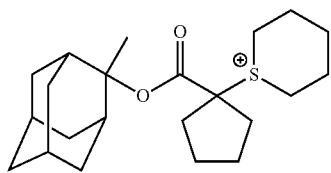

(ca-3-5)
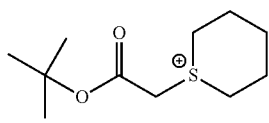

(ca-3-6)
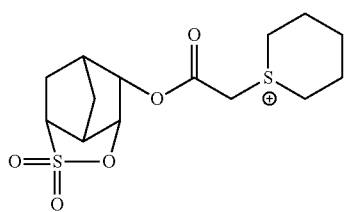

Specifically, suitable examples of the cation represented by the formula (ca-4) include cations represented by the following formulae (ca-4-1) to (ca-4-2), respectively.

(Chemical formula 42)

(ca-4-1)
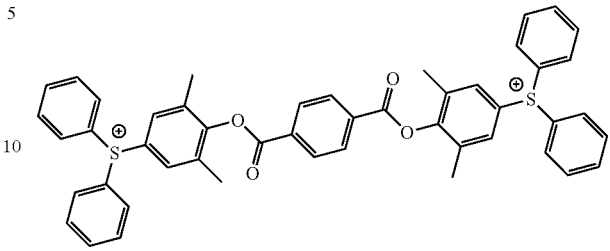

(ca-4-2)
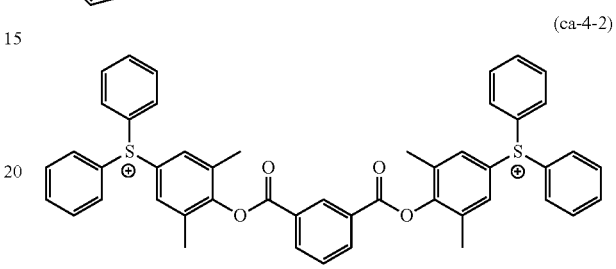

In the component (B), the acid generator may be used solely or in combination of two or more kinds thereof.

In the case where the resist composition of the present invention contains the component (B), the content of the component (B) is preferably 0.5 to 60 parts by mass, more preferably 1 to 50 parts by mass, and still more preferably 1 to 40 parts by mass based on 100 parts by mass of the component (A). When the content of the component (B) falls within the foregoing range, the pattern formation is sufficiently conducted. In addition, such is preferable because on the occasion of dissolving the respective components of the resist composition in an organic solvent, a uniform solution is obtained, and the storage stability becomes satisfactory.

<Basic Compound Component; Component (D)>

The resist composition of the present invention may also further contain an acid diffusion controlling agent (hereinafter sometimes referred to as "component (D)") in addition to the component (A), or in addition to the components (A) and (B).

The component (D) acts as a quencher (acid diffusion controlling agent) which traps the acid generated from the component (B) or the like upon exposure.

The component (D) in the present invention may be a photodegradable base (D1) (hereinafter referred to as "component (D1)") which is decomposed upon exposure to lose acid diffusion controlling properties, or may be a nitrogen-containing organic compound (D2) (hereinafter referred to as "component (D2)") which does not fall under the definition of the component (D1).

[Component (D1)]

When a resist composition containing the component (D1) is formed, on the occasion of forming a resist pattern, a contrast between the exposed areas and the unexposed areas can be enhanced.

Though the component (D1) is not particularly limited so long as it is decomposed upon exposure to lose acid diffusion controlling properties, the component (D1) is preferably at least one compound selected from the group consisting of a compound represented by the following general formula (d1-1) (hereinafter referred to as "component (d1-1)"), a compound represented by the following general formula (d1-2) (hereinafter referred to as "component (d1-2)"), and a compound represented by the following general formula (d1-3) (hereinafter referred to as "component (d1-3)").

Each of the components (d1-1) to (d1-3) does not act as a quencher in exposed areas because it is decomposed to lose acid diffusion controlling properties (basicity) but acts as a quencher in unexposed areas.

(Chemical formula 43)

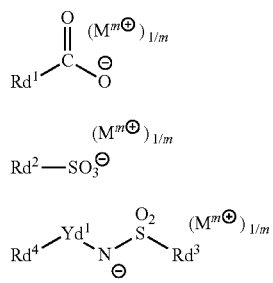

In the formulae, each of $Rd^1$ to $Rd^4$ represents a cyclic group which may have a substituent, a chain alkyl group which may have a substituent, or a chain alkenyl group which may have a substituent, provide that a fluorine atom is not bonded to the carbon atom adjacent to the S atom in $Rd^2$ in the formula (d1-2). $Yd^1$ represents a single bond or a divalent linking group. Each $M^{m+}$ independently represents an m-valent organic cation.

{Component (d1-1)}

Anion Moiety:

In the formula (d1-1), $Rd^1$ represents a cyclic group which may have a substituent, a chain alkyl group which may have a substituent, or a chain alkenyl group which may have a substituent, and examples thereof include the same groups as those in $R^{101}$.

Above all, $Rd^1$ is preferably an aromatic hydrocarbon group which may have a substituent, an aliphatic cyclic group which may have a substituent, or a chain hydrocarbon group which may have a substituent. The substituent which each of these groups may have is preferably a hydroxyl group, a fluorine atom, or a fluorinated alkyl group.

The aromatic hydrocarbon group is more preferably a phenyl group or a naphthyl group.

The aliphatic cyclic group is more preferably a group in which one or more hydrogen atoms are eliminated from a polycycloalkane such as adamantane, norbornane, isobornane, tricyclodecane, and tetracyclododecane.

The chain hydrocarbon group is preferably a chain alkyl group. The chain alkyl group is preferably a chain alkyl group having 1 to 10 carbon atoms. Specifically, examples thereof include a linear alkyl group such as a methyl group, an ethyl group, a propyl group, a butyl group, a pentyl group, a hexyl group, a heptyl group, an octyl group, a nonyl group, and a decyl group; and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

In the case where the chain alkyl group is a fluorinated alkyl group having, as a substituent, a fluorine atom or a fluorinated alkyl group, the carbon number of the fluorinated alkyl group is preferably 1 to 11, more preferably 1 to 8, and still more preferably 1 to 4. The fluorinated alkyl group may also contain an atom other than a fluorine atom. Examples of the atom other than a fluorine atom include an oxygen atom, a carbon atom, a hydrogen atom, a sulfur atom, and a nitrogen atom.

$Rd^1$ is preferably a fluorinated alkyl group in which a part or all of hydrogen atoms constituting a linear alkyl group are substituted with a fluorine atom, and more preferably a fluorinated alkyl group (linear perfluoroalkyl group) in which all of hydrogen atoms constituting a linear alkyl group are substituted with a fluorine atom.

Preferred specific examples of the anion moiety of the component (d1-1) are given below.

(Chemical formula 44)

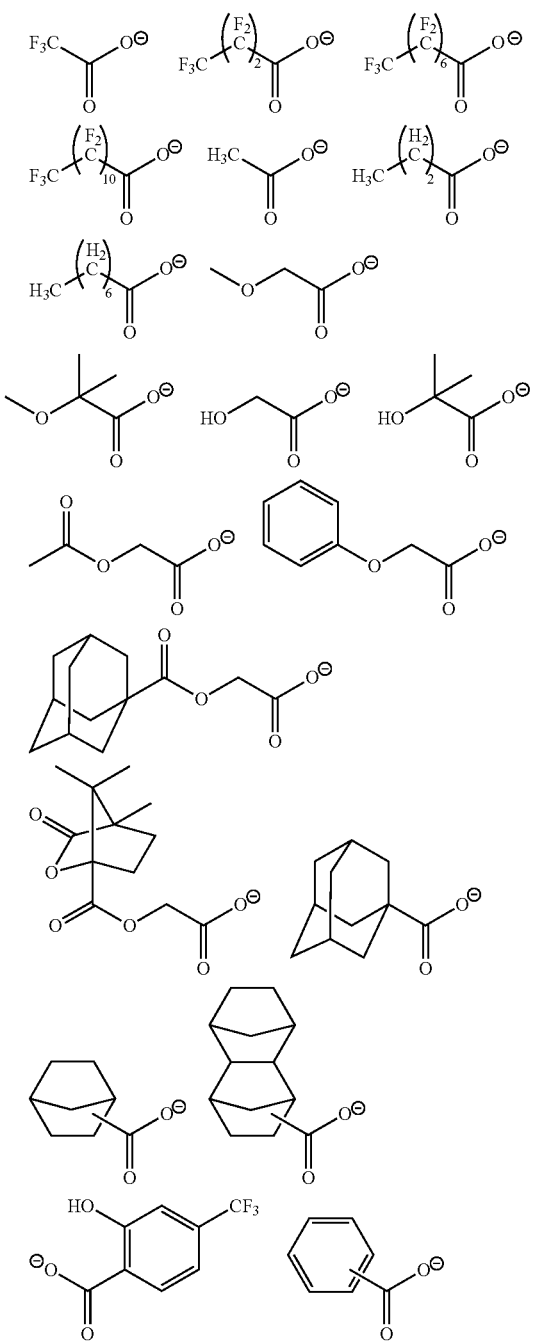

-continued

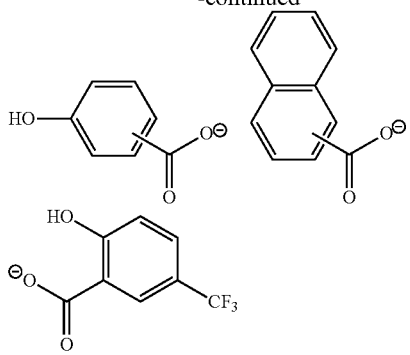

Cation Moiety:

In the formula (d1-1), $M^{m+}$ represents an m-valent organic cation.

Though the organic cation represented by $M^{m+}$ is not particularly limited, examples thereof include the same cations as those represented in the general formulae (ca-1) to (ca-4), respectively. Of these, cations represented by the formulae (ca-1-1) to (ca-1-63), respectively are preferable.

The component (d1-1) may be used solely or in combination of two or more kinds thereof.

{Component (d1-2)}

Anion Moiety:

In the component (d1-2), $Rd^2$ represents a cyclic group which may have a substituent, a chain alkyl group which may have a substituent, or a chain alkenyl group which may have a substituent, and examples thereof include the same groups as those in $R^{101}$.

However, a fluorine atom is not bonded to (not substituted on) the carbon atom adjacent to the S atom in $Rd^2$. According to this, the anion of the component (d1-2) becomes an appropriately weak acid anion, whereby the quenching ability of the component (D) is enhanced.

$Rd^2$ is preferably an aliphatic cyclic group which may have a substituent, and more preferably a group in which one or more hydrogen atoms are eliminated from adamantane, norbornane, isobornane, tricyclodecane, tetracyclododecane, or the like (the group may have a substituent), or a group in which one or more hydrogen atoms are eliminated from camphor or the like.

The hydrocarbon group represented by $Rd^2$ may have a substituent. Examples of the substituent include the same groups as those exemplified above for the substituent which the hydrocarbon group (aromatic hydrocarbon group or aliphatic hydrocarbon group) as represented by $Rd^1$ in the formula (d1-1) may have.

Preferred specific examples of the anion moiety of the component (d1-2) are given below.

(Chemical formula 45)

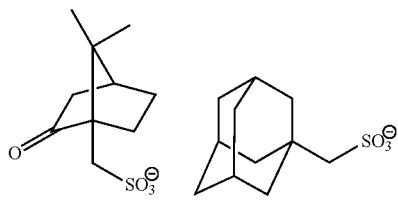

-continued

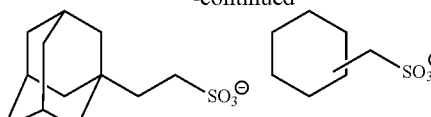
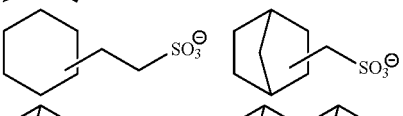
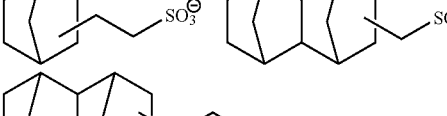
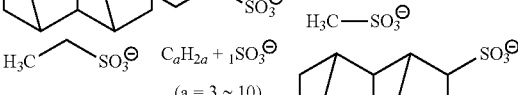
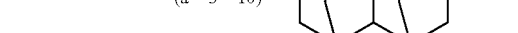

$(a = 3 \sim 10)$

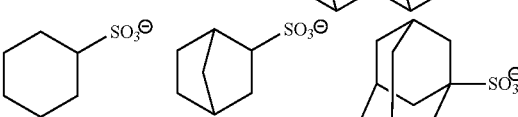
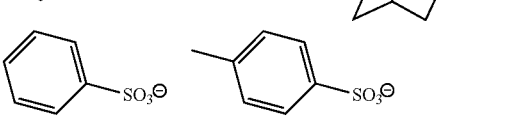

Cation Moiety:

In the formula (d1-2), $M^{m+}$ represents an m-valent organic cation and is the same as $M^{m+}$ in the formula (d1-1).

The component (d1-2) may be used solely or in combination of two or more kinds thereof.

{Component (d1-3)}

Anion Moiety:

In the formula (d1-3), $Rd^3$ represents a cyclic group which may have a substituent, a chain alkyl group which may have a substituent, or a chain alkenyl group which may have a substituent, and examples thereof include the same groups as those in $R^{101}$. $Rd^3$ is preferably a cyclic group, a chain alkyl group, or a chain alkenyl group each containing a fluorine atom. Above all, $Rd^3$ is preferably a fluorinated alkyl group, and more preferably the same fluorinated alkyl group as that represented by $Rd^1$.

In the formula (d1-3), $Rd^4$ represents a cyclic group which may have a substituent, a chain alkyl group which may have a substituent, or a chain alkenyl group which may have a substituent, and examples thereof include the same groups as those in $R^{101}$.

Above all, $Rd^4$ is preferably an alkyl group, an alkoxy group, an alkenyl group, or a cyclic group, each of which may have a substituent.

The alkyl group represented by $Rd^4$ is preferably a linear or branched alkyl group having 1 to 5 carbon atoms. Specifically, examples thereof include a methyl group, an ethyl group, a propyl group, an isopropyl group, an n-butyl group, an isobutyl group, a tert-butyl group, a pentyl group, an isopentyl group, and a neopentyl group. A part of the hydrogen atoms of the alkyl group represented by $Rd^4$ may be substituted with a hydroxyl group, a cyano group, or the like.

The alkoxy group represented by $Rd^4$ is preferably an alkoxy group having 1 to 5 carbon atoms. Specifically, examples of the alkoxy group having 1 to 5 carbon atoms include a methoxy group, an ethoxy group, an n-propoxy group, an isopropoxy group, an n-butoxy group, and a tert-butoxy group. Above all, a methoxy group or an ethoxy group is preferable.

Examples of the alkenyl group represented by $Rd^4$ include the same groups as those in $R^{101}$. Of these, a vinyl group, a propenyl group (allyl group), a 1-methylpropenyl group, and a 2-methylpropenyl group are preferable. Each of these groups may further have, as a substituent, an alkyl group having 1 to 5 carbon atoms or a halogenated alkyl group having 1 to 5 carbon atoms.

Examples of the cyclic group represented by $Rd^4$ include the same groups as those in $R^{101}$. Of these, an alicyclic group in which one or more hydrogen atoms are eliminated from a cycloalkane such as cyclopentane, cyclohexane, adamantane, norbornane, isobornane, tricyclodecane, and tetracyclododecane, or an aromatic group such as a phenyl group and a naphthyl group is preferable. In the case where $Rd^4$ is an alicyclic group, in view of the fact that the resist composition is satisfactorily dissolved in an organic solvent, the lithography properties become satisfactory. In addition, in the case where $Rd^4$ is an aromatic group, in the lithography using EUV or the like as an exposure light source, the resist composition exhibits excellent light absorption efficiency, and the sensitivity and lithography properties become satisfactory.

In the formula (d1-3), $Yd^4$ represents a single bond or a divalent linking group.

Though the divalent linking group represented by $Yd^4$ is not particularly limited, examples thereof include a divalent hydrocarbon group (aliphatic hydrocarbon group or aromatic hydrocarbon group) which may have a substituent and a divalent linking group containing a hetero atom. Examples of each of these groups include the same groups as those exemplified above in the explanation regarding the divalent linking group represented by $Ya^{21}$ in the formula (a2-1).

$Yd^1$ is preferably a carbonyl group, an ester bond, an amide bond, an alkylene group, or a combination thereof. The alkylene group is more preferably a linear or branched alkylene group, and still more preferably a methylene group or an ethylene group.

Preferred specific examples of the anion moiety of the component (d1-3) are given below.

(Chemical formula 46)

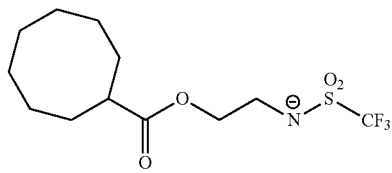

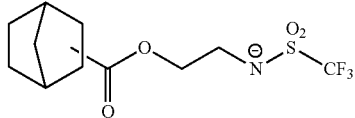

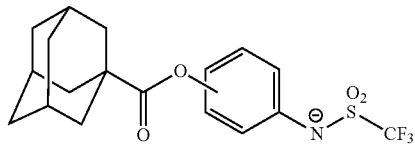

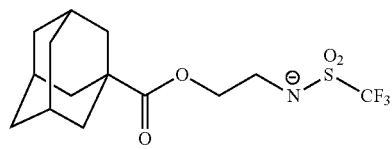

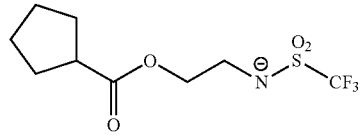

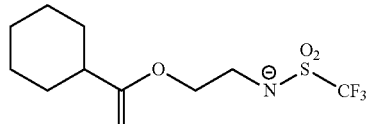

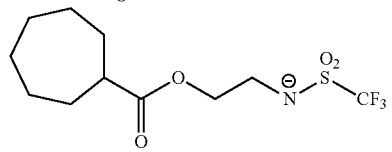

-continued

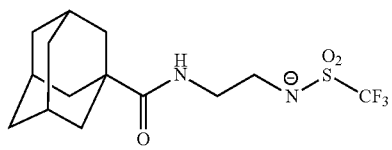

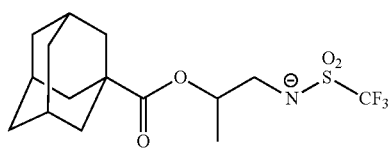

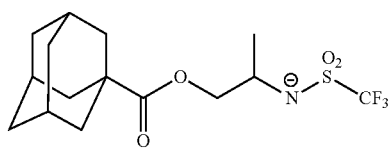

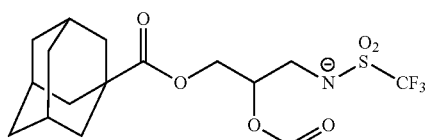

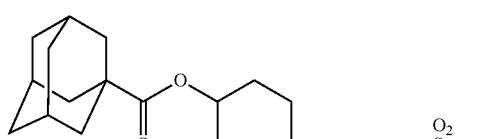

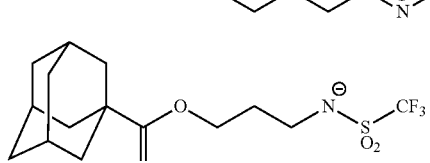

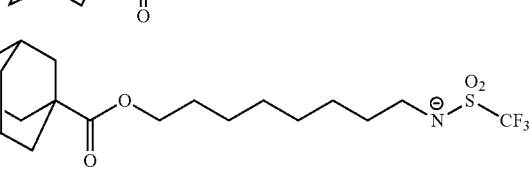

-continued

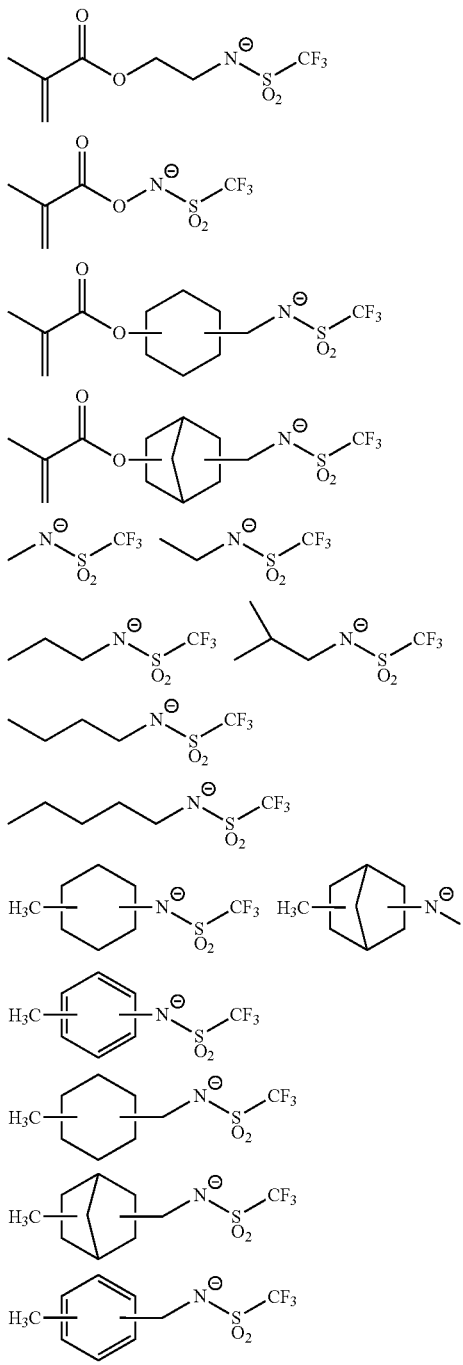

(Chemical formula 47)

-continued

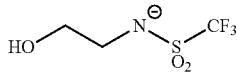

Cation Moiety:

In the formula (d1-3), $M^{m+}$ represents an m-valent organic cation and is the same as $M^{m+}$ in the formula (d1-1).

The component (d1-3) may be used solely or in combination of two or more kinds thereof.

As the component (D1), any one kind of the components (d1-1) to (d1-3) may be used, or a combination of two or more kinds thereof may also be used.

The content of the component (D1) is preferably 0.5 to 10 parts by mass, more preferably 0.5 to 8 parts by mass, and still more preferably 1 to 8 parts by mass based on 100 parts by mass of the component (A).

When the content of the component (D1) is the preferred lower limit value or more, especially satisfactory lithography properties and resist pattern shape are obtained. On the other hand, when it is not more than the upper limit value, the sensitivity can be maintained at a satisfactory level, and the throughput becomes excellent.

The production method of each of the components (d1-1) and (d1-2) is not particularly limited, and the components (d1-1) and (d1-2) can be produced by conventional methods.

(Component (D2))

The component (D) may contain a nitrogen-containing organic compound component (hereinafter referred to as "component (D2)") which does not fall under the definition of the component (D1).

The component (D2) is not particularly limited so long as it is a compound which acts as an acid diffusion controlling agent and does not fall under the definition of the component (D1). As the component (D2), any of the conventionally known compounds may be selected for use. Above all, an aliphatic amine, particularly a secondary aliphatic amine or a tertiary aliphatic amine is preferable.

The term. "aliphatic amine" refers to an amine having one or more aliphatic groups, and the aliphatic group preferably has 1 to 12 carbon atoms.

Examples of the aliphatic amine include an amine in which at least one hydrogen atom of ammonia ($NH_3$) is substituted with an alkyl group or a hydroxyalkyl group each having not more than 12 carbon atoms (i.e., an alkylamine or an alkylalcoholamine), and a cyclic amine.

Specific examples of the alkylamine and the alkylalcoholamine include a monoalkylamine such as n-hexylamine, n-heptylamine, n-octylamine, n-nonylamine, and n-decylamine; a dialkylamine such as diethylamine, di-n-propylamine, di-n-heptylamine, di-n-octylamine, and dicyclohexylamine; a trialkylamine such as trimethylamine, triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, and tri-n-dodecylamine; and an alkylalcoholamine such as diethanolamine, triethanolamine, diisopropanolamine, triisopropanolamine, di-n-octanolamine, and tri-n-octanolamine. Of these, a trialkylamine having 5 to 10 carbon atoms is preferable, and tri-n-pentylamine or tri-n-octylamine is especially preferable.

Examples of the cyclic amine include a heterocyclic compound containing a nitrogen atom as a hetero atom. The heterocyclic compound may be either a monocyclic compound (aliphatic monocyclic amine) or a polycyclic compound (aliphatic polycyclic amine).

Specifically, examples of the aliphatic monocyclic amine include piperidine and piperazine.

The aliphatic polycyclic amine preferably has 6 to 10 carbon atoms. Specifically, examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amine include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, and triethanolamine triacetate, with triethanolamine triacetate being preferable.

In addition, an aromatic amine may also be used as the component (D2).

Examples of the aromatic amine include aniline, pyridine, 4-dimethylaminopyridine, pyrrole, indole, pyrazole, imidazole, and derivatives thereof; and also diphenylamine, triphenylamine, tribenzylamine, 2,6-diisopropylaniline, and N-tert-butoxycarbonylpyrrolidine.

The component (D2) may be used solely or in combination of two or more kinds thereof.

In general, the component (D2) is used in an amount in the range of 0.01 to 5.0 parts by mass based on 100 parts by mass of the component (A). When the amount of the component (D2) falls within the foregoing range, the resist pattern shape, the post-exposure temporal stability, and the like are enhanced.

The component (D) may be used solely or in combination of two or more kinds thereof. In the case where the resist composition of the present invention contains the component (D), the content of the component (D) is preferably 0.1 to 15 parts by mass, more preferably 0.3 to 12 parts by mass, and still more preferably 0.5 to 12 parts by mass based on 100 parts by mass of the component (A). When the content of the component (D) is the lower limit value of the foregoing range or more, on the occasion of forming a resist composition, the lithography properties such as LWR are more enhanced. In addition, a more satisfactory resist pattern shape is obtained. When the content of the component (D) is not more than the upper limit value of the foregoing range, the sensitivity can be maintained at a satisfactory level, and throughput becomes excellent.

<Optional Components>
[Component (E)]

For the purposes of preventing deterioration in sensitivity and enhancing the resist pattern shape, the post-exposure temporal stability, and the like, the resist composition of the present invention can contain, as an optional component, at least one compound (E) (hereafter referred to as "component (E)") selected from the group consisting of an organic carboxylic acid and a phosphorus oxo acid and a derivative thereof.

Suitable examples of the organic carboxylic acid include acetic acid, malonic acid, citric acid, malic acid, succinic acid, benzoic acid, and salicylic acid.

Examples of the phosphorus oxo acid include phosphoric acid, phosphonic acid, and phosphinic acid, with phosphonic acid being especially preferable.

Examples of the phosphorus oxo acid derivative include an ester in which a hydrogen atom of the above-described oxo acid is substituted with a hydrocarbon group. Examples of the hydrocarbon group include an alkyl group having 1 to 5 carbon atoms and an aryl group having 6 to 15 carbon atoms.

Examples of the phosphoric acid derivative include an phosphoric acid ester such as di-n-butyl phosphate and diphenyl phosphate.

Examples of the phosphonic acid derivative include a phosphonic acid ester such as dimethyl phosphonate, di-n-butyl phosphonate, phenylphosphonic acid, diphenyl phosphonate, and dibenzyl phosphonate.

Examples of the phosphinic acid derivative include a phosphinic acid ester and phenylphosphinic acid.

The component (E) may be used solely or in combination of two or more kinds thereof.

In general, the component (E) is used in an amount in the range of 0.01 to 5.0 parts by mass based on 100 parts by mass of the component (A).

[Component (F)]

For the purpose of imparting water repellency to the resist film, the resist composition of the present invention may contain a fluorine additive (hereinafter referred to as "component (F)").

As the component (F), fluorine-containing high-molecular weight compounds disclosed in, for example, JP-A-2010-002870, JP-A-2010-032994, JP-A-2010-277043, JP-A-2011-13569, and JP-A-2011-128226 can be used.

More specifically, examples of the compound (F) include a polymer having a constituent unit (f1) represented by the following formula (f1-1). The polymer is preferably a polymer (homopolymer) composed of only the constituent unit (f1) represented by the following formula (f1-1); a copolymer of the constituent unit (f1) represented by the following formula (f1-1) and the constituent unit (a1); or a copolymer of the constituent unit (f1) represented by the following formula (f1-1), a constituent unit derived from acrylic acid or methacrylic acid, and the constituent unit (a1). Here, the constituent unit (a1) which is copolymerized with the constituent unit (f1) represented by the following formula (f1-1) is preferably 1-ethyl-1-cyclooctyl(meth)acrylate or the constituent unit represented by the formula (a1-2-01).

(Chemical formula 48)

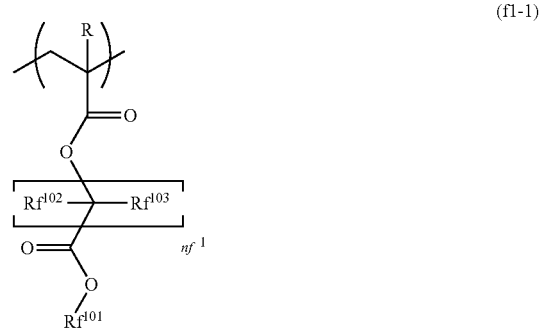

(f1-1)

In the formula, R is the same as that described above; each of $Rf^{102}$ and $Rf^{103}$ independently represents a hydrogen atom, a halogen atom, an alkyl group having 1 to 5 carbon atoms, or a halogenated alkyl group having 1 to 5 carbon atoms, and $Rf^{102}$ and $Rf^{103}$ may be the same as or different from each other; $nf^1$ is an integer of 1 to 5; and $Rf^{101}$ represents an organic group containing a fluorine atom.

In the formula (f1-1), R is the same as that described above. R is preferably a hydrogen atom or a methyl group.

In the formula (f1-1), examples of the halogen atom represented by $Rf^{102}$ and $Rf^{103}$ include a fluorine atom, a chlorine atom, a bromine atom, and an iodine atom, with a fluorine atom being especially preferable. Examples of the alkyl group having 1 to 5 carbon atoms, as represented by $Rf^{102}$ and $Rf^{103}$, include the same groups as those exemplified above for the alkyl group having 1 to 5 carbon atoms, as represented by R. Of these, a methyl group or an ethyl group is preferable. Specifically, examples of the halogenated alkyl group having 1 to 5 carbon atoms, as represented by $Rf^{102}$ and $Rf^{103}$, include a group in which a part or all of the hydrogen atoms of the above-described alkyl group having 1 to 5 carbon atoms are substituted with a halogen atom. Examples of the halogen atom include a fluorine atom, a chlorine atom, a bromine atom, and an iodine atom, with a fluorine atom being especially preferable. Above all, as $Rf^{102}$ and $Rf^{103}$, a hydrogen atom, a fluorine atom, or an alkyl group having 1 to 5 carbon atoms is preferable, and a hydrogen atom, a fluorine atom, a methyl group, or an ethyl group is more preferable.

In the formula (f1-1), $nf^1$ is an integer of 1 to 5, preferably an integer of 1 to 3, and more preferably 1 or 2.

In the formula (f1-1), $Rf^{101}$ represents an organic group containing a fluorine atom and is preferably a hydrocarbon group containing a fluorine atom.

The hydrocarbon group containing a fluorine atom may be linear, branched, or cyclic, and the carbon number thereof is preferably 1 to 20, more preferably 1 to 15, and especially preferably 1 to 10.

In addition, in the hydrocarbon group containing a fluorine atom, it is preferable that 25% or more of the hydrogen atoms in the hydrocarbon group are fluorinated; it is more preferable that 50% or more of the hydrogen atoms in the hydrocarbon group are fluorinated; and in view of the fact that the hydrophobicity of the resist film at the time of immersion exposure is increased, it is especially preferable that 60% or more of the hydrogen atoms in the hydrocarbon group are fluorinated.

Above all, $Rf^{101}$ is especially preferably a fluorinated hydrocarbon group having 1 to 5 carbon atoms, and most preferably a trifluoromethyl group, $—CH_2—CF_3$, $—CH_2—CF_2—CF_3$, $—CH(CF_3)_2$, $—CH_2—CH_2—CF_3$, or $—CH_2—CH_2—CF_2—CF_2—CF_3$.

A weight average molecular weight (Mw) (as reduced into standard polystyrene by means of gel permeation chromatography) of the component (F) is preferably 1,000 to 50,000, more preferably 5,000 to 40,000, and most preferably 10,000 to 30,000. When the weight average molecular weight of the component (F) is not more than the upper limit value of this range, sufficient solubility in a resist solvent for the use as a resist is exhibited, whereas when it is the lower limit value of this range or more, the dry etching resistance and the cross-sectional shape of a resist pattern are satisfactory.

A degree of dispersion (Mw/Mn) of the component (F) is preferably 1.0 to 5.0, more preferably 1.0 to 3.0, and most preferably 1.2 to 2.5.

The component (F) may be used solely or in combination of two or more kinds thereof.

The component (F) is used in a proportion of 0.5 to 10 parts by mass based on 100 parts by mass of the component (A).

In the resist composition of the present invention, if desired, miscible additives, for example, an additional resin for improving the performance of the resist film, a dissolution inhibitor, a plasticizer, a stabilizer, a coloring agent, a halation inhibitor, a dye, etc. can be properly added and contained.

[Component (S)]

The resist composition of the present invention can be produced by dissolving the materials in an organic solvent (hereafter sometimes referred to as "component (S)").

The component (S) may be any organic solvent so long as it is able to dissolve the respective components to be used to give a uniform solution, and any one or two or more kinds of organic solvents can be appropriately selected from those which have been conventionally known as solvents for a chemically amplified resist.

Examples of the component (S) include a lactone such as γ-butyrolactone (GBL); a ketone such as acetone, methyl ethyl ketone (MEK), cyclohexanone, methyl n-pentyl ketone (2-heptanone), and methyl isopentyl ketone; a polyhydric alcohol such as ethylene glycol, diethylene glycol, propylene glycol, and dipropylene glycol; a compound having an ester bond, such as ethylene glycol monoacetate, diethylene glycol monoacetate, propylene glycol monoacetate, and dipropylene glycol monoacetate; a polyhydric alcohol derivative including a compound having an ether bond, such as a monoalkyl ether (e.g., monomethyl ether, monoethyl ether, monopropyl ether, or monobutyl ether) or monophenyl ether of the above-described polyhydric alcohol or compound having an ester bond [of these, propylene glycol monomethyl ether acetate (PGMEA) or propylene glycol monomethyl ether (PGME) is preferable]; a cyclic ether such as dioxane; an ester such as methyl lactate, ethyl lactate (EL), methyl acetate, ethyl acetate, butyl acetate, methyl pyruvate, ethyl pyruvate, methyl methoxypropionate, and ethyl ethoxypropionate; an aromatic organic solvent such as anisole, ethyl benzyl ether, cresyl methyl ether, diphenyl ether, dibenzyl ether, phenetole, butyl phenyl ether, ethylbenzene, diethylbenzene, pentylbenzene, isopropylbenzene, toluene, xylene, cymene, and mesitylene; and dimethyl sulfoxide (DMSO).

Such an organic solvent may be used solely, or may be used as a mixed solvent of two or more kinds thereof.

Above all, PGMEA, PGME, γ-butyrolactone, or EL is preferable.

In addition, a mixed solvent obtained by mixing PGMEA with a polar solvent is also preferable. Though a blending ratio (mass ratio) of the mixed solvent may be appropriately determined while taking into consideration the compatibility of PGMEA with the polar solvent, it is preferably in the range of 1/9 to 9/1, and more preferably 2/8 to 8/2.

More specifically, in the case where EL or cyclohexanone is blended as the polar solvent, a mass ratio of PGMEA to EL or cyclohexanone is preferably 1/9 to 9/1, and more preferably 2/8 to 8/2. In addition, in the case where PGME is blended as the polar solvent, a mass ratio of PGMEA to PGME is preferably 1/9 to 9/1, more preferably 2/8 to 8/2, and still more preferably 3/7 to 7/3.

In addition, as the component (S), besides, a mixed solvent of at least one member selected from PGMEA and EL with γ-butyrolactone is also preferable. In that case, a mixing proportion is preferably 70/30 to 95/5 in terms of amass ratio of the former to the latter.

The use amount of the component (S) is not particularly limited, and it is properly set in a concentration at which coating on a substrate or the like can be conducted, according to the thickness of the coating film. In general, the component (S) is used such that the solid content of the resist composition falls within the range of 1 to 20 mass %, and preferably 2 to 15 mass %.

<<Method for Forming Resist Pattern>>

More specifically, the method for forming a resist pattern according to the second embodiment of the present invention can be, for example, conducted in the following manner.

First of all, the resist composition is coated on a support using a spinner or the like, and a bake (post-apply bake (PAB)) treatment is conducted under a temperature condition of, for example, 80 to 150° C. for 40 to 120 seconds, and preferably 60 to 90 seconds, thereby forming a resist film. Subsequently, using an exposure apparatus, for example, an ArF exposure apparatus, an electron beam drawing apparatus, or an EUV exposure apparatus, the resist film is exposed through a mask having a prescribed pattern formed thereon (mask pattern) or selectively exposed without using a mask pattern by drawing by means of direct irradiation with electron beams, or the like, and thereafter, a bake (post exposure bake (PEB)) treatment is conducted under a temperature condition of, for example, 80 to 150° C. for 40 to 120 seconds, and preferably 60 to 90 seconds. The resist film is subjected to a development treatment using an alkali developing solution in the case of an alkali developing process, or using a developing solution containing an organic solvent (organic developing solution) in the case of a solvent developing process. After the development treatment, it is preferable to conduct a rinse treatment. In the case of an alkali developing process, it is preferable to conduct water rinse using pure water. In the case of a solvent developing process, it is preferable to use a rinse solution containing an organic solvent.

In the case of a solvent developing process, after the development treatment or rinse treatment, a treatment of removing the developing solution or rinse solution deposited on the pattern with a supercritical fluid may be conducted.

After the development treatment or rinse treatment, drying is conducted. In addition, after the development treatment, a bake treatment (post bake) may be conducted as the case may be. In this way, a resist pattern can be obtained.

The support is not particularly limited, and a conventionally known support can be used. For example, substrates for electronic components, and such substrates having wiring patterns formed thereon can be exemplified. More specifically, examples thereof include a metal-made substrate such as silicon wafer, copper, chromium, iron, and aluminum; and a glass substrate. As a material for the wiring pattern, for example, copper, aluminum, nickel, or gold can be used.

In addition, as the support, any one of the above-described supports having an inorganic and/or organic film provided thereon may be used. Examples of the inorganic film include an inorganic antireflection film (inorganic BARC). Examples of the organic film include an organic film such as an organic antireflection film (organic BARC) and a lower layer organic film in the multilayer resist method.

Here, the multilayer resist method is a method in which at least one organic film (lower layer organic film) and at least one resist film (upper layer resist film) are provided on a substrate, and the lower layer organic film is subjected to patterning while using, as a mask, a resist pattern formed on the upper layer resist film. According to this multilayer resist method, a pattern with a high aspect ratio can be formed. That is, according to the multilayer resist method, since a prescribed thickness can be ensured by the lower layer organic film, the resist film can be made thin, so that it becomes possible to form a fine pattern with a high aspect ratio.

Basically, the multilayer resist method is classified into a method of forming a two-layer structure of an upper layer resist film and a lower layer organic film (two-layer resist method); and a method of forming a multilayer structure of three or more layers, in which one or more interlayers (e.g., a metal thin film) are provided between an upper layer resist film and a lower layer organic film (three-layer resist method).

The wavelength to be used for exposure is not particularly limited, and the exposure can be conducted using radiations such as ArF excimer laser, KrF excimer laser, $F_2$ excimer laser, EUV (extreme ultraviolet rays), VUV (vacuum ultraviolet rays), EB (electron beams), X-rays, and soft X-rays. The resist composition is high in usefulness for KrF excimer laser, ArF excimer laser, EB, or EUV and especially useful for ArF excimer laser, EB, or EUV.

The exposure method of the resist film may be conducted by means of general exposure (dry exposure) which is conducted in an inert gas such as air and nitrogen, or it may be conducted by means of liquid immersion lithography.

The liquid immersion lithography is an exposure method in which a region between a resist film and a lens located at the lowermost position of an exposure apparatus is previously filled with a solvent (liquid immersion medium) having a refractive index larger than a refractive index of air, and the exposure (immersion exposure) is conducted in that state.

The immersion medium is preferably a solvent having a refractive index larger than a refractive index of air and smaller than a refractive index of a resist film to be exposed. The refractive index of such a solvent is not particularly limited so long as it falls within the foregoing range.

Examples of the solvent having a refractive index larger than a refractive index of air and smaller than a refractive index of the resist film include water, a fluorine-based inert liquid, a silicon-based solvent, and a hydrocarbon-based solvent.

Specific examples of the fluorine-based inert liquid include a liquid composed mainly of a fluorine-based compound such as $C_3HCl_2F_5$, $C_4F_9OCH_3$, $C_4F_9OC_2H_5$, and $C_5H_3F_7$. Of these, fluorine-based inert liquids having a boiling point of 70 to 180° C. are preferable, and those having a boiling point of 80 to 160° C. are more preferable. A fluorine-based inert liquid having a boiling point falling within the foregoing range is preferable because after completion of the exposure, the removal of the medium used for the liquid immersion can be conducted by a simple method.

As the fluorine-based inert liquid, in particular, a perfluoroalkyl compound in which all of hydrogen atoms of an alkyl group are substituted with a fluorine atom is preferable. Specifically, examples of the perfluoroalkyl compound include a perfluoroalkylether compound and a perfluoroalkylamine compound.

Furthermore, specifically, examples of the perfluoroalkylether compound include perfluoro(2-butyl-tetrahydrofuran) (boiling point: 102° C.); and examples of the perfluoroalkylamine compound include perfluorotributylamine (boiling point: 174° C.)

As the liquid immersion medium, water is preferably used from the viewpoints of cost, safety, environmental issue, and versatility.

As the organic solvent which the organic solvent used for the development contains, any organic solvent can be used among those which are known so long as it is able to dissolve the base material component (A) (base material component (A) before the exposure), and the organic solvent can be properly selected among known organic solvents. Specifically, examples thereof include a polar solvent such as a ketone-based solvent, an ester-based solvent, and a nitrile-based solvent. The ester-based solvent is preferably butyl acetate. The ketone-based solvent is preferably methyl n-pentyl ketone (2-heptanone).

The ketone-based solvent is an organic solvent containing C—C(C=O)—C in a structure thereof. The ester-based solvent is an organic solvent containing C—C(C=O)—O—C in a structure thereof. The alcohol-based solvent is an organic solvent containing an alcoholic hydroxyl group in a structure thereof, and the term "alcoholic hydroxyl group" means a hydroxyl group bonded to a carbon atom of an aliphatic hydrocarbon group. The amide-based solvent is an organic solvent containing an amide group in a structure thereof. The ether-based solvent is an organic solvent containing C—O—C in a structure thereof. Among organic solvents, there is also present an organic solvent containing plural kinds of functional groups which characterize the above-described respective solvents, in a structure thereof. In that case, any solvent species containing a functional group which this organic solvent has falls under the definition thereof. For example, diethylene glycol monomethyl ether falls under the definition of any of the alcohol-based solvent and the ether-based solvent in the above-described classification. In addition, the hydrocarbon-based solvent is a hydrocarbon solvent which is composed of a hydrocarbon but does not have a substituent (group or atom other than the hydrogen atom and the hydrocarbon group).

As for specific examples of each of the solvents, examples of the ketone-based solvent include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetyl carbinol, acetophenone, methyl naphthyl ketone, isophorone, propylene carbonate, γ-butyrolactone, and methyl n-pentyl ketone (2-heptanone).

Examples of the ester-based solvent include methyl acetate, butyl acetate, ethyl acetate, isopropyl acetate, pentyl acetate, isopentyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl 3-methoxypropionate, ethyl 3-methoxypropionate, ethyl 3-ethoxypropionate, and propyl 3-methoxypropionate.

Examples of the nitrile-based solvent include acetonitrile, propionitrile, valeronitrile, and butyronitrile.

The organic developing solution can be blended with a known additive, if desired. Examples of the additive include a surfactant. Examples of the surfactant include the same surfactants as those described above. Above all, a nonionic surfactant is preferable, and a fluorine-based surfactant or a silicon-based surfactant is more preferable.

Examples of the alkali developing solution which is used for the development treatment in the alkali developing process include a 0.1 to 10 mass % tetramethylammonium hydroxide (TMAH) aqueous solution.

The organic solvent which an organic developing solution used for the development treatment in the solvent developing process contains may be an organic solvent capable of dissolving the component (A) (component (A) before the exposure) therein, and it can be properly selected from known organic solvents. Specifically, examples thereof include a polar solvent and a hydrocarbon-based solvent such as a ketone-based solvent, an ester-based solvent, an alcohol-based solvent, an amide-based solvent, and an ether-based solvent.

The organic developing solution can be blended with a known additive, if desired. Examples of the additive include a surfactant. Though the surfactant is not particularly limited, for example, an ionic or nonionic fluorine-based and/or silicon-based surfactant, or the like can be used.

In the case of blending the surfactant, its blending amount is usually 0.001 to 5 mass %, preferably 0.005 to 2 mass %, and more preferably 0.01 to 0.5 mass % relative to the whole amount of the organic developing solution.

It is possible to carry out the development treatment by a known development method. Examples of the development method include a method of dipping a support in a developing solution for a certain period of time (dip method); a method of raising a developing solution on the surface of a support due to a surface tension and making it stationary for a certain period of time (puddle method); a method of spraying a developing solution onto the surface of a support (spray method); and a method of continuously dispensing a developing solution onto a support rotating at a fixed rate while scanning a developing solution dispense nozzle at a fixed rate (dynamic dispense method).

After the development treatment and before drying, a rinse treatment with a rinse solution containing an organic solvent can be conducted. By conducting the rinse, a satisfactory pattern can be formed.

As the organic solvent which is used for the rinse solution, among the organic solvents exemplified above for the organic solvent which is used in the organic developing solution, an organic solvent which hardly dissolves the resist pattern can be properly selected and used. In general, at least one solvent selected from a hydrocarbon-based solvent, a ketone-based solvent, an ester-based solvent, an alcohol-based solvent, an amide-based solvent, and an ether-based solvent is used. Of these, at least one solvent selected from a hydrocarbon-based solvent, a ketone-based solvent, an ester-based solvent, an alcohol-based solvent, and an amide-based solvent is preferable; at least one solvent selected from an alcohol-based solvent and an ester-based solvent is more preferable; and an alcohol-based solvent is especially preferable.

The alcohol-based solvent which is used in the rinse solution is preferably a monohydric alcohol having 6 to 8 carbon atoms, and the monohydric alcohol may be linear, branched, or cyclic. Specifically, examples thereof include 1-hexanol, 1-heptanol, 1-octanol, 2-hexanol, 2-heptanol, 2-octanol, 3-hexanol, 3-heptanol, 3-octanol, 4-octanol, and benzyl alcohol. Of these, 1-hexanol, 2-heptanol, or 2-hexanol is preferable, and 1-hexanol or 2-hexanol is more preferable.

These organic solvents may be used solely, or may be used in admixture of two or more kinds thereof. In addition, such an organic solvent may be mixed with an organic solvent other than the foregoing organic solvents or water and used. However, taking into consideration the development properties, a blending amount of water in the rinse solution is preferably not more than 30 mass %, more preferably not more than 10 mass %, still more preferably not more than 5 mass %, and especially preferably not more than 3 mass % relative to the whole amount of the rinse solution.

The rinse solution can be blended with a known additive, if desired. Examples of the additive include a surfactant. Examples of the surfactant include the same surfactants as those described above. Above all, a nonionic surfactant is preferable, and a fluorine-based surfactant or a silicon-based surfactant is more preferable.

In the case of blending the surfactant, its blending amount is usually 0.001 to 5 mass %, preferably 0.005 to 2 mass %, and more preferably 0.01 to 0.5 mass % relative to the whole amount of the rinse solution.

The rinse treatment (washing treatment) with a rinse solution can be carried out by a known rinse method. Examples of the method include a method of continuously dispensing a rinse solution onto a support rotating at a fixed rate (rotary coating method); a method of dipping a support in a rinse solution for a fixed time (dip method); and a method of spraying a rinse solution onto the surface of a support (spray method).

The resist composition of the present invention is excellent in lithography properties. While the reasons for this have not been elucidated yet, the following may be conjectured.

The resist composition having a lactone-containing cyclic group modified with a substituent such as an ester (hereafter referred to as "modified lactone-containing cyclic group) has such a tendency that diffusion of the acid is excessively inhibited. It may be conjectured that the resist composition of the present invention is excellent in lithography properties because by increasing the kind of the modified lactone-containing cyclic group and the kind of the acid dissociable group, the polarity of the resin is relieved, so that the excessive inhibition of diffusion of the acid can be relieved.

EXAMPLES

The present invention is more specifically described below by reference to the following Examples, but it should not be construed that the present invention is limited to these Examples.

[Synthesis Example of Polymer]

High-molecular Weight Compound 1 was synthesized using the following monomers (1) to (20) from which constituent units constituting each high-molecular weight compound were derived by the following method. High-molecular Weight Compounds 2 to 19 were synthesized by the same method as that in High-molecular Weight Compound 1. With respect to each of the obtained high-molecular weight compounds, a copolymerization composition ratio (proportion (molar ratio) of each constituent unit in the structural formula) determined from a $^{13}$C-nuclear magnetic resonance spectrum (600 MHz-$^{13}$C-NMR, internal standard: tetramethylsilane) and a weight average molecular weight (Mw) as reduced into standard polystyrene, as determined by the GPC measurement and a degree of dispersion of molecular weight (Mw/Mn) are shown in Tables 1 to 4, respectively.

In a separable flask equipped with a thermometer, a reflux condenser, and a nitrogen-introducing pipe, 10.00 g (23.8 mmoles) of the following monomer (1), 7.08 g (41.6 mmoles) of the following monomer (2), 2.60 g (15.46 mmoles) of the following monomer (3), 5.30 g (20.22 mmoles) of the following monomer (4), and 4.22 g (17.84 mmoles) of the following monomer (5) were dissolved in 43.80 g of γ-butyrolactone (GBL). 14.3 mmoles of dimethyl azobisisobutyrate (V-601) as a polymerization initiator was added to and dissolved in this solution. This was dropped to 15.49 g of GBL under a nitrogen atmosphere over 4 hours. After completion of the dropping, the reaction solution was heated with stirring for one hour, and the reaction solution was then cooled to room temperature.

An operation of dropping the obtained reaction polymerization solution into a large amount of water, thereby depositing a polymer was conducted, and a precipitated white powder was separated by means of filtration. The obtained solid was washed with a large amount of methanol, thereby obtaining 20.73 g of High-molecular Weight Compound 1 as a desired material. With respect to this High-molecular Weight Compound 1, a weight average molecular weight (Mw) as reduced into standard polystyrene, as determined by the GPC measurement was 5,900, and a degree of dispersion of molecular weight (PDI) was 1.69.

In addition, a copolymerization composition ratio (proportion (molar ratio) of the respective constituent units in the structural formula) determined by means of a $^{13}$C-nuclear magnetic resonance spectrum (600 MHz-$^{13}$C-NMR) was (1)/(2)/(3)/(4)/(5)=20/35/13/17/15.

(Chemical formula 49)

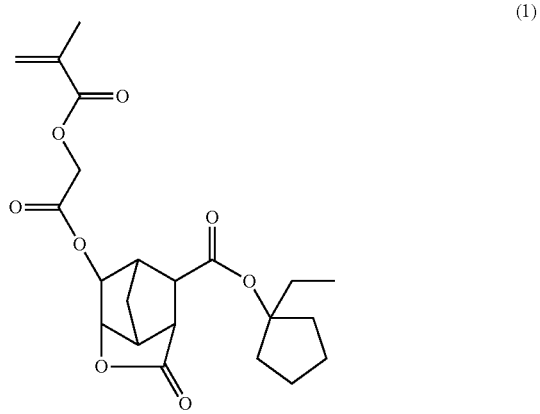

(1)

(2)

(3)

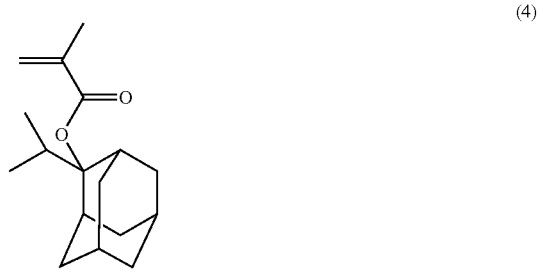

(4)

(5)
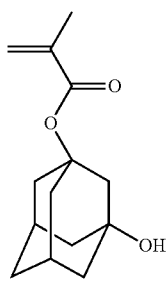
(6)
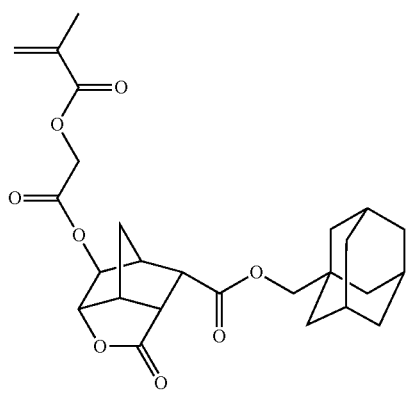
(7)
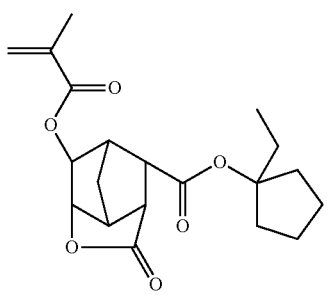
(8)
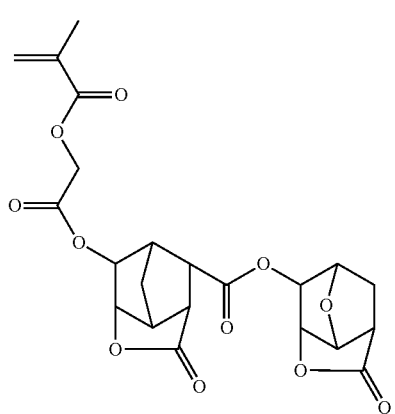
(9)
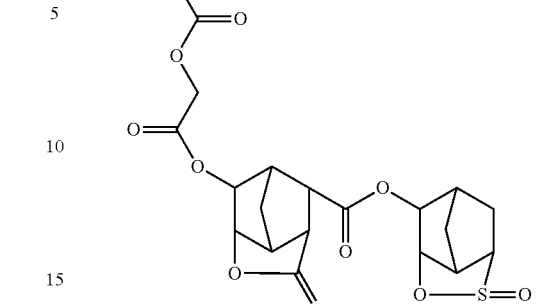
(10)
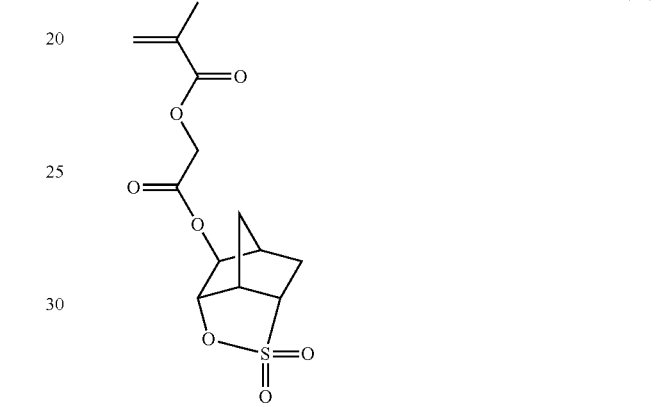
(11)
(12)
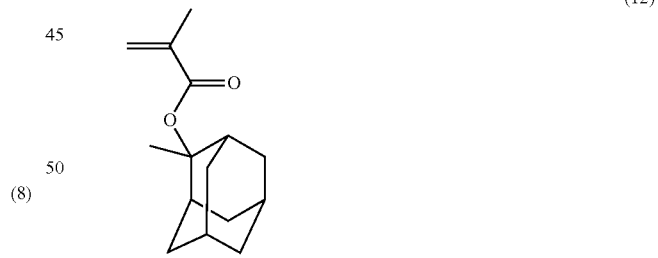
(13)
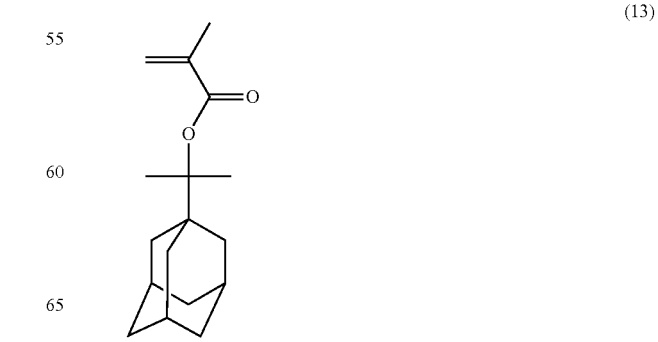

115
-continued
(14)
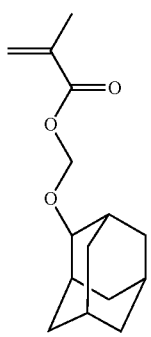
(15)
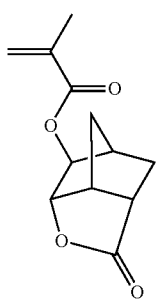
(16)
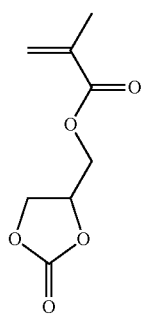
(17)
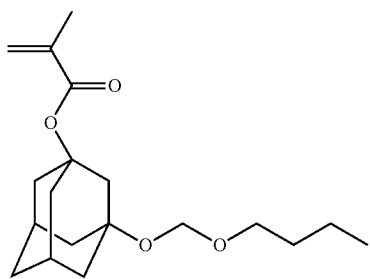
116
-continued
(Chemical formula 50)
(18)
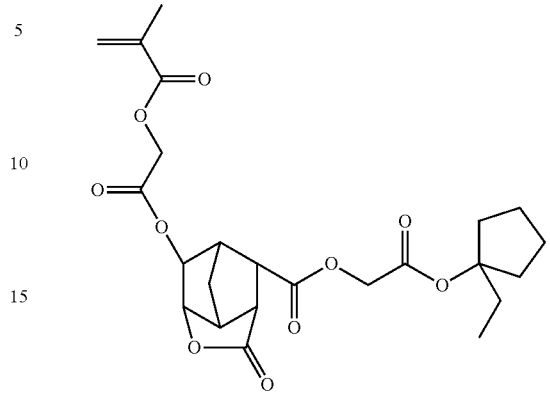
(19)
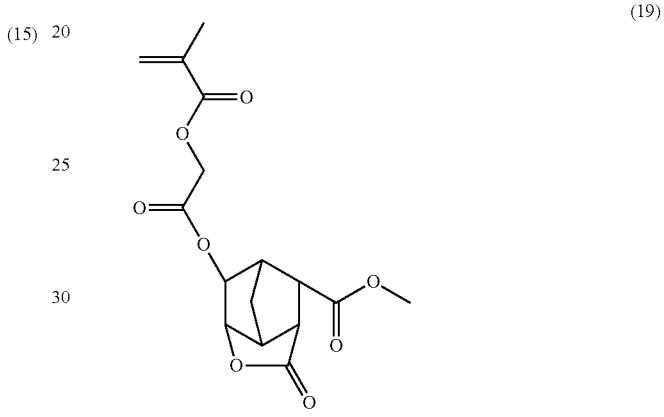
(20)
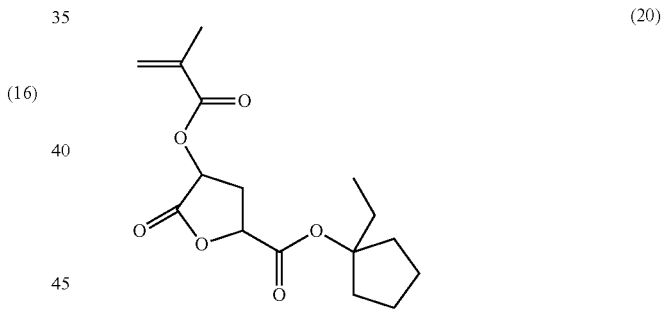
TABLE 1
| | High-molecular Weight Compound | | | | |
|---|---|---|---|---|---|
| Monomer | 1 | 2 | 3 | 4 | 5 |
| (1) | 20 | 24 | | | |
| (2) | 35 | 41 | 35 | 35 | 35 |
| (3) | 13 | 15 | 13 | 13 | 13 |
| (4) | 17 | 20 | 17 | 17 | 17 |
| (5) | 15 | | 15 | 15 | 15 |
| (6) | | | 20 | | |
| (7) | | | | 20 | |
| (8) | | | | | 20 |
| (9) | | | | | |
| (10) | | | | | |
| (11) | | | | | |
| (12) | | | | | |
| (13) | | | | | |
| (14) | | | | | |

TABLE 1-continued

| | High-molecular Weight Compound | | | | |
|---|---|---|---|---|---|
| | 1 | 2 | 3 | 4 | 5 |
| (15) | | | | | |
| (16) | | | | | |
| (17) | | | | | |
| (18) | | | | | |
| (19) | | | | | |
| (20) | | | | | |
| Mw | 5900 | 5800 | 7500 | 7200 | 6800 |
| Mw/Mn | 1.69 | 1.66 | 1.78 | 1.64 | 1.72 |

TABLE 2

| | | High-moleulcar Weight Compound | | | | |
|---|---|---|---|---|---|---|
| | | 6 | 7 | 8 | 9 | 10 |
| Monomer | | | | | | |
| | (1) | | 20 | 20 | 20 | 20 |
| | (2) | 35 | | 35 | 35 | 35 |
| | (3) | 13 | 13 | 13 | | 13 |
| | (4) | 17 | 17 | | | |
| | (5) | 15 | 15 | 15 | 15 | 15 |
| | (6) | | | | | |
| | (7) | | | | | |
| | (8) | | | | | |
| | (9) | 20 | | | | |
| | (10) | | 35 | | | |
| | (11) | | | 17 | | |
| | (12) | | | | 13 | |
| | (13) | | | | 17 | |
| | (14) | | | | | 14 |
| | (15) | | | | | |
| | (16) | | | | | |
| | (17) | | | | | |
| | (18) | | | | | |
| | (19) | | | | | |
| | (20) | | | | | |
| Mw | | 6300 | 6500 | 5900 | 5500 | 7800 |
| Mw/Mn | | 1.61 | 1.8 | 1.68 | 1.65 | 1.59 |

TABLE 3

| | | High-molecular Weight Compound | | | | |
|---|---|---|---|---|---|---|
| | | 11 | 12 | 13 | 14 | 15 |
| Monomer | | | | | | |
| | (1) | 20 | 20 | 20 | 55 | 20 |
| | (2) | | | 35 | | 35 |
| | (3) | 13 | 13 | | 13 | 30 |
| | (4) | 17 | 17 | 13 | 17 | |
| | (5) | 15 | 15 | 17 | 15 | 15 |
| | (6) | | | | | |
| | (7) | | | | | |
| | (8) | | | | | |
| | (9) | | | | | |
| | (10) | | | | | |
| | (11) | | | | | |
| | (12) | | | | | |
| | (13) | | | | | |
| | (14) | | | | | |
| | (15) | 35 | | | | |
| | (16) | | 35 | | | |
| | (17) | | | 15 | | |
| | (18) | | | | | |
| | (19) | | | | | |
| | (20) | | | | | |
| Mw | | 7000 | 6100 | 5900 | 6500 | 6500 |
| Mw/Mn | | 1.68 | 1.65 | 1.65 | 1.68 | 1.72 |

TABLE 4

| | | High-molecular Weight Compound | | | |
|---|---|---|---|---|---|
| | | 16 | 17 | 18 | 19 |
| Monomer | (1) | 55 | | | |
| | (2) | | 35 | 35 | 35 |
| | (3) | 13 | 13 | 13 | 13 |
| | (4) | 17 | 17 | 17 | 17 |
| | (5) | 15 | 15 | 15 | 15 |
| | (6) | | | | |
| | (7) | | | | |
| | (8) | | | | |
| | (9) | | | | |
| | (10) | | | | |
| | (11) | | | | |
| | (12) | | | | |
| | (13) | | | | |
| | (14) | | | | |
| | (15) | | | | |
| | (16) | | | | |
| | (17) | | | | |
| | (18) | | 20 | | |
| | (19) | | | 20 | |
| | (20) | | | | 20 |
| Mw | | 7100 | 8000 | 7500 | 7700 |
| Mw/Mn | | 1.66 | 1.7 | 1.72 | 1.65 |

Positive-type resist compositions (Examples 1 to 12 and Comparative Examples 1 to 6) were prepared by using the thus obtained high-molecular weight compounds and blending the respective components in a blending ratio shown in the following Table 5, respectively.

TABLE 5

| | Component (A) | Component (B) | Component (D) | Component (F) | Component (S)-1 | Component (S)-2 |
|---|---|---|---|---|---|---|
| Example 1 | (A)-1 [100] | (B)-1 [14] | (D)-1 [5] | (F)-1 [4] | (S)-1 [100] | (S)-2 [2900] |
| Example 2 | (A)-2 [100] | (B)-1 [14] | (D)-1 [5] | (F)-1 [4] | (S)-1 [100] | (S)-2 [2900] |
| Example 3 | (A)-3 [100] | (B)-1 [14] | (D)-1 [5] | (F)-1 [4] | (S)-1 [100] | (S)-2 [2900] |
| Example 4 | (A)-4 [100] | (B)-1 [14] | (D)-1 [5] | (F)-1 [4] | (S)-1 [100] | (S)-2 [2900] |
| Example 5 | (A)-5 [100] | (B)-1 [14] | (D)-1 [5] | (F)-1 [4] | (S)-1 [100] | (S)-2 [2900] |
| Example 6 | (A)-6 [100] | (B)-1 [14] | (D)-1 [5] | (F)-1 [4] | (S)-1 [100] | (S)-2 [2900] |

TABLE 5-continued

|  | Component (A) | Component (B) | Component (D) | Component (F) | Component (S)-1 | Component (S)-2 |
| --- | --- | --- | --- | --- | --- | --- |
| Example 7 | (A)-7 [100] | (B)-1 [14] | (D)-1 [5] | (F)-1 [4] | (S)-1 [100] | (S)-2 [2900] |
| Example 8 | (A)-8 [100] | (B)-1 [14] | (D)-1 [5] | (F)-1 [4] | (S)-1 [100] | (S)-2 [2900] |
| Example 9 | (A)-9 [100] | (B)-1 [14] | (D)-1 [5] | (F)-1 [4] | (S)-1 [100] | (S)-2 [2900] |
| Example 10 | (A)-10 [100] | (B)-1 [14] | (D)-1 [5] | (F)-1 [4] | (S)-1 [100] | (S)-2 [2900] |
| Example 11 | (A)-11 [100] | (B)-1 [14] | (D)-1 [5] | (F)-1 [4] | (S)-1 [100] | (S)-2 [2900] |
| Example 12 | (A)-12 [100] | (B)-1 [14] | (D)-1 [5] | (F)-1 [4] | (S)-1 [100] | (S)-2 [2900] |
| Comparative Example 1 | (A)-14 [100] | (B)-1 [14] | (D)-1 [5] | (F)-1 [4] | (S)-1 [100] | (S)-2 [2900] |
| Comparative Example 2 | (A)-15 [100] | (B)-1 [14] | (D)-1 [5] | (F)-1 [4] | (S)-1 [100] | (S)-2 [2900] |
| Comparative Example 3 | (A)-16 [100] | (B)-1 [14] | (D)-1 [5] | (F)-1 [4] | (S)-1 [100] | (S)-2 [2900] |
| Comparative Example 4 | (A)-17 [100] | (B)-1 [14] | (D)-1 [5] | (F)-1 [4] | (S)-1 [100] | (S)-2 [2900] |
| Comparative Example 5 | (A)-18 [100] | (B)-1 [14] | (D)-1 [5] | (F)-1 [4] | (S)-1 [100] | (S)-2 [2900] |
| Comparative Example 6 | (A)-19 [100] | (B)-1 [14] | (D)-1 [5] | (F)-1 [4] | (S)-1 [100] | (S)-2 [2900] |

Negative-type resist compositions (Examples 13 to 25 and Comparative Examples 7 to 12) were prepared by using the thus obtained high-molecular weight compounds and blending the respective components in a blending ratio shown in the following Table 6, respectively.

TABLE 6

|  | Component (A) | Component (B) | Component (D) | Component (F) | Component (S)-1 | Component (S)-2 |
| --- | --- | --- | --- | --- | --- | --- |
| Example 13 | (A)-1 [100] | (B)-1 [6] | (D)-1 [3.5] | (F)-1 [1.5] | (S)-1 [100] | (S)-2 [2900] |
| Example 14 | (A)-2 [100] | (B)-1 [6] | (D)-1 [3.5] | (F)-1 [1.5] | (S)-1 [100] | (S)-2 [2900] |
| Example 15 | (A)-3 [100] | (B)-1 [6] | (D)-1 [3.5] | (F)-1 [1.5] | (S)-1 [100] | (S)-2 [2900] |
| Example 16 | (A)-4 [100] | (B)-1 [6] | (D)-1 [3.5] | (F)-1 [1.5] | (S)-1 [100] | (S)-2 [2900] |
| Example 17 | (A)-5 [100] | (B)-1 [6] | (D)-1 [3.5] | (F)-1 [1.5] | (S)-1 [100] | (S)-2 [2900] |
| Example 18 | (A)-6 [100] | (B)-1 [6] | (D)-1 [3.5] | (F)-1 [1.5] | (S)-1 [100] | (S)-2 [2900] |
| Example 19 | (A)-7 [100] | (B)-1 [6] | (D)-1 [3.5] | (F)-1 [1.5] | (S)-1 [100] | (S)-2 [2900] |
| Example 20 | (A)-8 [100] | (B)-1 [6] | (D)-1 [3.5] | (F)-1 [1.5] | (S)-1 [100] | (S)-2 [2900] |
| Example 21 | (A)-9 [100] | (B)-1 [6] | (D)-1 [3.5] | (F)-1 [1.5] | (S)-1 [100] | (S)-2 [2900] |
| Example 22 | (A)-10 [100] | (B)-1 [6] | (D)-1 [3.5] | (F)-1 [1.5] | (S)-1 [100] | (S)-2 [2900] |
| Example 23 | (A)-11 [100] | (B)-1 [6] | (D)-1 [3.5] | (F)-1 [1.5] | (S)-1 [100] | (S)-2 [2900] |
| Example 24 | (A)-12 [100] | (B)-1 [6] | (D)-1 [3.5] | (F)-1 [1.5] | (S)-1 [100] | (S)-2 [2900] |
| Example 25 | (A)-13 [100] | (B)-1 [6] | (D)-1 [3.5] | (F)-1 [1.5] | (S)-1 [100] | (S)-2 [2900] |
| Comparative Example 7 | (A)-14 [100] | (B)-1 [6] | (D)-1 [3.5] | (F)-1 [1.5] | (S)-1 [100] | (S)-2 [2900] |
| Comparative Example 8 | (A)-15 [100] | (B)-1 [6] | (D)-1 [3.5] | (F)-1 [1.5] | (S)-1 [100] | (S)-2 [2900] |
| Comparative Example 9 | (A)-16 [100] | (B)-1 [6] | (D)-1 [3.5] | (F)-1 [1.5] | (S)-1 [100] | (S)-2 [2900] |
| Comparative Example 10 | (A)-17 [100] | (B)-1 [6] | (D)-1 [3.5] | (F)-1 [1.5] | (S)-1 [100] | (S)-2 [2900] |
| Comparative Example 11 | (A)-18 [100] | (B)-1 [6] | (D)-1 [3.5] | (F)-1 [1.5] | (S)-1 [100] | (S)-2 [2900] |
| Comparative Example 12 | (A)-19 [100] | (B)-1 [6] | (D)-1 [3.5] | (F)-1 [1.5] | (S)-1 [100] | (S)-2 [2900] |

In Tables 5 to 6, the respective symbols have the following meanings, and the numerical value in each of square brackets exhibits a blending amount (parts by mass).
(A)-1 to (A)-19: High-molecular Weight Compounds 1 to 19 as described above, respectively
(B)-1: Compounds (B)-1 as described below
(D)-1 to (D)-2: High-molecular Weight Compounds (D)-1 to (D)-2 as described below
(F)-1: High-molecular Weight Compound (F)-1 as described below. (Molar ratio: l/m=77/23), Mw: 23,100, Mw/Mn: 1.78
(S)-1: γ-Butyrolactone
(S)-2: Mixed solvent of PGMEA/PGME/cyclohexanone (mass ratio: 45/30/25)

(Chemical formula 51)

(B)-1
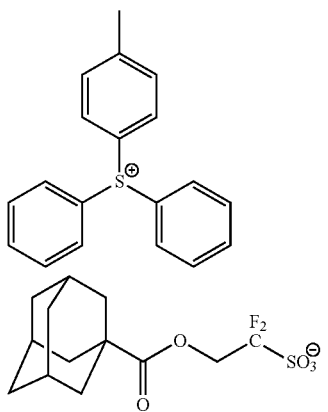

(D)-1
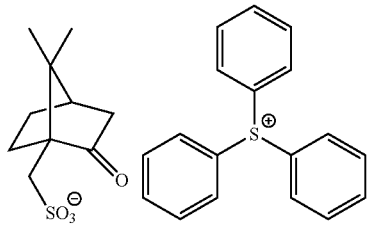

(D)-2
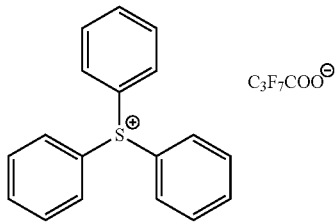

(F)-1
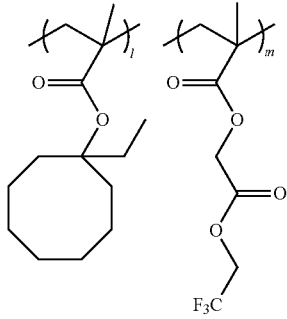

Formation of Positive-type Resist Pattern

Examples 1 to 12 and Comparative Examples 1 to 6

On a 12-inch silicon wafer, an organic antireflection film composition "ARC 95" (a trade name, available from Brewer Science, Inc.) was coated using a spinner and baked for drying on a hot plate at 205° C. for 60 seconds, thereby forming an organic antireflection film having a film thickness of 90 nm.

Each of the positive-type resist compositions shown in Table 5 (Examples 1 to 12 and Comparative Examples 1 to 6) was coated on the above-described antireflection film using a spinner and subjected to a prebake (PAB) treatment for drying on a hotplate at 110° C. for 60 seconds, thereby forming a resist film having a film thickness of 80 nm.

Subsequently, the resist film was selectively irradiated with an ArF excimer laser (193 nm) through a photomask (6% halftone) by using an ArF exposure apparatus for liquid immersion, NSR-S609B [available from Nikon Corporation; NA (numerical aperture)=1.07, Dipole (in/out=0.78/0.97) with Polano, liquid immersion medium: water].

Thereafter, the thus irradiated resist film was subjected to a PEB treatment at 95° C. for 60 seconds.

Subsequently, the resulting resist film was subjected to alkali development with a 2.38 mass % aqueous solution of TMAH (a trade name: NMD-3, available from Tokyo Ohka Kogyo Co., Ltd.) at 23° C. for 10 seconds and then subjected to water rinse with pure water for 30 seconds, followed by drying by shaking.

As a result, in all of the Examples, a 1:1 line and space pattern (LS pattern) having a line width of 50 nm and a pitch of 100 nm was formed.

<Evaluation of Positive-type Resist Pattern>
[Evaluation of Mask Error Factor (MEEF)]

LS patterns having a pitch of 100 nm were formed, respectively using a mask pattern targeting a line pattern size of 45 to 54 nm (at intervals of 1 nm, ten points in total) at the same exposure amount according to the same procedures as those in the formation of the LS pattern as described above. At that time, a slope of a straight line at the time of plotting the target size (nm) on the abscissa and the size (nm) of the line pattern formed on the resist film using each mask pattern on the ordinate, respectively was calculated as MEEF. The closer the MEEF value (slope of the straight line) is to 1, the more the mask reproducibility is more satisfactory. The results are shown in Table 7.

[Evaluation of Line Width Roughness (LWR)]

With respect to the above-described LS patterns, a space width was measured at 400 points in the lengthwise direction of the space using a measuring SEM (scanning electron microscope) (a trade name: S-9380, available from Hitachi High-Technologies Corporation; accelerating voltage: 300 V). From the results, the value of 3 times the standard deviation (s) (i.e., 3s) was determined, and an average value of the 3s values at 400 points was calculated as a yardstick of LWR. The results are shown in Table 7.

The smaller this 3s value is, the lower the level of roughness of the line width is, indicating that an LS pattern with a more uniform width was obtained.

[Evaluation of Exposure Latitude (EL Margin)]

With respect to the above-described exposure amounts at which the above-described LS patterns were formed, an exposure amount was determined on the occasion of forming an LS pattern whose line fell within a range of ±5% of the target dimension, and an EL margin (unit: %) was determined according to the following equation. The results are shown in Table 7.

EL margin (%)=(|E1−E2|/Eop)×100

E1: Exposure amount (mJ/cm$^2$) on the occasion of forming an LS pattern having a line width of 47.5 nm
E2: Exposure amount (mJ/cm$^2$) on the occasion of forming an LS pattern having a line width of 52.5 nm Incidentally, the larger the value of the EL margin is, the smaller the change in the pattern size by the variation of the exposure amount is.

Incidentally, in the above-described calculation formula of the EL margin, "Eop" means an optimum exposure amount (mJ/cm$^2$). The Eop was determined in the usual way.

[Evaluation of Resist Pattern Shape]

A cross-sectional shape of each of the LS patterns formed in the above-described <Formation of resist pattern> was observed using a scanning electron microscope (a trade name: SU-8000, manufactured by Hitachi High-Technologies Corporation), and its shape was evaluated on the basis of evaluation criteria as shown below. The results are shown in Table 7.

A: The shape is high in rectangularity and satisfactory.
B: The shape is a T-top shape.

TABLE 7

|  | 5% EL (%) | LWR (nm) | MEEF | Pattern shape |
| --- | --- | --- | --- | --- |
| Example 1 | 7.5 | 2.71 | 1.64 | A |
| Example 2 | 7.5 | 2.72 | 1.69 | A |
| Example 3 | 7.8 | 2.91 | 1.45 | A |
| Example 4 | 8.3 | 2.67 | 1.58 | A |
| Example 5 | 8.8 | 2.41 | 1.36 | A |
| Example 6 | 8.6 | 2.31 | 1.39 | A |
| Example 7 | 8.4 | 2.81 | 1.55 | A |
| Example 8 | 7.9 | 2.75 | 1.64 | A |
| Example 9 | 7.4 | 2.74 | 1.67 | A |
| Example 10 | 7.4 | 2.80 | 1.78 | A |
| Example 11 | 7.2 | 2.89 | 1.65 | A |
| Example 12 | 7.7 | 2.77 | 1.76 | A |
| Comparative Example 1 | 6.1 | 3.68 | 2.54 | B |
| Comparative Example 2 | 6.8 | 3.15 | 1.95 | B |
| Comparative Example 3 | 7.0 | 3.20 | 2.11 | B |
| Comparative Example 4 | 6.9 | 3.34 | 2.41 | B |
| Comparative Example 5 | 6.6 | 3.60 | 2.56 | B |
| Comparative Example 6 | 6.8 | 3.29 | 2.18 | B |

By using the resist composition of the present invention, it was successful to enhance the 5% EL, LWR, and MEEF and to improve the pattern shape.

Formation of Negative-type Resist Pattern

Examples 13 to 25 and Comparative Examples 7 to 12

On a 12-inch silicon wafer, an organic antireflection film composition "ARC 29A" (a trade name, available from Brewer Science, Inc.) was coated using a spinner and baked for drying on a hot plate at 205° C. for 60 seconds, thereby forming an organic antireflection film having a film thickness of 89 nm.

Each of the negative-type resist compositions shown in Table 6 was coated on the above-described antireflection film using a spinner and subjected to a prebake (PAB) treatment for drying on a hot plate at 110° C. for 60 seconds, thereby forming a resist film having a film thickness of 100 nm.

Subsequently, the resist film was selectively irradiated with an ArF excimer laser (193 nm) through a photomask (6% halftone) by using an ArF exposure apparatus for liquid immersion, NSR-S609B [available from Nikon Corporation; NA (numerical aperture)=1.07, Dipole (in/out=0.78/0.97) with Polano, liquid immersion medium: water].

Thereafter, the thus irradiated resist film was subjected to a PEB treatment at 90° C. for 60 seconds.

Subsequently, the resulting resist film was subjected to solvent development with butyl acetate at 23° C. for 13 seconds, followed by drying by shaking.

As a result, in each of the Examples, a contact hole pattern (hereinafter referred to as "CH pattern") in which holes having a hole diameter of 55 nm were disposed at equal intervals (pitch: 110 nm) was formed.

<Evaluation of Negative-type Resist Pattern>

[Evaluation of Exposure Latitude (EL Margin)]

An exposure amount was determined on the occasion of forming a CH pattern whose hole diameter fell within a range of ±5% of 55 nm (53 nm to 58 nm), and an EL margin (unit: %) was determined according to the following equation. The obtained results are shown in Table 8.

EL margin (%)=(|E1−E2|/Eop)×100

E1: Exposure amount (mJ/cm$^2$) on the occasion of forming a CH pattern having a hole diameter of 53 nm
E2: Exposure amount (mJ/cm$^2$) on the occasion of forming a CH pattern having a hole diameter of 58 nm Incidentally, the larger the value of the EL margin is, the smaller the change in the pattern size by the variation of the exposure amount is.

Incidentally, in the above-described calculation formula of the EL margin, "Eop" means an optimum exposure amount (mJ/cm$^2$). The Eop was determined in the usual way.

[CDU (Critical Dimension Uniformity of Pattern Dimension)]

100 holes in the above-described CH pattern were observed from above using a measuring SEM (scanning electron microscope) (a trade name: S-9380, available from Hitachi High-Technologies Corporation; accelerating voltage: 300 V), and a hole diameter (nm) of each hole was measured. From the measurement results, the value of 3 times the standard deviation (σ) (i.e., 3σ) was determined. The results are shown as "CDU" in Table 8.

It is meant that the smaller the thus determined 3σ value is, the higher the (CD) uniformity of the plural holes formed on the resist film is.

[Evaluation of Circularity]

25 holes in the above-described CH pattern were observed from above using a measuring SEM (scanning electron microscope) (a trade name: S-9380, available from Hitachi High-Technologies Corporation; accelerating voltage: 300 V), and a distance from the center of each hole to the outer periphery was measured in 24 directions. From the measurement results, the value of 3 times the standard deviation (σ) (i.e., 3σ) was determined. The results are shown in Table 8.

It is meant that the smaller the thus determined 3σ value is, the higher the circularity of the hole is.

[Measurement of Residual Film Rate]

A residual film rate (unit: %) was determined from the film thickness (film thickness of exposed areas after the solvent development) of the CH pattern formed using each of the resist compositions in the above-described <Formation of negative-type resist pattern> according to the following equation.

The results are shown in Table 8.

Residual film rate (%)=(FT2/FT1)×100

In the equation, FT1 represents a film thickness (nm) of the resist before the exposure, and FT2 represents a film thickness (nm) of the LS pattern.

The film thickness was measured by Nanospec 6100A (available from Nanometrics Incorporated).

TABLE 8

| | 5% EL (%) | Circularity | CDU (nm) | Residual film rate (%) |
|---|---|---|---|---|
| Example 13 | 4.5 | 3.52 | 9.05 | 72 |
| Example 14 | 4.0 | 3.63 | 9.21 | 71 |
| Example 15 | 3.9 | 3.36 | 9.45 | 73 |
| Example 16 | 4.6 | 3.66 | 8.74 | 71 |
| Example 17 | 4.8 | 3.44 | 8.80 | 78 |
| Example 18 | 5.0 | 3.61 | 8.89 | 78 |
| Example 19 | 4.9 | 3.73 | 8.76 | 77 |
| Example 20 | 4.1 | 3.75 | 9.05 | 70 |
| Example 21 | 4.2 | 3.43 | 90.6 | 71 |
| Example 22 | 4.2 | 3.75 | 9.32 | 73 |
| Example 23 | 4.4 | 3.72 | 9.11 | 73 |
| Example 24 | 4.1 | 3.89 | 9.34 | 70 |
| Example 25 | 4.3 | 3.49 | 8.89 | 71 |
| Comparative Example 7 | 3.6 | 3.95 | 9.79 | 64 |
| Comparative Example 8 | 3.3 | 4.43 | 10.53 | 61 |
| Comparative Example 9 | 3.2 | 4.07 | 11.10 | 56 |
| Comparative Example 10 | 3.0 | 4.26 | 10.82 | 68 |
| Comparative Example 11 | 2.7 | 4.90 | 10.43 | 68 |
| Comparative Example 12 | 2.6 | 4.78 | 11.33 | 58 |

By using the resist composition of the present invention, it was successful to enhance the 5% EL, circularity, CDU, and residual film rate.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A resist composition which generates an acid upon exposure and exhibits changed solubility in a developing solution by the action of an acid, the resist composition comprising a base material component (A) which exhibits changed solubility in a developing solution by the action of an acid; and the base material component (A) containing a resin component (A1) having a constituent unit (a0) derived from a compound represented by the following general formula (a0-1-1), at least two or more kinds of a constituent unit (a1) containing an acid dissociable group represented by the following general formula (a1-r-1) or (a1-r-2), and a constituent unit (a2) containing an —$SO_2$—-containing cyclic group, or a carbonate-containing cyclic group:

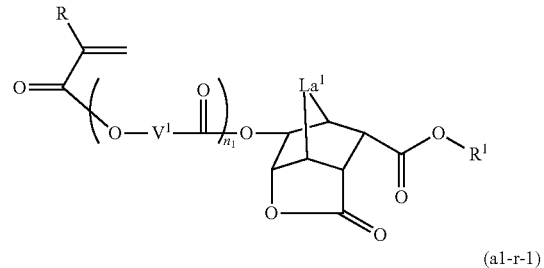

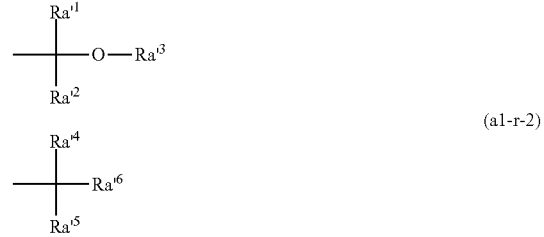

wherein
in the formula (a0-1-1), R represents a hydrogen atom, an alkyl group having 1 to 5 carbon atoms, or a halogenated alkyl group having 1 to 5 carbon atoms; $V^1$ represents a divalent hydrocarbon group which may have an ether bond, a urethane bond, or an amide bond; $n_1$ is an integer of 0 to 2; $La^1$ represents an oxygen atom, a sulfur atom, or a methylene group; and $R^1$ represents a linear or branched hydrocarbon group having 2 to 20 carbon atoms, which may have a substituent, provided that $R^1$ does not contain an ester bond, or $R^1$ represents a cyclic hydrocarbon group which may have a hetero atom,
in the formula (a1-r-1), each of $Ra'^1$ and $Ra'^2$ represents a hydrogen atom or an alkyl group; and $Ra'^3$ represents a hydrocarbon group, and $Ra'^3$ may be bonded to either $Ra'^1$ or $Ra'^2$ to form a ring, and
in the formula (a1-r-2), each of $Ra'^4$ to $Ra'^6$ represents a hydrocarbon group, and $Ra'^5$ and $Ra'^6$ may be bonded to each other to form a ring.

2. The resist composition according to claim 1, wherein in the general formula (a1-r-2), the hydrocarbon group is represented by the following general formula (a1-r2-1) or (a1-r2-2):

wherein $Ra'^{10}$ represents an alkyl group having 1 to 10 carbon atoms; $Ra'^{11}$ represents a group for forming an aliphatic polycyclic group or an aliphatic monocyclic group together with the carbon atom to which $Ra'^{10}$ is bonded; and each of $Ra'^{12}$ to $Ra'^{14}$ independently represents a hydrocarbon group.

3. A method for forming a resist pattern comprising: a step of forming a resist film on a support by using the resist composition according to claim 1; a step of exposing the resist film; and a step of developing the resist film to form a resist pattern.

4. The resist composition according to claim 1, wherein the resin component (A1) contains two or more kinds of the constituent unit (a1) which is a constituent unit represented by the following general formula (a1-1) and in which $Ra^1$ is different from each other:

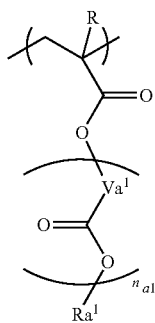

(a1-1)

wherein R represents a hydrogen atom, an alkyl group having 1 to 5 carbon atoms, or a halogenated alkyl group having 1 to 5 carbon atoms; $Va^1$ represents a divalent hydrocarbon group which may have an ether bond, a urethane bond, or an amide bond; $n_{a1}$ is 0 to 2; and $Ra^1$ represents the acid dissociable group represented by the formula (a1-r-1) or (a1-r-2).

5. The resist composition according to claim 4, wherein $Ra^1$ is selected from the group consisting of groups represented by the following general formulae (r-pr1) to (r-pr5):

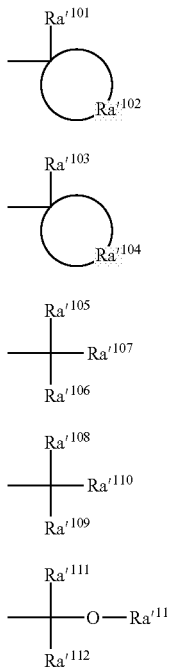

wherein each of $Ra'^{101}$ and $Ra'^{103}$ represents an alkyl group having 1 to 10 carbon atoms; $Ra'^{102}$ represents a group for forming an aliphatic monocyclic group together with the carbon atom to which $Ra'^{101}$ is bonded; $Ra'^{104}$ represents a group for forming an aliphatic polycyclic group together with the carbon atom to which $Ra'^{103}$ is bonded; each of $Ra'^{105}$ to $Ra'^{106}$ and $Ra'^{108}$ to $Ra'^{109}$ represents a chain alkyl group having 1 to 10 carbon atoms; $Ra'^{107}$ represents a monocyclic hydrocarbon group having 3 to 10 carbon atoms; $Ra'^{110}$ represents a polycyclic hydrocarbon group having 7 to 20 carbon atoms; each of $Ra'^{111}$ to $Ra'^{112}$ represents a hydrogen atom or an alkyl group having 1 to 10 carbon atoms; and $Ra'^{113}$ represents an alkyl group having 1 to 20 carbon atoms or a cyclic hydrocarbon group having 3 to 20 carbon atoms.

6. The resist composition according to claim 4, wherein $Ra^1$ is a combination of the general formula (r-pr1) with the general formula (r-pr2), or a combination of the general formula (r-pr1) with the general formula (r-pr4).

7. The resist composition according to claim 4, wherein $Ra^1$ is a combination selected from the group consisting of the general formula (r-pr1) and the general formula (r-pr3).

8. The resist composition according to claim 4, wherein $Ra^1$ is a combination selected from the group consisting of the general formula (r-pr2) and the general formula (r-pr4).

9. The resist composition according to claim 4, wherein $Ra^1$ is a combination of one or more kinds of any of the general formulae (r-pr1) to (r-pr4) with the general formula (r-pr5).

10. The resist composition according to claim 1, wherein the resin component (A1) contains a constituent unit represented by the following general formula (a1-1) and a constituent unit represented by the following general formula (a1-2):

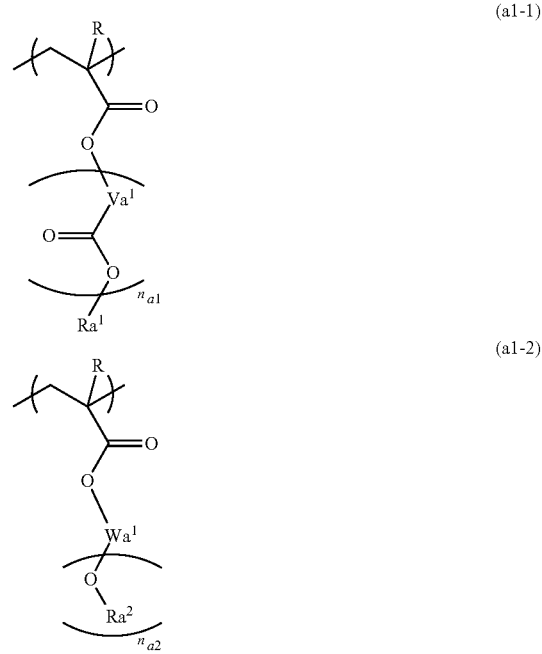

wherein R represents a hydrogen atom, an alkyl group having 1 to 5 carbon atoms, or a halogenated alkyl group having 1 to 5 carbon atoms; $Va^1$ represents a divalent hydrocarbon group which may have an ether bond, a urethane bond, or an amide bond; $n_{a1}$ is 0 to 2; $Ra^1$ represents the acid dissociable group represented by the formula (a1-r-1) or (a1-r-2); $Wa^1$ represents an $(n_{a2}+1)$-valent hydrocarbon group; $n_{a2}$ is 1 to 3; and $Ra^2$ represents the acid dissociable group represented by the formula (a1-r-1) or the following general formula (a1-r-3):

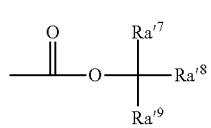

(a1-r-3)

wherein each of $Ra'^7$ to $Ra'^9$ represents an alkyl group.

11. The resist composition according to claim 1, wherein $R^1$ is a cyclic hydrocarbon group which may have a hetero atom.

12. The resist composition according to claim 1, wherein $R^1$ is a lactone-containing cyclic group.

13. The resist composition according to claim 1, wherein $R^1$ is an —$SO_2$—-containing cyclic group.

* * * * *

UNITED STATES PATENT AND TRADEMARK OFFICE
CERTIFICATE OF CORRECTION

| | | |
|---|---|---|
| PATENT NO. | : 9,122,157 B2 | Page 1 of 2 |
| APPLICATION NO. | : 14/085133 | |
| DATED | : September 1, 2015 | |
| INVENTOR(S) | : Masatoshi Arai, Takahiro Dazai and Yoshiyuki Utsumi | |

It is certified that error appears in the above-identified patent and that said Letters Patent is hereby corrected as shown below:

In the Specification

Col. 8, line 43, "1-napthylmethyl" should be --1-naphthylmethyl--.
Col. 27, line 42, "La" should be --$La^1$--.
Col. 38, line 38, "—C(C=O)—OH" should be -- —C(=O)—OH--.
Col. 62, line 52, "—C(C=O)—O—," should be -- —C(=O)—O—,--.
Col. 63, line 14, "—C(C=O)—O—," should be -- —C(=O)—O—,--.
Col. 63, line 14, "—C(C=O)—," should be -- —C(=O)—,--.
Col. 63, lines 14-15, "—O—C(C=O)—O—," should be -- —O—C(=O)—O—,--.
Col. 63, line 26, "—C(C=O)—NH," should be -- —C(=O)—NH,--.
Col. 63, line 56, "—$[Y^{21}$—C(=O)—O$]_{m'}$—$Y^2$—" should be -- —$[Y^{21}$—C(=O)—O$]_{m'}$—$Y^{22}$— --.
Col. 63, line 66, "[—C(C=O)—O-]," should be --[—C(=O)—O-],--.
Col. 67, line 9, "layer)," should be --laser),--.
Col. 69, line 25, "layer)," should be --laser),--.
Col. 73, line 48, "—C(C=O)—O—," should be -- —C(=O)—O—,--.
Col. 73, lines 49-50, "—C(C=O)—NH," should be -- —C(=O)—NH,--.
Col. 75, line 2, " R'2" should be --$R^{102}$--.
Col. 76, line 50, "$M^{m+}$" should be --$M'^{m+}$--.
Col. 99, line 25, "$Yd^4$" should be --$Yd^1$--.
Col. 99, line 27, "$Yd^4$" should be --$Yd^1$--.
Col. 108, line 57, "C—C(C=O)—C" should be --C—C(=O)—C--.
Col. 117, line 1 (Table 2), "High-moleulcar" should be --High-molecular--.
Col. 119, line 3 (Table 6), "(D)-1" should be --(D)-2--.
Col. 119, line 5 (Table 6), "(D)-1" should be --(D)-2--.
Col. 119, line 7 (Table 6), "(D)-1" should be --(D)-2--.
Col. 119, line 9 (Table 6), "(D)-1" should be --(D)-2--.
Col. 119, line 11 (Table 6), "(D)-1" should be --(D)-2--.
Col. 119, line 13 (Table 6), "(D)-1" should be --(D)-2--.
Col. 119, line 15 (Table 6), "(D)-1" should be --(D)-2--.
Col. 119, line 17 (Table 6), "(D)-1" should be --(D)-2--.

Signed and Sealed this
Tenth Day of May, 2016

Michelle K. Lee
*Director of the United States Patent and Trademark Office*

CERTIFICATE OF CORRECTION (continued)
U.S. Pat. No. 9,122,157 B2

Col. 119, line 19 (Table 6), "(D)-1" should be --(D)-2--.
Col. 119, line 21 (Table 6), "(D)-1" should be --(D)-2--.
Col. 119, line 23 (Table 6), "(D)-1" should be --(D)-2--.
Col. 119, line 25 (Table 6), "(D)-1" should be --(D)-2--.
Col. 119, line 27 (Table 6), "(D)-1" should be --(D)-2--.
Col. 119, line 29 (Table 6), "(D)-1" should be --(D)-2--.
Col. 119, line 31 (Table 6), "(D)-1" should be --(D)-2--.
Col. 119, line 33 (Table 6), "(D)-1" should be --(D)-2--.
Col. 119, line 35 (Table 6), "(D)-1" should be --(D)-2--.
Col. 119, line 37 (Table 6), "(D)-1" should be --(D)-2--.
Col. 119, line 39 (Table 6), "(D)-1" should be --(D)-2--.